United States Patent
Takahashi et al.

(10) Patent No.: US 7,235,816 B2
(45) Date of Patent: Jun. 26, 2007

(54) SEMICONDUCTOR LIGHT EMITTER

(75) Inventors: Takashi Takahashi, Miyagi (JP); Shunichi Sato, Miyagi (JP); Morimasa Kaminishi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 130 days.

(21) Appl. No.: 11/155,730

(22) Filed: Jun. 20, 2005

(65) Prior Publication Data

US 2005/0230674 A1    Oct. 20, 2005

Related U.S. Application Data

(62) Division of application No. 10/716,455, filed on Nov. 20, 2003, now Pat. No. 6,927,412.

(30) Foreign Application Priority Data

| Nov. 21, 2002 | (JP) | ............................. 2002-337586 |
| Dec. 4, 2002 | (JP) | ............................. 2002-352476 |
| Dec. 4, 2002 | (JP) | ............................. 2002-352794 |
| Feb. 24, 2003 | (JP) | ............................. 2003-045447 |
| Mar. 6, 2003 | (JP) | ............................. 2003-059864 |
| Mar. 27, 2003 | (JP) | ............................. 2003-088168 |
| Aug. 12, 2003 | (JP) | ............................. 2003-291986 |
| Sep. 29, 2003 | (JP) | ............................. 2003-337927 |

(51) Int. Cl.
*H01L 29/22* (2006.01)
*H01L 33/00* (2006.01)
*H01L 29/227* (2006.01)

(52) U.S. Cl. .......................... 257/94; 257/98; 257/103; 257/E33.013; 257/E33.049; 257/E33.072

(58) Field of Classification Search .................. 257/94, 257/98, 103, E33.013, E33.049, E33.072
See application file for complete search history.

(56) References Cited

U.S. PATENT DOCUMENTS

| 5,577,062 A | 11/1996 | Takahashi |
| 5,627,851 A | 5/1997 | Takahashi |
| 5,684,523 A | 11/1997 | Satoh et al. |

(Continued)

FOREIGN PATENT DOCUMENTS

JP       6-37355       2/1994

(Continued)

OTHER PUBLICATIONS

Uesugi et al., "MOMBE Growth and Characterization of GaAsN/GaAsSb Superlattice Structure," The 62nd Japan Society of Applied Physics, 13p-T-13.

(Continued)

*Primary Examiner*—Ngân V. Ngô
(74) *Attorney, Agent, or Firm*—Dickstein Shapiro LLP

(57) ABSTRACT

A semiconductor light emitter includes a quantum well active layer which includes nitrogen and at least one other Group-V element, and barrier layers which are provided alongside the quantum well active layer, wherein the quantum well active layer and the barrier layers together constitute an active layer, wherein the barrier layers are formed of a Group-III-V mixed-crystal semiconductor that includes nitrogen and at least one other Group-V element, a nitrogen composition thereof being smaller than that of the quantum well active layer.

2 Claims, 50 Drawing Sheets

U.S. PATENT DOCUMENTS

| | | | |
|---|---|---|---|
| 5,793,073 | A | 8/1998 | Kaminishi et al. |
| 5,801,071 | A | 9/1998 | Takahashi |
| 5,804,720 | A | 9/1998 | Morimasa et al. |
| 5,852,239 | A | 12/1998 | Sato et al. |
| 5,904,549 | A | 5/1999 | Sato |
| 5,923,691 | A | 7/1999 | Sato |
| 5,939,733 | A | 8/1999 | Sato |
| 5,983,700 | A | 11/1999 | Yamaguchi et al. |
| 6,002,700 | A | 12/1999 | Sato |
| 6,049,556 | A | 4/2000 | Sato |
| 6,072,196 | A | 6/2000 | Sato |
| 6,118,166 | A | 9/2000 | Shoji et al. |
| 6,203,673 | B1 | 3/2001 | Shoji et al. |
| 6,207,973 | B1 | 3/2001 | Sato et al. |
| 6,233,264 | B1 | 5/2001 | Sato |
| 6,281,518 | B1 | 8/2001 | Sato |
| 6,300,650 | B1 | 10/2001 | Sato |
| 6,348,698 | B1 | 2/2002 | Sato |
| 6,382,800 | B2 | 5/2002 | Sato |
| 6,449,299 | B1 | 9/2002 | Sato |
| 6,452,215 | B1 | 9/2002 | Sato |
| 6,542,528 | B1 | 4/2003 | Sato et al. |
| 6,563,851 | B1 | 5/2003 | Jikutani et al. |
| 6,614,821 | B1 | 9/2003 | Jikutani et al. |
| 6,617,618 | B2 | 9/2003 | Sato |
| 6,697,404 | B1 | 2/2004 | Sato |
| 6,798,809 | B1 | 9/2004 | Gambin et al. |
| 2001/0030319 | A1 | 10/2001 | Sato et al. |
| 2002/0074631 | A1 | 6/2002 | Sato et al. |
| 2002/0179929 | A1* | 12/2002 | Takahashi et al. ........... 257/184 |
| 2002/0195607 | A1 | 12/2002 | Sato |
| 2003/0006429 | A1 | 1/2003 | Takahashi et al. |
| 2003/0013224 | A1 | 1/2003 | Shimizu et al. |
| 2003/0053501 | A1 | 3/2003 | Sekiya et al. |
| 2003/0138015 | A1 | 7/2003 | Sato et al. |
| 2003/0205731 | A1 | 11/2003 | Sato |
| 2004/0135136 | A1* | 7/2004 | Takahashi et al. ............. 257/14 |
| 2004/0161006 | A1* | 8/2004 | Chang et al. .................. 372/45 |
| 2005/0031005 | A1* | 2/2005 | Cheng et al. .................. 372/68 |
| 2006/0054899 | A1* | 3/2006 | Takahashi et al. ............. 257/80 |
| 2006/0236923 | A1* | 10/2006 | Kouvetakis et al. ........ 117/108 |
| 2006/0261352 | A1* | 11/2006 | Takahashi et al. ............ 257/79 |

FOREIGN PATENT DOCUMENTS

| | | |
|---|---|---|
| JP | 8-195522 | 7/1996 |
| JP | 10-126004 | 5/1998 |
| JP | 10-145003 | 5/1998 |
| JP | 2000-332363 | 11/2000 |
| JP | 2001-251021 | 9/2001 |
| JP | 2002-118329 | 4/2002 |

OTHER PUBLICATIONS

Tateno et al., "Refractive Index of GaAsNSb Layers Grown on GaAs Substrates by MOCVD" The 62nd Japan Society of Applied Physics, 13p-T-12.

Gambin et al, "Long Wavelength GaInNAsSb/GaNAsSb Multiple Quantum Well Lasers" Electronics Letters Mar. 14, 2002, vol. 38, No. 6, pp. 277-278.

Koyama et al. "Data Transmission Over Single-Mode Fiber by Using 1.2-⊠m Uncooled GaInAs-GaAs Laser for Gb/S Local Area Network" IEEE Photonics Technology Letters, vol. 12, No. 2, pp. 125-127, Feb. 2000.

Shunichi Sato, "Low Threshold and High Characteristic Temperature 1.3 ⊠m Range GaInNAs Lasers Grown by Metalorganic Chemical Vapor Deposition" Japan J. Appl. Phys., vol. 39, 05, Part 1, No. 6A, pp. 3403-3405(Jun. 2000).

Kondow et al., "GaInNAs: A Novel Material for Long-Wavelength-Range Laser Diodes with Excellent High-Temperature Performance" Japan J. Appl. Phys., vol. 35, Part 1, No. 2B, pp. 1273-1275 (Feb. 1996).

Gouardes et al., "GaInAs-GaInNAs-GaInAs Intermediate Layer Structure for Long Wavelength Lasers" IEEE Photonics Technology Letters, vol. 14, No. 7, pp. 896-898, (Jul. 2002).

Peng et al., "Suppression of Interfacial Atomic Diffusion in inGaNAs/GaAs Heterostructures Grown by Molecular-beam Epitaxy" Applied Physics Letters, vol. 80, No. 25, pp. 4720-4722, (Jun. 24, 2002).

Li et al., "Effects of Rapid Thermal Annealing on Strain-Compensated GaInNAs/GaAsP Quantum Well Structures and Lasers" Applied Physics Letters, vol. 78, No. 1, (Jan. 1, 2001).

* cited by examiner

SURFACE EMITTING LASER

ELECTRODE PAD

SURFACE EMITTING LASER ARRAY CHIP

SURFACE EMITTING LASER ARRAY CHIP

LASER LIGHT   OPTICAL FIBER

GaAsP

GaInNAs

GaAsN

GaInNAs

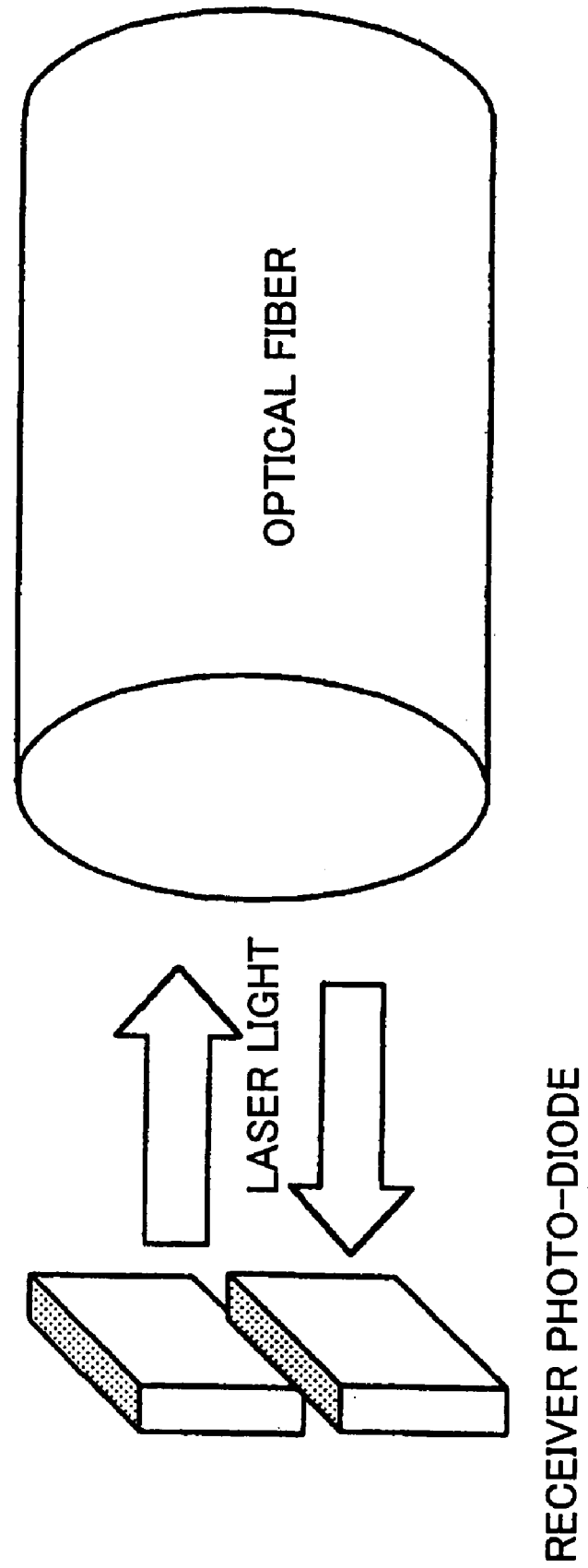

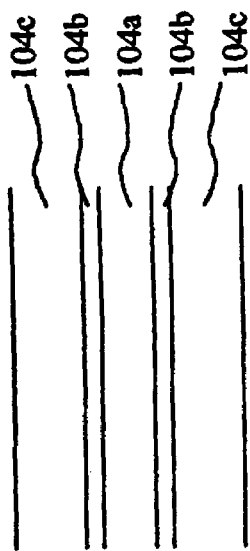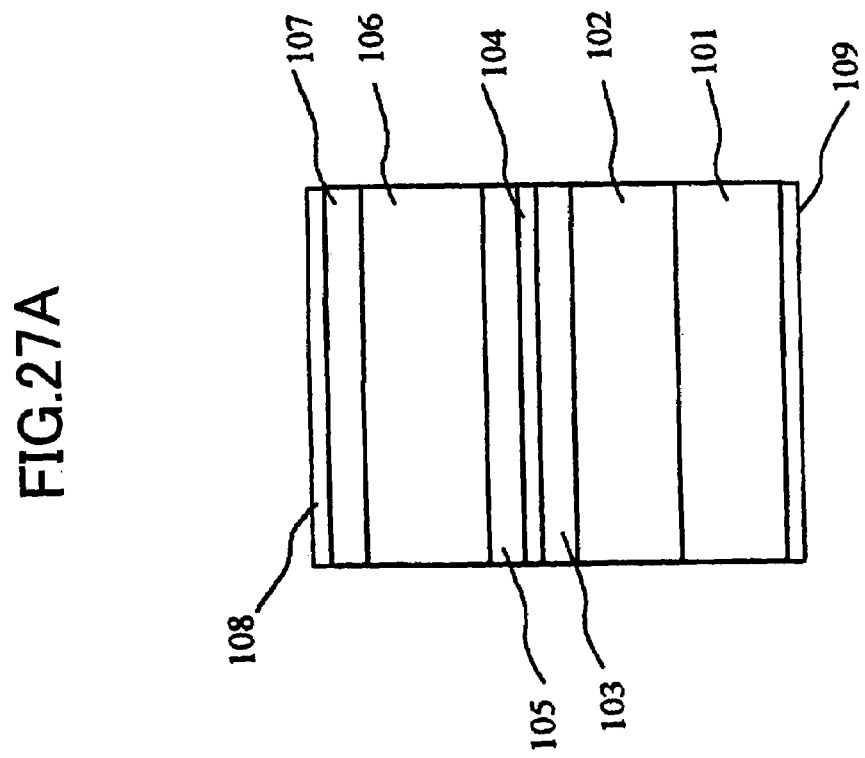
FIG.27B
FIG.27A

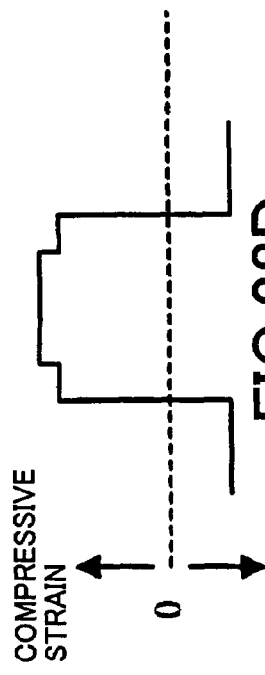
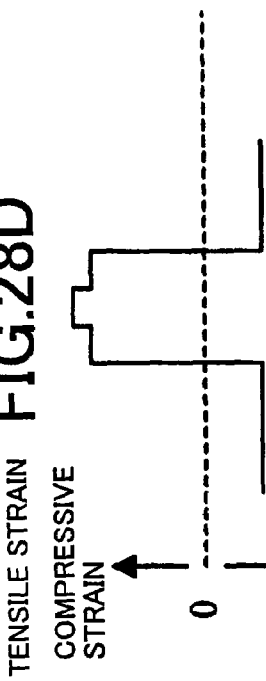
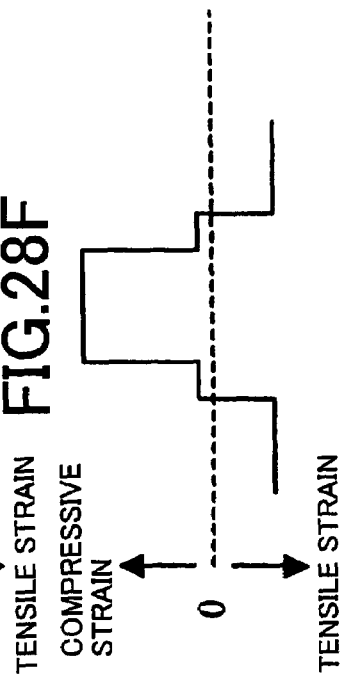
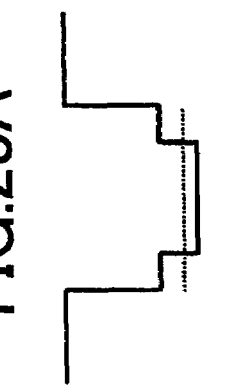
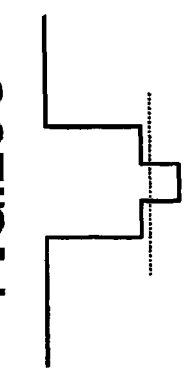
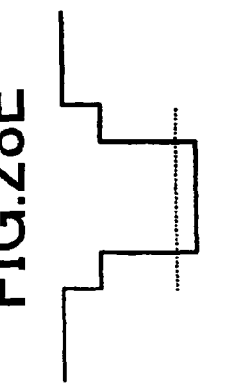

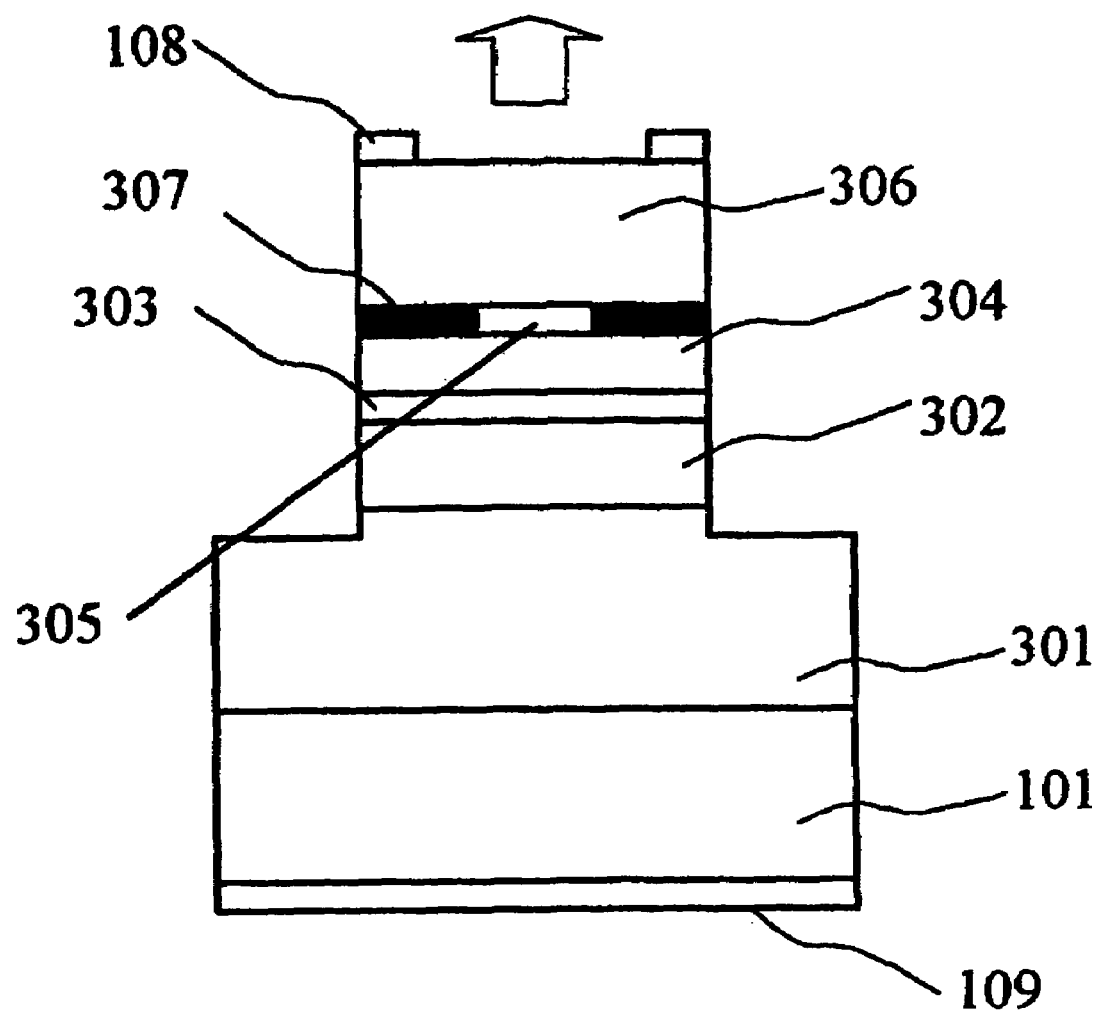

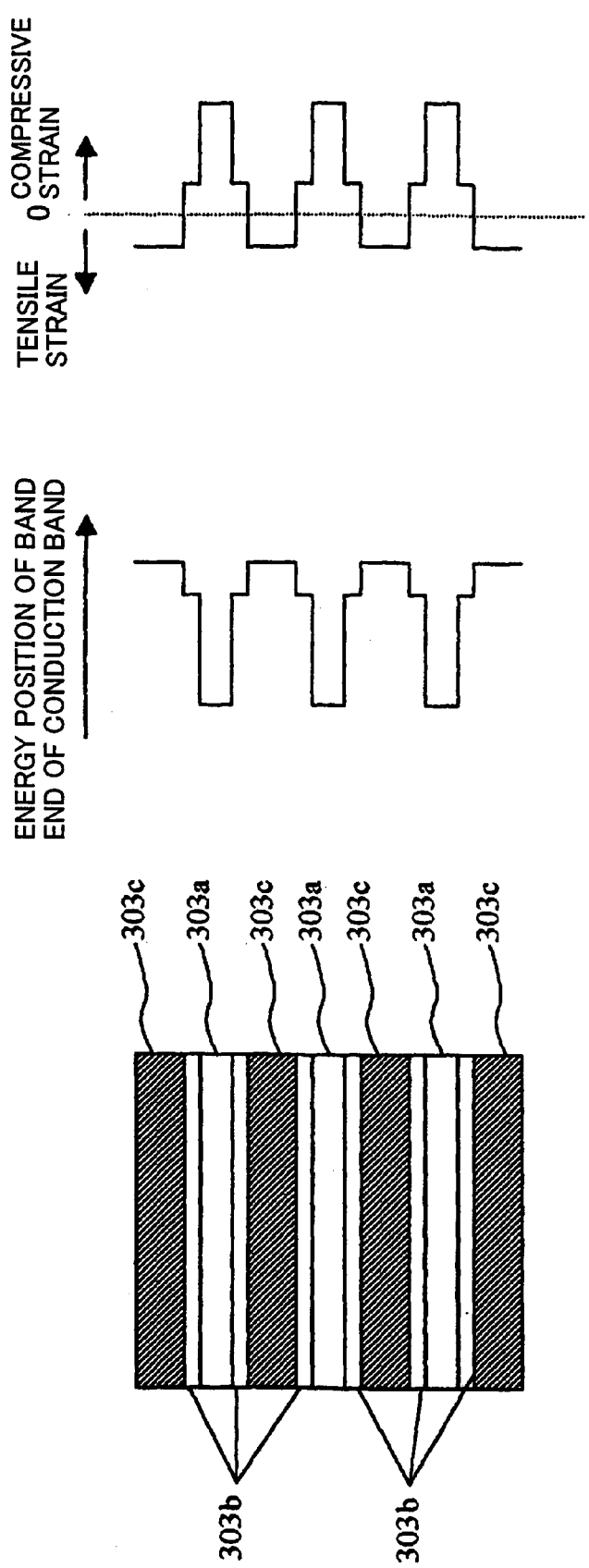

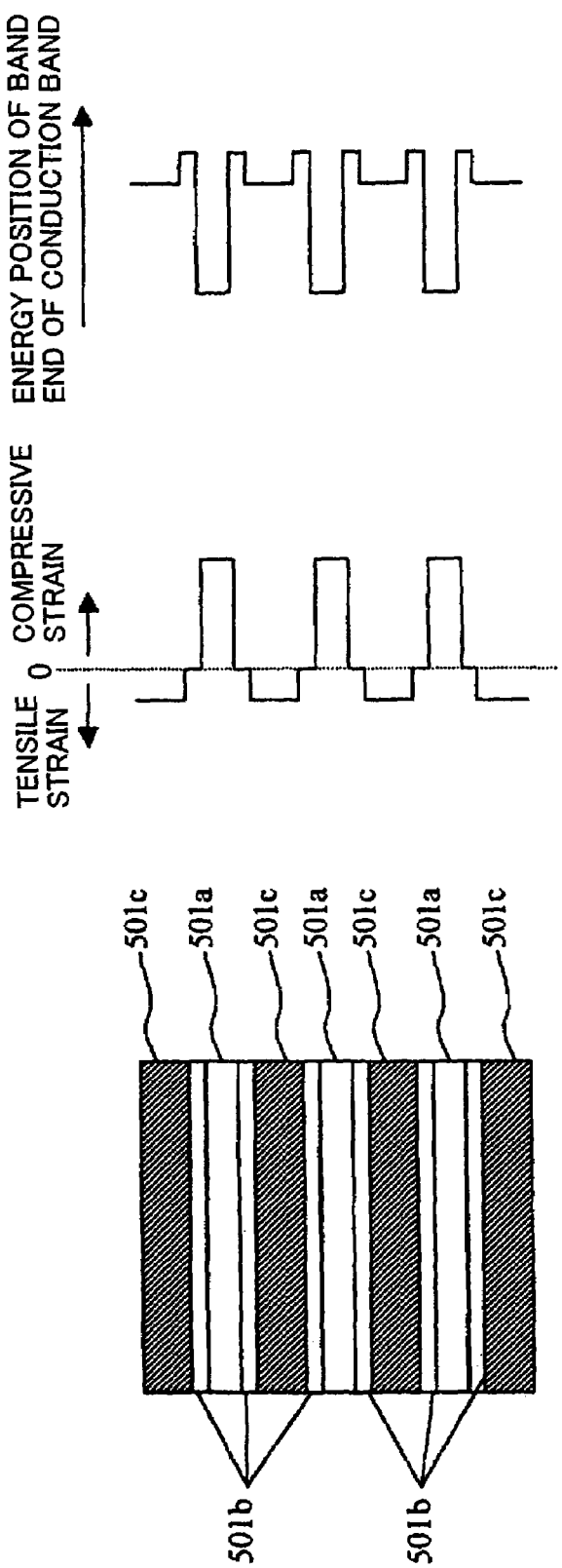

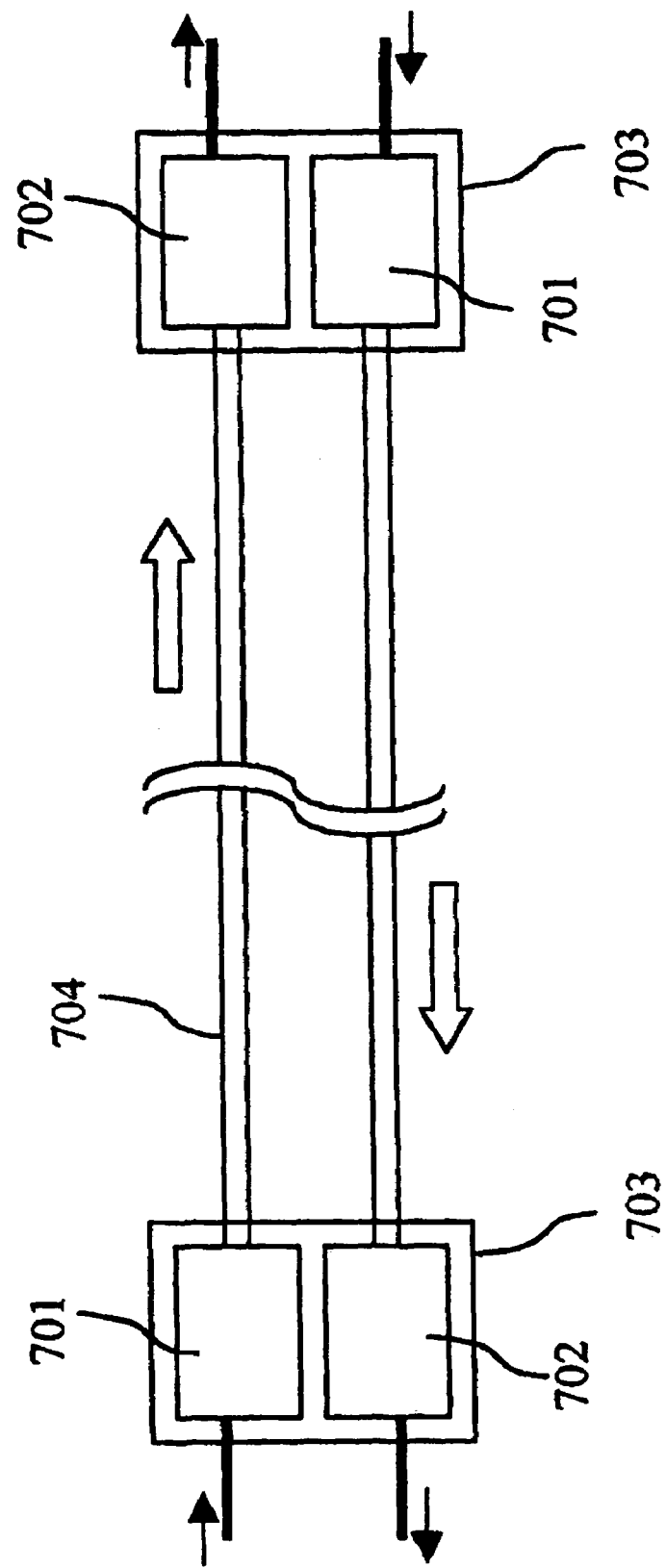

SURFACE EMITTING LASER

ELECTRODE PAD

SURFACE EMITTING LASER ARRAY CHIP

SURFACE EMITTING LASER ARRAY CHIP

LASER LIGHT    OPTICAL FIBER

SEMICONDUCTOR LIGHT EMITTER

The present application is a divisional of Application Ser. No. 10/716,455, filed Nov. 20, 2003 now U.S. Pat. No. 6,927,412, the entire disclosure of which is incorporated herein by reference.

BACKGROUND OF THE INVENTION

1. Field of the Invention

The present invention relates semiconductor light emitters, optical transmitting modules, optical transceiver modules, optical communications systems, and a method of manufacturing semiconductor light emitters.

2. Description of the Related Art

In recent years, the amount of information that is exchanged and processed has been increasing exponentially as can be seen in the promulgation of the Internet, and such increase is expected to accelerate further. Because of this, optical fibers are beginning to be used not only in trunk systems but also in communication systems closer to users such as the subscriber systems of individual households and offices and LANs (local area networks), and are also beginning to be used for connections between and inside individual apparatuses, which makes large-capacity information transmission a vital technology.

As a light source for use in such technology, a semiconductor laser of a 1.3-micrometer band or a 1.55-micrometer band is necessary that incurs a little transmission loss on silica fibers and provides good matching characteristics. In order to achieve a market progress for application closer to users, further, communications systems must be provided at low costs.

For the 1.3-micrometer waveband and the 1.55-micrometer waveband, the system of materials used on the InP substrate are typical, and have been reliably used in edge emitting lasers. Such long-wavelength-band semiconductor lasers, however, have drawbacks in that the operating current increases three-folds when an ambient temperature increases from room temperature to 80 degrees Celsius. In order to provide a low-cost system that does not use a cooling device, it is vital to develop long-wavelength-band semiconductor lasers that have better temperature characteristics. The reason why the temperature characteristics are not satisfactory is that electrons are easy to overflow because of the small discontinuity of a conduction band and that this tendency is temperature-sensitive.

The system of materials that can form a 1.3-micrometer-band semiconductor laser on a GaAs substrate has recently been attracting attention. Research has been directed to (Ga)InAs quantum dots, GaAsSb, and GaInNAs (e.g., Patent Document 1). Especially, GaInNAs is recognized as a material that substantially suppresses the temperature dependency of laser characteristics. Here, materials of the GaInNAs system include other Group-III-V elements such as P, Sb, and Al.

GaInNAs is a Group III-V mixed-crystal semiconductor that contains nitrogen (N) and other Group V elements. In GaInNAs, the addition of nitrogen (N) to GaInAs having a larger lattice constant than GaAs provides for the latice constant to be matched with that of GaAs. Further, band-gap energy is reduced to make it possible to emit light in the 1.3-micrometer band or the 1.55-micrometer band.

In Non-Patent Document 1, for example, Kondo et. al. calculate the band lineup of GaInNAs. GaInNAs has band-gap energy that is reduced by the addition of nitrogen (N). Since the energy of the conduction band and the valence band also lowers, the discontinuity of the conduction band becomes significantly large compared with GaAs lattice-matched materials such as GaInP, AlGaAs, and GaAs. This is expected to provide for a semiconductor laser having superior temperature characteristics. A 10% In composition with a 3% nitrogen composition can produce 1.3-micrometer band. However, there is a problem in that the threshold current density increases rapidly as the nitrogen composition increases.

FIG. 1 is a chart showing a threshold current density that is dependent on the nitrogen composition according to experiments. The horizontal axis represents the percentage (%) of nitrogen composition, and the vertical axis represents the threshold current density. As shown in FIG. 1, the threshold current density increases rapidly with the increase of nitrogen composition. This is because the crystallinity of the GaInNAs layer deteriorates with the increase of nitrogen composition. As a counter measure, the In composition is raised while the nitrogen composition is lowered (e.g., Patent Document 2 and Patent Document 3), with the use of a GaInNAs-system quantum well active layer that has a compressive strain as large as 2% or more relative to the substrate. Based on this construction, some studies (e.g., Non-Patent Document 2) provide a laser device that has a characteristic temperature exceeding 200 K, with the threshold current density of the semiconductor laser being smaller than 1 kA/cm$^2$, and the operating current increasing only 1.3 times even when the ambient temperature rises from room temperature to 80 degrees Celsius.

A GaAs layer is used for the barrier layer. When the GaInNAs-system quantum well active layer having a compressive strain is employed, GaAs is often used for the barrier layer. There are also studies (e.g., Non-Patent Document 3) that report proper temperature characteristics of 140 K–170 K based on the use of GaInAs quantum well active layer having no nitrogen and a high strain. GaAs is used for the barrier layer in this case also.

In the presence of such a high strain, however, there is a need to secure film growth close to a critical film thickness at which three-dimensional growth takes the place of two-dimensional growth. A technique must be contrived for this purpose. Conventionally, a low-temperature growth method (e.g., Patent Document 2) and a method that achieves a surfactant-like effect by adding Sb (e.g., Patent Document 3) are known. These methods, however, limit the design of devices by imposing a limit to the number of quantum wells, for example, for the purpose of suppressing the generation of crystalline defects.

Methods for improvement include using a $Ga_dIn_{1-d}N_eP_fAs_{1-e-f}$ material (e.g., Patent Document 4), a GaNPAs or GaNAs layer (e.g., Patent Document 5), a GaNAs layer (e.g., Patent Document 3), or GaNAsSb (e.g., Non-Patent Document 4) as a barrier layer including N and having a smaller lattice constant than the substrate, thereby providing a strain-compensation structure that suppresses (compensates for) the strain of the active layer. Patent Document 2 teaches a 0.9% N composition in the GaInNAsSb well layers and a 1.8% N composition in the GaNAs barrier layers. Non-Patent Document 4 teaches a 1.7% N composition in the GaInNAsSb well layers and a 2% N composition in the GaNAsSb barrier layers. Patent Document 5 discloses a 2% N composition in both the GaInNAs well layers and the GaNAs barrier layers. In this manner, the N composition in the barrier layers is larger or equal to the N composition in the well layers.

As the reason why a material having added N is used for the barrier layers, Patent Document 4 explains a need to form a strain compensation layer to suppress a strain in the active layer and a need to achieve easy control of an interface between a well layer and a barrier layer. Patent Document 5 explains a need for forming a strain compensation layer to suppress a strain in the active layer. Patent Document 3 explains a need for reducing the discontinuity of a conduction band to lower quantum levels towards longer wavelengths and a need to improve crystallinity by achieving homo-epitaxial through the addition of N to both the well layers and the barrier layers.

The addition of N to GaAs results in the lattice constant being smaller. Moreover, since GaNAs has its quantum level energy lowered by a decrease in the discontinuity of conduction bands relative to the GaInNAs quantum well active layers, an oscillating wavelength becomes longer. Accordingly, N composition necessary for the attainment of a required wavelength can be reduced in the quantum well active layers, making it possible to improve the quality of active layers. However, the same reason (i.e., the decrease in the discontinuity of conduction bands relative to the GaInNAs quantum well active layers) works to create an increasing number of overflowing electrons, resulting in the deterioration of temperature characteristics.

[Patent Document 1] Japanese Patent Application Publication No. 6-37355

[Non-Patent Document 1] Japan. J. Appl. Phys. Vol. 35(1996) pp. 1273–1275

[Patent Document 2] Japanese Patent Application Publication No. 2000-332363

[Patent Document 3] Japanese Patent Application Publication No. 2002-118329

[Non-Patent Document 2] Japan. J. Appl. Phys. Vol. 39 (2000) pp. 3403–3405

[Non-patenting reference 3] IEEE Photon. Technol. Lett. Vol. 12 (2000) pp. 125–127

[Patent Document 4] Japanese Patent Application Publication No. 10-126004

[Patent Document 5] Japanese Patent Application Publication No. 10-145003

[Non-Patent Document 4] Electron. Lett. Vol. 38, pp 277–278 (2002)

Accordingly, there is a need for a semiconductor light emitter, an optical transmission module, an optical transceiver module, and an optical communication system, in which a semiconductor light emitter using a GaInNAs-type quantum well active layer provides satisfactory temperature characteristics and a low threshold.

SUMMARY OF THE INVENTION

It is a general object of the present invention to provide a semiconductor light emitter, an optical transmission module, an optical transceiver module, and an optical communication system that substantially obviate one or more problems caused by the limitations and disadvantages of the related art as described heretofore or will be described in the description.

In order to achieve the object according to the invention, a semiconductor light emitter includes a quantum well active layer which includes nitrogen and at least one other Group-V element, and barrier layers which are provided alongside the quantum well active layer, wherein the quantum well active layer and the barrier layers together constitute an active layer, wherein the barrier layers are formed of a Group-III-V mixed-crystal semiconductor that includes nitrogen and at least one other Group-V element, a nitrogen composition thereof being smaller than that of the quantum well active layer.

According to another aspect of the invention, the barrier layers further include phosphorus.

According to another aspect of the invention, the barrier layers are one of GaNAs, GaNPAs, GaInNAs, GaInNPAs, GaNAsSb, GaNPAsSb, GaInNAsSb, and GaInNPAsSb.

According to another aspect of the invention, a semiconductor light emitter includes a quantum well active layer which includes nitrogen and at least one other Group-V element, barrier layers which are provided alongside the quantum well active layer, wherein the quantum well active layer and the barrier layers together constitute one active layer, upper and lower reflectors which are respectively provided on upper and lower sides of the one active layer, wherein the one active layer and the upper and lower reflectors together constitute a resonator structure, a GaAs substrate on which the resonator structure is formed, and spacer layers which are provided between the upper and lower reflectors and the one active layer, wherein the barrier layers are formed of a Group-III-V mixed-crystal semiconductor that includes nitrogen and at least one other Group-V element, and the spacer layers are mainly formed of a material having a larger band gap than GaAs.

According to another aspect of the invention, the material having a larger band gap than GaAs is one of GaInPAs and AlGaAs.

According to another aspect of the invention, the semiconductor light emitter is a surface emitting semiconductor laser.

According to another aspect of the invention, an optical transmission module includes the semiconductor light emitter as described above serving as a light source.

According to another aspect of the invention, an optical transceiver module includes the semiconductor light emitter as described above serving as a light source.

According to another aspect of the invention, an optical communication system includes the semiconductor light emitter as described above serving as a light source.

According to another aspect of the invention, a method of making a semiconductor light emitter is provided, the semiconductor light emitter including a quantum well active layer which includes nitrogen and at least one other Group-V element, and barrier layers which are provided alongside the quantum well active layer, wherein the quantum well active layer and the barrier layers together constitute an active layer, wherein the barrier layers are formed of a Group-III-V mixed-crystal semiconductor that includes nitrogen and at least one other Group-V element, a nitrogen composition thereof being smaller than that of the quantum well active layer. The method includes the steps of providing a plurality of Ga raw material cells in a molecular beam epitaxy apparatus, and growing the quantum well active layer and the barrier layers by use of the respective Ga raw material cells, an amount of Ga supply of the cell used for growing the quantum well active layer being smaller than an amount of Ga supply of the cell used for growing the barrier layers.

A semiconductor light emitter includes a GaAs substrate, and an active region which is grown on the GaAs substrate, wherein the active region comprises a quantum well active layer which is made of a mixed-crystal semiconductor having a compressive strain and containing nitrogen and at least one other Group-V element, and a strain-compensated layer which is situated alongside the quantum well active layer, and has a multi-layer structure that includes a first layer containing nitrogen and having a lower conduction band than GaAs and a second layer with a tensile strain including phosphorous and having a higher conduction band than GaAs, the first layer being situated closer to the quantum well active layer than the second layer.

According to another aspect of the invention, the quantum well active layer is a multiple quantum well active layer.

According to another aspect of the invention, the first layer has a tensile strain relative to GaAs.

According to another aspect of the invention, the quantum well active layer is a multiple quantum well active layer including a plurality of quantum well active layers and barrier layers between the quantum well active layers, the barrier layers including either phosphorous or nitrogen and having a tensile strain According to another aspect of the invention, the tensile strain of the second layer is larger than the tensile strain of the barrier layers.

According to another aspect of the invention, the multi-layer structure further includes an incremental-composition layer in which a strain continuously changes.

According to another aspect of the invention, the second layer is a GaAsP layer, and the first layer is a GaAsN layer, a GaAsP composition of the GaAsP layer being $GaAs_{(1-x)}P_x$ ($0<x\leq0.2$), and the GaAsN layer situated next the quantum well active layer having a thickness of 1 nm or more.

According to another aspect of the invention, the semiconductor light emitter is a surface emitting semiconductor laser.

According to another aspect of the invention, an optical transmission module includes the semiconductor light emitter as described above serving as a light source.

According to another aspect of the invention, an optical communication system includes the optical transmission module as described above serving as an optical transmission module.

According to another aspect of the invention, a quantum well structure includes a quantum well layer which includes In and nitrogen and at least one other Group-V element and has a compressive strain, and barrier layers which are provided on upper and lower sides of the quantum well layer, wherein each of the barrier layers includes a layer including In and phosphorous and situated alongside the quantum well layer and a layer having a tensile strain.

According to another aspect of the invention, a semiconductor light emitter includes a quantum well layer which includes In and nitrogen and at least one other Group-V element and has a compressive strain, and barrier layers which are provided on upper and lower sides of the quantum well layer, wherein the quantum well layer and the barrier layers together constitute a quantum well structure serving as an active layer, and each of the barrier layers includes a layer including In and phosphorous and situated alongside the quantum well layer and a layer having a tensile strain.

According to another aspect of the invention, the layer including In and phosphorous and situated alongside the quantum well layer has band gap energy that is lower than or equal to that of GaAs.

According to another aspect of the invention, the layer including In and phosphorous and situated alongside the quantum well layer has a strain of ±0.1% or less.

According to another aspect of the invention, each of the barrier layers includes an incremental composition layer.

According to another aspect of the invention, the active layer has a multiple quantum well structure.

According to another aspect of the invention, the semiconductor light emitter is a surface emitting semiconductor laser.

According to another aspect of the invention, the layer including In and phosphorous and situated alongside the quantum well layer is made of GaInAsP.

According to another aspect of the invention, an optical transmission module includes the semiconductor light emitter as described above.

According to another aspect of the invention, an optical transmission system includes the optical transmission module as described above.

According to another aspect of the invention, a semiconductor light emitter includes a GaAs substrate, a quantum well active layer which includes nitrogen and at least one other Group-V element, and has a compressive strain relative to the GaAs substrate, and barrier layers which are provided alongside the quantum well active layer, wherein the quantum well active layer and the barrier layers together constitute an active layer, wherein the barrier layers are formed of a Group-III-V mixed-crystal semiconductor that includes antimony, and the quantum well active layer does not include antimony.

According to another aspect of the invention, the barrier layers further include nitrogen.

According to another aspect of the invention, a semiconductor light emitter includes a GaAs substrate, a quantum well active layer which includes nitrogen and at least one other Group-V element, and has a compressive strain relative to the GaAs substrate, and barrier layers which are provided alongside the quantum well active layer, wherein the quantum well active layer and the barrier layers together constitute an active layer, wherein the barrier layers are formed of a Group-III-V mixed-crystal semiconductor that includes antimony and nitrogen, and the quantum well active layer has no or some concentration of antimony smaller than an antimony concentration of the barrier layers and has an nitrogen concentration larger than that of the barrier layers.

According to another aspect of the invention, the barrier layers are formed of GaAsSb, GaNAsSb, GaInNAsSb, GaNPAsSb, GaPAsSb, GaInNPAsSb, GaInPAsSb, or GaInAsSb.

According to another aspect of the invention, the barrier layers including antimony have a tensile strain relative to the GaAs substrate.

According to another aspect of the invention, a semiconductor light emitter includes a GaAs substrate, a quantum well active layer which includes nitrogen and at least one other Group-V element, and has a compressive strain relative to the GaAs substrate, barrier layers which are provided around the quantum well active layer, and an intermediate layer which is provided between the quantum well active layer and the barrier layers, and is formed of a Group-III-V mixed-crystal semiconductor that includes antimony.

According to another aspect of the invention, the intermediate layer is formed of GaAsSb, GaNAsSb, GaInNAsSb, GaNPAsSb, GaPAsSb, GaInNPAsSb, GaInPAsSb, or GaInAsSb.

According to another aspect of the invention, the barrier layers have a tensile strain relative to the GaAs substrate, and the intermediate layer including antimony has a lattice constant that is larger than that of the barrier layers and smaller than that of the quantum well active layer.

According to another aspect of the invention, a semiconductor light emitter includes a quantum well active layer which includes nitrogen and at least one other Group-V element, wherein the quantum well active layer is comprised of first layers and second layers stacked one over the other in cyclic arrangement, the first layers including In, Sb, and at least one other Group-V element, and the second layers including no or some In composition smaller than that of the first layers, N, and at least one other Group-V element.

According to another aspect of the invention, the first layers are GaInAsSb, and the second layers are GaNAs.

According to another aspect of the invention, at least the active layer is formed through crystal growth by an MOCVD method.

According to another aspect of the invention, the semiconductor light emitter is a surface emitting semiconductor layer.

According to another aspect of the invention, an optical transmission module includes the semiconductor light emitter as described above serving as a light source.

According to another aspect of the invention, an optical transceiver module includes the semiconductor light emitter as described above serving as a light source.

According to another aspect of the invention, an optical communication system includes the semiconductor light emitter as described above serving as a light source.

According to another aspect of the invention, a method of producing the semiconductor light emitter as described above is provided, wherein at least the active layer is formed through crystal growth by an MOCVD method.

According to another aspect of the invention, the semiconductor light emitter is a surface emitting semiconductor layer.

According to another aspect of the invention, an optical transmission module includes the semiconductor light emitter as described above serving as a light source.

According to another aspect of the invention, an optical transceiver module includes the semiconductor light emitter as described above serving as a light source.

According to another aspect of the invention, an optical communication system includes the semiconductor light emitter as described above serving as a light source.

According to another aspect of the invention, a semiconductor light emitter includes a GaAs substrate, a quantum well active layer which includes nitrogen and at least one other Group-V element, and has a compressive strain relative to the GaAs substrate, and barrier layers which are provided alongside the quantum well active layer, wherein the quantum well active layer and the barrier layers together constitute an active layer, wherein the barrier layers are formed of a Group-III-V mixed-crystal semiconductor that includes both phosphorous and antimony.

According to another aspect of the invention, the barrier layers further include nitrogen.

According to another aspect of the invention, the barrier layers are GaNPAsSb, GaPAsSb, GaInNPAsSb, or GaInPAsSb.

According to another aspect of the invention, a semiconductor light emitter includes a GaAs substrate, a quantum well active layer which includes Ga, As, and Sb, and has a compressive strain relative to the GaAs substrate, and barrier layers which are provided alongside the quantum well active layer, wherein the quantum well active layer and the barrier layers together constitute an active layer, wherein the barrier layers are formed of a Group-III-V mixed-crystal semiconductor that includes both phosphorous and antimony.

According to another aspect of the invention, the barrier layers are GaPAsSb, AlGaPAsSb, GaInPAsSb, or AlGaInPAsSb.

According to another aspect of the invention, the quantum well active layer is a multiple quantum well active layer.

According to another aspect of the invention, the semiconductor light emitter is a surface emitting semiconductor laser.

According to another aspect of the invention, an optical transmission module includes the semiconductor light emitter as described above serving as a light source.

According to another aspect of the invention, an optical transceiver module includes the semiconductor light emitter as described above serving as a light source.

According to another aspect of the invention, an optical communication system includes the semiconductor light emitter as described above serving as a light source.

According to another aspect of the invention, a semiconductor laser includes well layers, and barrier layers, wherein the well layers and the barrier layers are stacked one over the other to form an active layer having a multiple quantum well structure, the barrier layers being made of a mixed-crystal semiconductor including nitrogen and at least one other Group-V element, the barrier layers including p-type impurity doped at concentration ranging from $1\times10^{17}$ cm$^{-3}$ to $1\times10^{19}$ cm$^{-3}$.

According to another aspect of the invention, the p-type impurity is carbon.

According to another aspect of the invention, a doping concentration of the p-type impurity in one of the barrier layers is lower in a region adjoining one of the well layers than in a region separated from the well layers.

According to another aspect of the invention, the well layers and the barrier layers have opposite strains.

According to another aspect of the invention, the well layers are made of a mixed-crystal semiconductor including nitrogen and at least one other Group-V element.

According to another aspect of the invention, the semiconductor laser as described above further includes a resonator structure having a pair of multi-layered reflectors at opposite ends, the resonator structure including the active layer, and the semiconductor laser being a surface emitting semiconductor laser.

According to another aspect of the invention, a method of making the semiconductor laser as described above includes a step of doping carbon in the barrier layers by use of an organic nitrogen raw material.

According to another aspect of the invention, an optical transmission module includes the semiconductor laser as described above.

According to another aspect of the invention, an optical transmission system includes the optical transmission module as described above.

Other objects and further features of the present invention will be apparent from the following detailed description when read in conjunction with the accompanying drawings.

BRIEF DESCRIPTION OF THE DRAWINGS

FIG. 26 is a drawing showing an optical transceiver module of a seventh example;

FIGS. 27A and 27B are illustrative drawings showing a semiconductor laser of a first example according to the invention;

FIGS. 28A through 28F are diagrams showing the conduction band energy and strain profiles of a quantum well structure;

FIG. 29 is a drawing showing a surface emitting semiconductor laser according to a second example of the invention;

FIG. 30A is a drawing showing the detail of a stacked layer structure of a multiple quantum well active layer in the surface emitting semiconductor laser according to the second example of the invention;

FIG. 30B is a drawing showing the energy diagram of the conduction band position of the multiple quantum well active layer;

FIG. 30C is a drawing showing a strain profile of the multiple quantum well active layer;

FIG. 31A is a illustrative drawing showing the stacked layer structure of a multiple quantum well active layer in the surface emitting semiconductor laser according to a third example;

FIG. 31B is a drawing showing a strain profile of the multiple quantum well active layer;

FIG. 31C is a drawing showing the energy diagram of the conduction band position of the multiple quantum well active layer;

FIG. 33 is an illustrative drawing showing an optical transmission system according to a fifth example of the invention;

DESCRIPTION OF THE PREFERRED EMBODIMENTS

Figure 1:
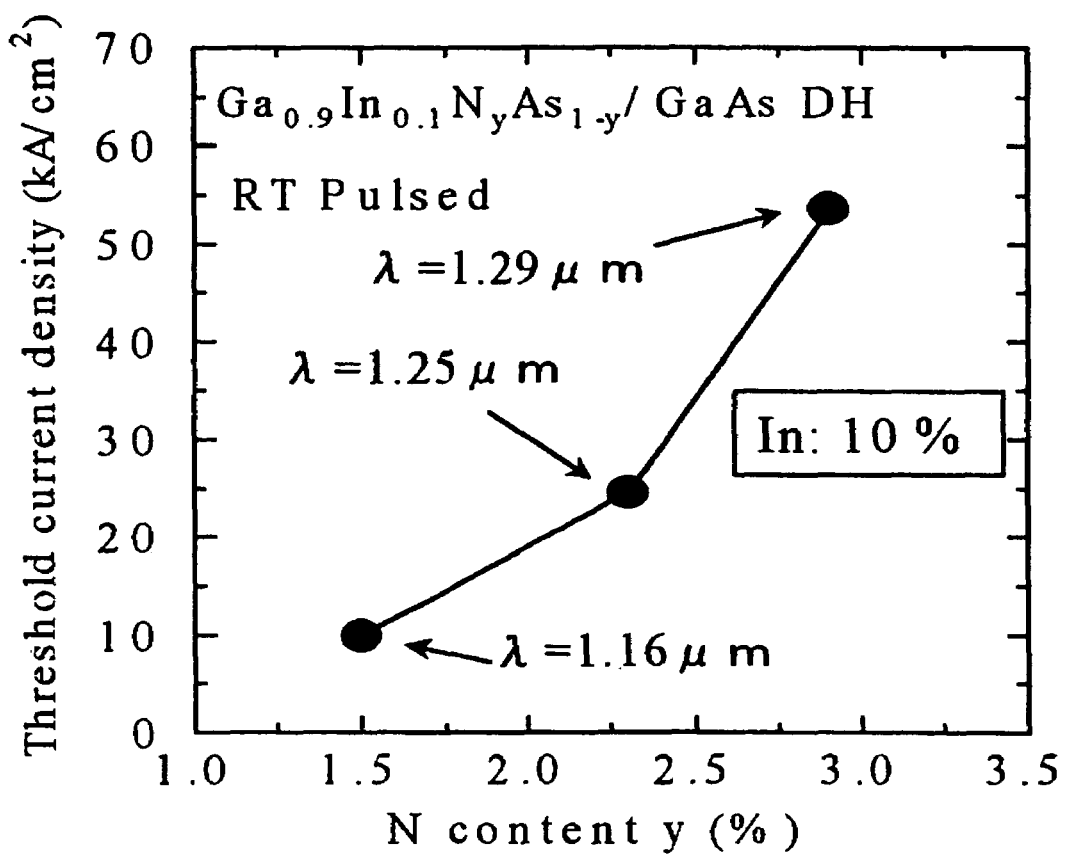
FIG. 1 is a chart showing a threshold current density that is dependent on a nitrogen composition according to experiments.

In the following, embodiments of the present invention will be described with reference to the accompanying drawings.

(First Embodiment)

In the first embodiment of the invention, a semiconductor light emitter has an active layer comprised of one or more quantum well active layers including nitrogen (N) and at least one other Group-V element and barrier layers formed alongside the quantum well active layers. Like the quantum well active layers, the barrier layers include nitrogen (N) and at least one other Group-V element, but is made of a Group III-V mixed-crystal semiconductor material having a smaller N composition than the quantum well active layer.

With 1% of N added to GaAs, a band gap decreases 156 meV, and a conduction band falls 175 meV, with the valence band dropping 19 meV (see "16th Semiconductor Laser Symposium" by Kitatani et. al.). In this manner, a minute addition of N results in a significant drop of the conduction band. Since the lattice constant of GaN having a zinc blende structure is 4.5 angstroms, a 0.204% tensile strain per 1% N is obtained relative to GaAs.

In the invention, the following effect is maintained by the addition of N to the barrier layer. That is, a satisfactory interface is provided between a barrier layer and a quantum well active layer. When the MOCVD method is employed to grow GaInNAs-type materials, the supply of an N raw material needs to be in such a large quantity that the mole percentage relative to the supply of an As raw material ("N raw material"/("N raw material"+"As raw material")) exceeds 0.9. Since the N raw material needs to be supplied in large quantity, it is difficult to achieve diligent control of on/off of the raw material supply, i.e., to achieve diligent control at an interface. Moreover, growth by the MBE (molecular beam epitaxy) method is sustained by supplying an N raw material activated by RF or the like, which makes it difficult to achieve speedy on/off switching. Like the MOCVD method, it is thus difficult to achieve diligent control at an interface. With the provision of N added to the barrier layers, however, there is no need to control the on/off switching of raw material supply at the interface, thereby providing better control at the interface.

Moreover, the addition of N to the barrier layer makes the barrier layer a tensile strain layer relative to GaAs. This provides a strain compensation structure when a quantum well active layer having a compressive strain is used. An effect of strain reduction improves the reliability of devices.

In the invention, the N composition that is smaller in the barrier layer than in the well layer provides further advantages. That is, such provision provides satisfactory temperature characteristics as in the case where no N is added to the barrier layer. When the N composition of a barrier layer is larger than that of the quantum well active layer, the drop of conduction band energy of the barrier layer becomes significant in comparison, resulting in the discontinuity of a conduction band being smaller than in the case where the quantum well active layer and the barrier layer are both formed from materials with no added N. This degrades the temperature characteristics of a semiconductor laser. Materials with no added N that can be used for the quantum well active layer and the barrier layer may be GaInAs for the well layer and GaAs for the barrier layer, for example. As shown in IEEE Photon. Technol. Lett. Vol. 12 (2000), pp. 125–127, such combination of materials provides a good temperature characteristic of 140K–170K, achieving sufficient discontinuity in the conduction band. When the N composition of a barrier layer is smaller than the N composition of the quantum well active layer, on the other hand, the drop of conduction band energy of the quantum well active layer is larger in comparison, attaining sufficient discontinuity in the conduction band, and providing a semiconductor laser having good temperature characteristics.

In epitaxial growth, the crystalline quality of a base material greatly affects the quality of a growing layer. When the N composition of a barrier layer is smaller than the N composition of a quantum well active layer, the crystallinity of the barrier layer used as the base layer for growth of the quantum well active layer improves. As a result, the crystallinity of the quantum well active layer also improves.

It is not easy, however, to achieve the N composition of a barrier layer smaller than the N composition of a quantum well active layer, especially in the MBE method. In the case of the MBE method, a hetero structure is generally formed by controlling the on/off state of a shutter. When the hetero structure of GaInNAs and GaNAs is to be formed, for example, the on/off state of a shutter is controlled for In. A growth rate is thus faster for GaInNAs. In the MBE method, the N composition becomes large when a growth rate is slow. Since the In-composition dependency of N inclusion is small, the N composition becomes larger in the GaNAs barrier layer. If a growth rate is to be changed, the amount of raw material supply must be controlled by changing the temperature of a raw material cell. Since such procedure takes time, optimization for growth suspension periods needs to be provided, making it a rather difficult option.

Such difficulties can be avoided, however, by providing a plurality of Ga raw material cells with a function to change the amount of raw material supply on a cell-by-cell basis. The supply of Ga of a cell used for the growth of a quantum well active layer is set smaller than the supply of Ga of a cell used for the growth of a barrier layer, and switching is made between GaInNAs and GaNAs at the time of growth.

In the case of the MOCVD method, the In-composition dependency of N inclusion is quite high, and the rate of N inclusion drops rapidly with the In composition. Because of this, a ratio of As to N in the raw material supply needs to be significantly changed. Such a need can be addressed by controlling the amount of raw material gas supply by use of a mass-flow controller having a fast response rate.

(Second Embodiment)

A semiconductor light emitter according to the second embodiment of the invention differs from the semiconductor light emitter of the first embodiment in that a barrier layer includes phosphorus (P) in addition to N and other Group-V elements.

Materials that possess a tensile strain relative to GaAs include a material having at least one of N and P added to GaAs. In the first embodiment, the N composition of a barrier layer is made smaller than the N composition of a well layer, so that the tensile strain of the barrier layer is limited. The addition of P in the second embodiment provides for adjustment of a tensile strain. This makes it possible to optimize the strain compensation structure, providing room for additional wells, resulting in the greater latitude in device design. Reliability is also improved.

Furthermore, the addition of P has the effect of raising conduction band energy, which compensates for the drop of conduction band energy caused by the added N, providing sufficient discontinuity in the conduction band, with satisfactory entrapment of electrons.

To be specific, when 1% of P is added to GaAs, the band gap increases about 11.7 meV, and the conduction band rises 7 meV, with the lowering of the valence band by 4.7 meV ("Pys. Rev. 146 (1966)", p601 by A. G. Thompson et. al., Appl. Pyys. Lett. Vol. 72 (1998), p2011, by Su-Huai Wei et. al.). Since the lattice constants of GaAs and GaP are 5.65325 angstroms and 5.4495 angstroms, respectively, a 0.0360% tensile strain per 1% P is obtained relative to GaAs.

In the semiconductor light emitter of the first and second embodiments described above, the barrier layer may be formed of GaNAs, GaNPAs, GaInNAs, GaInNPAs, GaNAsSb, GaNPAsSb, GaInNAsSb, GaInNPAsSb, or the like.

The barrier layer may be comprised of a plurality of layers. It suffices if a layer closest to the quantum well active layer has N composition smaller than that of the quantum well active layer.

Moreover, the semiconductor light emitter of the first and second embodiments described above may be a surface emitting semiconductor laser (VCSEL: vertical cavity surface emitting laser).

In order to achieve high-capacity optical networks and optical fibers at low costs without any regard to distance, a semiconductor laser of a 1.3-micrometer band or a 1.55-micrometer band is necessary as a light source that incurs a little transmission loss on silica fibers and provides good matching characteristics, and such semiconductor laser needs to have proper temperature characteristics without a need for a cooling device. To this end, a surface emitting laser device (VCSEL: vertical cavity surface emitting laser) is quite suitable. The surface emitting semiconductor laser is better suited for cost reduction, power consumption reduction, miniaturization, 2-dimensional circuit integration than the edge emitting laser. In actuality, a 0.85-micrometer-band laser that can be formed on a GaAs substrate has been put to practical use in the 1 Gbit/sec Ethernet of a high-speed LAN. The use of GaInNAs-type materials for an active layer in the surface emitting semiconductor laser makes it possible to cope with such wavelengths.

Moreover, a surface emitting laser has an extremely short resonator length and a narrow gain range, compared with edge emitting laser, and thus needs a large active-layer gain. In order to provide satisfactory device characteristics, a plurality of quantum well active layers need to be provided to boost the gain. Because of the strain compensation structure (barrier layer) of the present invention, the number of active layers can be increased, thereby providing a surface emitting laser that operates at a low threshold current, generates a high-power output, and provides satisfactory temperature characteristics. In addition, the MOCVD method may be employed to reduce the resistance of the semiconductor distributed Bragg reflector of a surface emitting laser. This is preferable since the operating voltage can be reduced.

(Third Embodiment)

A semiconductor light emitter of the third embodiment of the invention has, on a GaAs substrate, an active layer comprised of one or more quantum well active layers including nitrogen (N) and at least one other Group-V element and barrier layers formed alongside the quantum well active layers, and a resonator including an upper reflector and a lower reflector between which the active layer is sandwiched. In such a surface emitting laser, the barrier layer includes nitrogen (N) and other Group-V elements in the same manner as does the quantum well active layer, but is formed of a Group III-V mixed-crystal semiconductor having a smaller N composition than the quantum well active layer. A spacer layer situated between a reflector and the active layer is formed of a material having a larger band gap than GaAs.

The addition of N in the barrier layer provides a satisfactory interface between the barrier layer and the quantum well active layer. Further, the addition of N to the barrier layer provides a tensile strain layer relative to GaAs, thereby making it possible to form a strain compensation layer when a quantum well active layer has a compressive strain. The effect of strain reduction improves the reliability of devices.

Furthermore, since the N composition of the barrier layer is smaller than the N composition of the quantum well active layer, the drop of conduction band energy is larger for the quantum well active layer, thereby attaining sufficient discontinuity in the conduction band, and providing a semiconductor laser having good temperature characteristics. Moreover, since the N composition of the barrier layer is smaller than the N composition of the quantum well active layer, the crystallinity of the barrier layer serving as a base layer for the growth of the quantum well active layer is improved compared with the case where the N composition of the barrier layer is larger. This ultimately improves the crystallinity of the quantum well active layer.

In a surface emitting laser having GaInNAs-type materials used for the active layer, GaAs is generally used for a spacer layer, which is situated between the active layer and a reflector and serves to entrap light and carriers in the active layer and to adjust the resonator length. Since the discontinuity of a conduction band in the GaAs and GaInNAs active layer is large, the entrapment of electrons is properly done. In the case of a surface emitting laser, carrier density required for inducing oscillation is greater than an edge emitting laser, so that a larger number of electrons will overflow into the spacer layer. Because of this, the discontinuity of a conduction band needs to be increased between the spacer layer and the quantum well active layer. When the spacer layer is mainly formed of a material having a larger band gap than GaAs, the number of electrons overflowing from the quantum well active layer into the spacer layer can be reduced in a surface emitting laser, thereby making it possible to suppress the threshold current. Such provision also improves temperature characteristics.

The aforementioned material that has a larger band gap than GaAs may be GaInPAs or AlGaAs. Other Group-III-V elements such as Sb and N may also be included.

The surface emitting laser of the invention may be used as a light source of an optical transmitting module.

The surface emitting semiconductor laser as described above, which has low resistance and operates at a low voltage and at a low threshold current with satisfactory temperature characteristics, may be utilized to provide an optical transmission module at low costs with no need for a cooling device.

Moreover, the surface emitting laser of the invention may be used as a light source of an optical transceiver module.

The surface emitting semiconductor laser as described above, which has low resistance and operates at a low voltage and at a low threshold current with satisfactory temperature characteristics., may be utilized to provide an optical transceiver module at low costs with no need for a cooling device.

Moreover, the surface emitting laser of the invention may be used as a light source of an optical communication system.

The surface emitting semiconductor laser as described above, which has low resistance and operates at a low voltage and at a low threshold current with satisfactory temperature characteristics, may be utilized to provide an optical communication system such as an optical fiber communication system and an optical interconnection system at low costs with no need for a cooling device.

EXAMPLE 1

Figure 2:
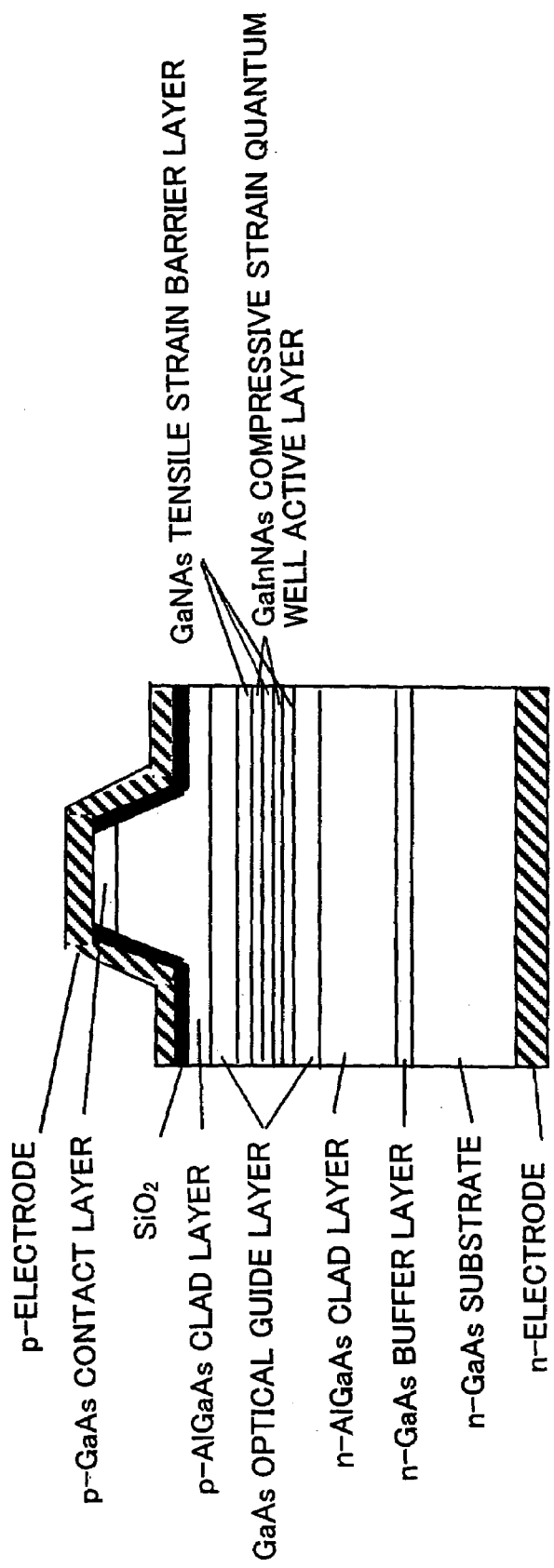
FIG. 2 is a drawing showing a GaInNAs edge emitting semiconductor laser according to a first example of the invention.

FIG. 2 is a drawing showing a GaInNAs edge emitting semiconductor laser according to the first example of the invention. An example of FIG. 2 shows a ridge-stripe-type laser. The GaInNAs edge emitting semiconductor laser of FIG. 2 has a SCH-SQW (separate confinement heterostructure single quantum well) layer structure.

In the example of FIG. 2, a Se dope n-GaAs buffer layer, a Se dope n-AlGaAs lower clad layer, an undope GaAs lower light guide layer, an active layer, an undope GaAs upper light guide layer, a Zn dope p-AlGaAs upper clad layer, and a Zn dope p-GaAs contact layer are successively formed by growing on an n-GaAs substrate with a plane direction (100).

The active layer includes two GaInNAs quantum well active layers (well layers) having a compressive strain and three GaNAs barrier layers (barrier layers) that are formed on both sides of the well layers and have a tensile strain. The well layers have an In-composition x of 33% and a nitrogen composition of 1.0%. The thickness of a well layer is 7 nm. The N composition of the barrier layers is 0.8%.

The MOCVD method was used as a growth method. $H_2$ was used as a carrier gas. As raw materials, TMG (trimethyl gallium), TMI (trimethyl indium), $AsH_3$ (arsine), and $PH_3$ (phosfin) were used. As a raw material for nitrogen, DMHy (dimethyl hydrazine) was used. Since DMHy is decomposed at low temperatures it is suitable for low-temperature growth below 600 degrees Celsius. In the first example, the GaInNAs layer was grown at 550 degrees Celsius. When a quantum well layer having a large strain is to be grown, low-temperature growth around 500–600 degrees Celsius is desirable. The GaNAs barrier layer was also grown at the same 550 degrees Celsius as the GaInNAs layer.

Photolithography and etching were performed to remove layers to a depth of the middle of the p-AlGaAs layer while leaving a 3-micrometer stripe region, thereby forming a ridge structure. A p-side electrode was then formed on the ridge structure while inserting an insulating film, part of which was removed to allow the injection of an electric current. Further, an n-side electrode was formed on the bottom surface of the substrate.

In the first example, the N composition of the barrier layer is smaller than the N composition of the quantum well active layer, so that the drop of conduction band energy caused by added N is larger in the quantum well active layer than in the barrier layer, which provides sufficient discontinuity in the conduction band, resulting in a semiconductor laser having satisfactory temperature characteristics.

In epitaxial growth, the crystalline quality of a base material greatly affects the quality of a growing layer. When the N composition of a barrier layer was smaller than the N composition of the quantum well active layer, the crystallinity of the barrier layer serving as a base for growth of the quantum well active layer was improved, resulting in a higher light-emission efficiency and an ability to operate at a low threshold current.

The crystallinity of an interface between a barrier layer and a quantum well active layer is important. When the MOCVD method is employed to grow GaInNAs-type materials, the supply of an N raw material needs to be in such a large quantity that the mole percentage relative to the supply of an As raw material ("N raw material"/("N raw material"+ "As raw material")) exceeds 0.9. Since the N raw material needs to be supplied in large quantity, it is difficult to achieve diligent control of on/off of the raw material supply, i.e., to achieve diligent control at an interface. Moreover, growth by the MBE method is sustained by supplying an N raw material activated by RF or the like, which makes it difficult to achieve speedy on/off switching. Like the MOCVD method, it is thus difficult to achieve diligent control at an interface. With the provision of N added to the barrier layers as in the first example, however, there is no need to control the on/off switching of raw material supply at the interface, thereby providing better control at the interface.

Although this example has been described with reference to a quantum well active layer having a compressive strain composition, the same advantages can also be achieved even if it has a lattice matching composition or a tensile strain composition.

In this example, furthermore, the GaNAs barrier layer was situated between the GaAs light guide layer and the GaInNAs quantum well active layer to provide a strain compensation structure. The effect of strain reduction thus brought about improvement in the reliability of the device.

Although the above example has been described with reference to growth by the MOCVD method, other growth methods such as the MBE method may as well be used. Moreover, the nitrogen raw material is not limited to DMHy, and other nitrogenous substances such as activated nitrogen or NH3 may as well be used. Although a single quantum well structure (SQW) has been used as an example of stacked layers, a multiple quantum well structure may as well be used. Moreover, the thickness of each layer may be determined according to needs. Further, AlGaInP-type materials having a wide gap like the AlGaAs-type materials may be used for the clad layers. Moreover, other laser structures may instead be used.

EXAMPLE 2

Figure 3:
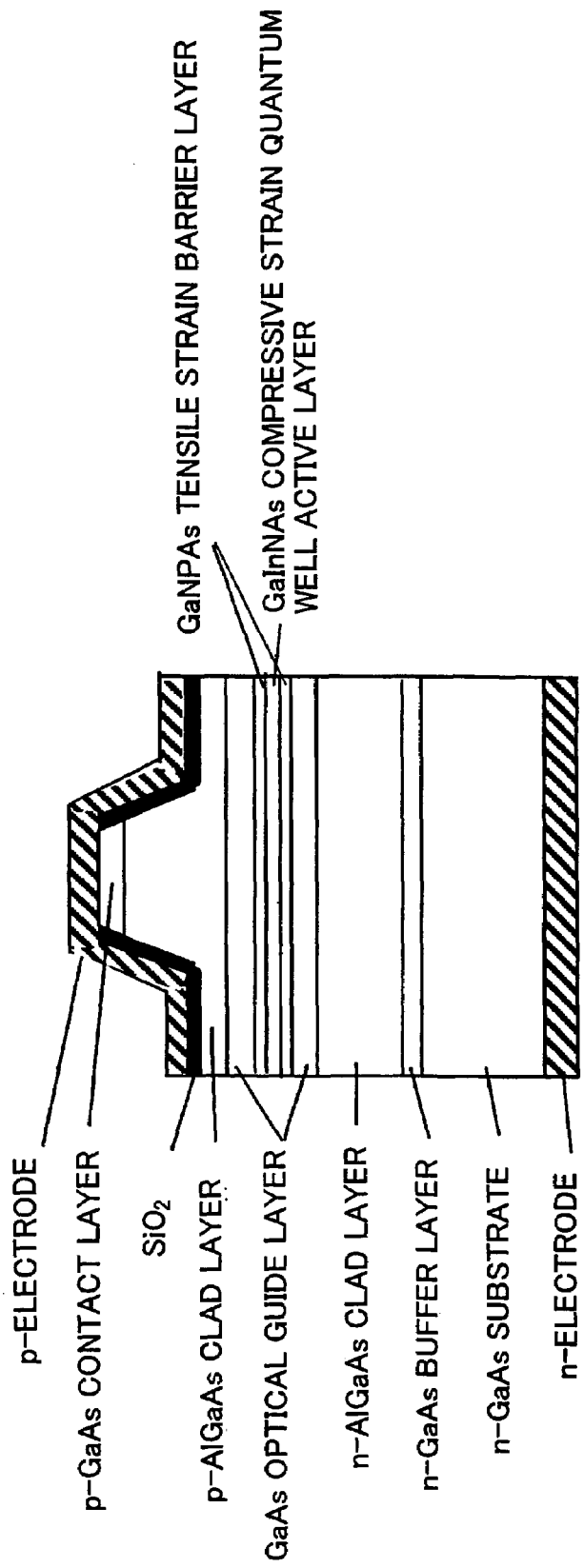
FIG. 3 is a drawing showing a GaInNAs edge emitting semiconductor laser according to a second example of the invention.

FIG. 3 is a drawing showing a GaInNAs edge emitting semiconductor laser according to the second example of the invention. The second example differs from the first example in that there was only one active layer (well layer), and in that the barrier layers situated on both the upper side and the lower side of the active layer was formed of GaNPAs (an N composition of 0.3% and a P composition of 7%).

The device of the second example had the discontinuity of a conduction band that was about the same as that of the GaAs barrier layers. The tensile strain of the barrier layers was 0.3%. Despite the small N composition of the barrier layers, the addition of P successfully achieved a sufficient tensile strain. The effect of strain reduction improved the reliability of the device. Moreover, the N composition of the barrier layers was smaller than the N composition of the quantum well active layer, so that the drop of conduction band energy caused by added N was larger in the quantum well active layer than in the barrier layers while the drop of a conduction band with respect to the barrier layers was compensated for by the addition of P. This provides sufficiently large discontinuity in the conduction band, resulting in a semiconductor laser having satisfactory temperature characteristics despite its single quantum well structure.

EXAMPLE 3

Figure 4:
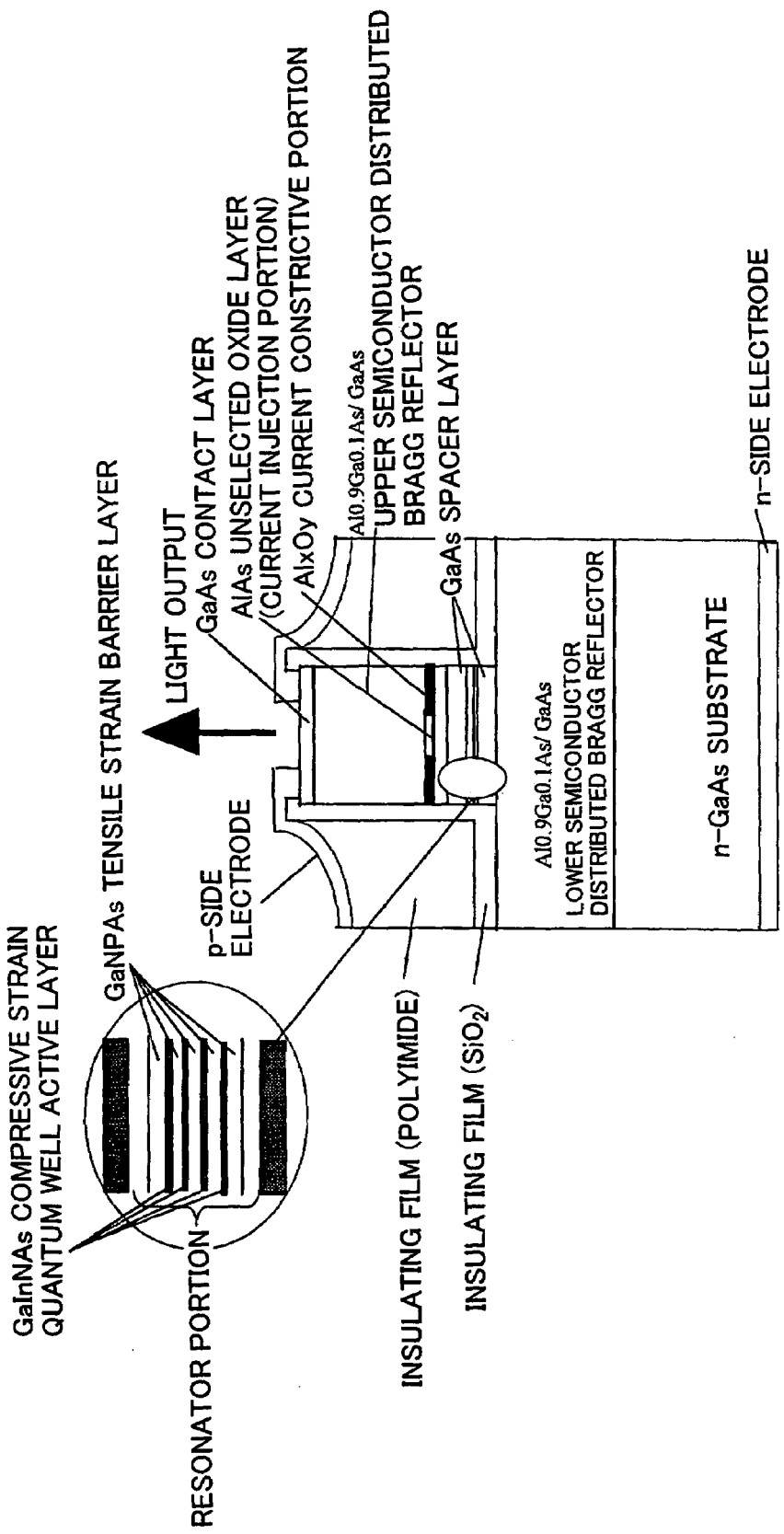
FIG. 4 is a drawing showing a GaInNAs surface emitting semiconductor laser according to a third example of the invention.

FIG. 4 is a drawing showing a GaInNAs surface emitting semiconductor laser according to the third example of the invention.

As shown in FIG. 4, the surface emitting semiconductor laser of the third example includes an n-semiconductor distributed Bragg reflector (lower-side semiconductor distributed Bragg reflector), which is formed on an n-GaAs substrate that is 3 inches wide and has a plane direction (100). This lower-side reflector has a structure in which n-$Al_xGa_{1-x}As$ (x=0.9) and n-GaAs each ¼ times as thick as the oscillation wavelength inside the respective medium are alternately repeated 35 cycles.

On top of the reflector are formed an undope lower GaAs spacer layer, a multiple quantum well active layer including four GaInNAs well layers and five GaNPAs barrier layers, and an undope upper GaAs spacer layer.

On top of these layers, p-semiconductor distributed Bragg reflector (upper-side semiconductor distributed Bragg reflector) is formed. The upper-side reflector is comprised of a periodic structure (e.g., 25 cycles) in which C-dope p-$Al_xGa_{1-x}As$ (x=0.9) and p-GaAs, each ¼ times as thick as the oscillation wavelength inside the respective medium, are alternately stacked one over the other. In addition, an unselected oxide layer of AlAs is formed to a thickness of 30 nm in the upper-side reflector at a position near the active layer. Moreover, the GaAs layer at the top of the upper-side reflector also serves as a contact layer for providing a contact with an electrode.

In the third example, the In-composition x of the well layer in the active layer was 33%, and its nitrogen composition was 1.0%. The well layer was 7 nm in thickness, and had about 2.1% compressive strain (high strain) relative to the GaAs substrate. The GaNPAs barrier layer had an N composition of 0.8%, a P composition of 4%, and a thickness of 20 nm, and had a 0.3% tensile strain relative to the GaAs substrate.

The MOCVD method was employed as a growth method. H2 was used as a carrier gas. As raw materials for a GaInNAs active layer, TMG (trimethyl gallium), TMI (trimethyl indium), AsH3 (arsine), and PH3 (phosfin) were used. As a raw material for nitrogen, DMHy (dimethyl hydrazine) was used. Since DMHy is decomposed at low temperature, it is suitable for low-temperature growth below 600 degrees Celsius. It is especially suitable for the purpose of growing a large strain quantum well layer required to grow at low temperature. When an active layer having a large strain such as that of the GaInNAs surface emitting semiconductor laser of the third example is to be grown, low-temperature growth that achieves non-equilibrium is desirable. In the third example, the GaInNAs layer was grown at 540 degrees Celsius.

In the third example, a mesa having predetermined size is formed by exposing at least a lateral surface of p-AlAs layer, and AlAs with its lateral surface exposed is oxidized from the lateral surface by steam, thereby forming an $Al_xO_y$ current constrictive part. Polyimide was then embedded into the etched part for flattening, the polyimide then removed from the top of the upper-side reflector having a p contact portion and a light emitting portion, a p-side electrode formed on the p-contact layer excluding the light emitting portion, and an n-side electrode formed on the back surface of the substrate.

The oscillating wavelength of the surface emitting semiconductor laser produced in this manner was approximately 1.3 micrometers. Since GaInNAs was used for the active layer, the surface emitting semiconductor laser having a long wavelength band was successfully formed on the GaAs substrate.

Moreover, the N composition of the barrier layers was smaller than the N composition of the quantum well active layer, so that the drop of conduction band energy caused by added N was larger in the quantum well active layer than in the barrier layers. This provides sufficiently large discontinuity in the conduction band, resulting in a semiconductor laser having satisfactory temperature characteristics.

Although the N composition of the barrier layers was small, the addition of P produced a sufficient tensile strain composition. Despite the use of an active layer having a large compressive strain, therefore, the number of wells was able to be increased without creating crystalline defects, successfully producing a high-power output, and improving the reliability of the device through strain reduction.

When GaPAs obtained by adding only P to GaAs is used as the barrier layers, the discontinuity of a conduction band increases compared with when GaAs is used, creating satisfactory entrapment of electrons. This raises the quantum level, however, so that the N composition of the well layer necessary for achieving the same oscillating wavelength increases, resulting in deterioration of the quality of crystal. Jpn. J. Appl. Pyys. Vol. 39(2000) pp. 3403–3405 achieves a temperature characteristic exceeding 200 K with the use of the GaAs barrier layer, and there is no need to increase the discontinuity of a conduction band further more. Because of this, GaNPAs obtained by adding N to GaPAs for the improved discontinuity of a conduction band is desirable for use as a barrier layer for the purpose of avoiding deterioration of crystallinity of the well layer.

In epitaxial growth, the crystalline quality of a base material greatly affects the quality of a growing layer. When the N composition of a barrier layer is smaller than the N composition of a quantum well active layer, the crystallinity of the barrier layer used as the base layer for growth of the quantum well active layer improves. As a result, the crystallinity of the quantum well active layer also improves. With this provision, thus, the semiconductor laser successfully achieved a high light emission efficiency, and successfully operated at a low threshold current.

Moreover, a current was constricted by selective oxidization of the p-AlAs layer which had Al and As as main components, thereby achieving a low threshold current. With the current constrictive structure using a current constrictive layer that was comprised of an Al oxide film obtained by selective oxidization of an oxide layer, the current constrictive layer was formed close to the active layer to suppress the spreading of a current, thereby efficiently entrapping carries in a small area that was not exposed to atmosphere. The Al oxide film obtained through further oxidization reduced a refraction index, which created a convex lens effect to focus light at the small area where carriers were entrapped. This achieved a significantly high efficiency, and reduced the threshold current. Moreover, a simple step was able to form the current constrictive structure, resulting in the reduction of manufacturing costs.

The MBE method is mainly employed for producing semiconductor layers such as GaInNAs layers including nitrogen and other Group-V materials. Since this method requires growth in high vacuum, however, the amount of raw material supply cannot be increased. That is, an increase in the amount of raw material supply entails the excess load on the exhaust system. An exhaust pump of a high vacuum exhaust system is thus needed. With the use of such an exhaust pump, the exhaust system suffers the excess load when removing residual raw materials and the like from the MBE chamber. This results in a likely malfunction and thereby a poor throughput.

A surface emitting semiconductor laser includes multi-layer semiconductor film reflectors and an active region sandwiched between the reflectors where the active region includes at least one active layer for emitting laser light. The thickness of a crystal growth layer of an edge emitting laser is about 3 micrometers. A surface emitting semiconductor laser of a 1.3-micrometer wavelength band requires a thickness exceeding 10 micrometers for a crystal growth layer. Since the MBE method does not allow the amount of raw material supply to be increased due to the necessity of high vacuum, a growth rate can only be 1 micrometer per hour. Growing a layer to a thickness of 10 micrometers requires at least 10 hours without taking into account growth suspension periods that are needed to change the amount of raw material supply.

The thickness of an active region is generally very thin compared with the total thickness (10% or less), and most layers are accounted for by the multi-layer film reflectors. A multi-layer semiconductor film reflector is formed by stacking a low-refractive-index layer and a high-refractive-index layer alternately one over the other (e.g., 20–40 times) where each layer is ¼ times as thick as the oscillation wavelength in the respective medium ($\lambda/4$). In the surface emitting semiconductor laser on the GaAs substrate, AlGaAs-type materials are used, and Al composition is changed to create a low-refractive-index layer (large Al composition) and a high-refractive-index layer (small Al composition). In actuality, resistance becomes large on the p side due to the hetero barrier of each layer. In consideration of this, an intermediate layer having a medium Al composition is inserted between a low-refractive-index layer and a high-refractive-index layer so as to reduce the resistance of a multi-layer film reflector.

As described above, the manufacturing of a surface emitting semiconductor laser involves growing more than 100 semiconductor layers having different compositions, with a need for an intermediate layer between the low-refractive-index layer and a high-refractive-index layer. There is thus a need for instant control of the amount of raw material supply. In the. MBE method, however, the amount of raw material supply is controlled by changing the temperature of a materials cell, which prohibits the flexible control of compositions it is thus difficult to reduce the resistance of a multi-layer semiconductor film reflector grown by the MBE method, and the operating voltage is generally high.

On the other hand, controlling the amount of raw material gases is all that is necessary in the MOCVD method for achieving the instant control of compositions, without a need for high vacuum unlike the MBE method. A growth rate can be increased to 3 micrometers per hour, for example, thereby easily boosting throughput. The MOCVD method is thus suitable for mass production.

In the third example, GaNPAs was used for the barrier layers. Alternatively, GaNAs, GaNPAs, GaInNAs, GaInNPAs, GaNAsSb, GaNPAsSb, GaInNAsSb, or GaInNPAsSb, which has a smaller lattice constant than GaAs, may be used as long as the N composition of a barrier layer is smaller than the N composition of a well layer.

Here, the barrier layer may be comprised of a plurality of layers as long as the layer closest to the quantum well active layer has N composition smaller than that of the quantum well active layer. For example, a barrier layer may be formed of two materials, GaNAs and GaPAs, and GaNAs may serve as a layer in contact with the quantum well active layer. In this manner, independent control is achieved with respect to each of the following: forming a satisfactory interface between a quantum well active layer and a barrier layer; compensating for a strain; and increasing the discontinuity of a conduction band.

In the third example as described above, a surface emitting semiconductor laser of a 1.3-micrometer band with low resistance and low power consumption is provided at low costs.

EXAMPLE 4

Figure 5:
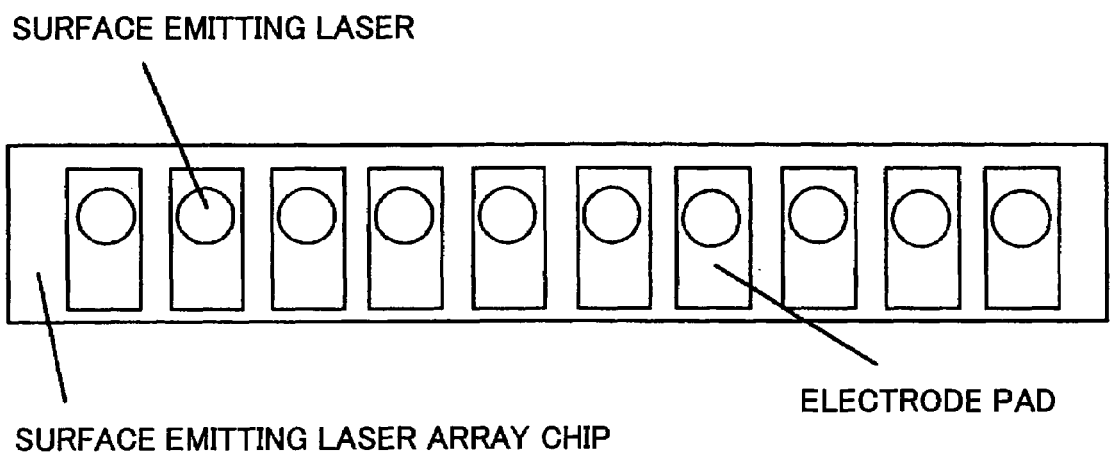
FIG. 5 is a top plan view of a surface emitting laser array according to a fourth example of the invention.

FIG. 5 is a top plan view of a surface emitting laser array according to a fourth example of the invention. The surface emitting laser array of the fourth example includes 10 surface emitting laser devices of the third example arranged in a line. These laser devices may be provided in two dimensional arrangement. The surface emitting laser array of the fourth example has conductive types p and n that are reversed relative to the third example. In the surface emitting laser array of the fourth example, the n-side individual electrodes are formed on the top surface, and p-side common electrode is formed on the back surface of the substrate. This is because a plurality of devices can simultaneously transfer a larger amount of data by use of a bipolar transistor drive circuit that is operable at high speed as an anode common. This makes it possible to achieve the parallel transfer of a large amount of data.

EXAMPLE 5

Figure 6:
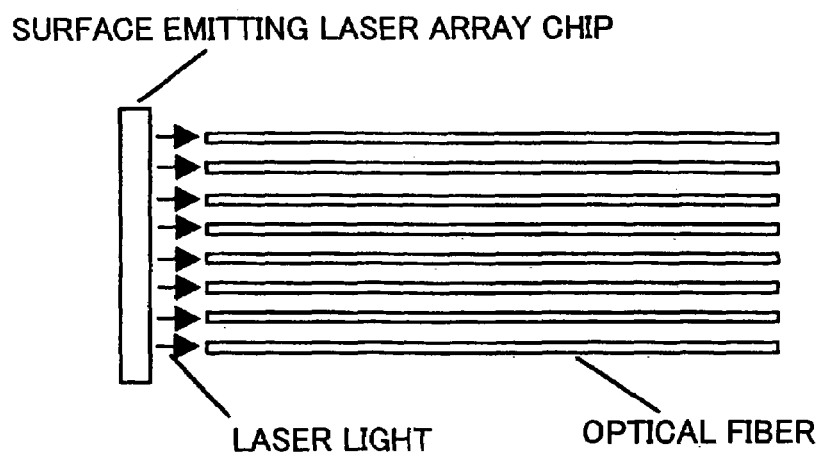
FIG. 6 is a drawing showing an optical transmission module according to a fifth example of the invention.

FIG. 6 is a drawing showing an optical transmission module according to a fifth example of the invention. The optical transmission module of the fifth example is comprised of the surface emitting laser array chip of the fourth example combined with silica fibers. In the fifth example, laser light emitted by the surface emitting laser array chip is input into the optical fibers for transmission. The optical fiber is a single mode fiber in this example. In order to transmit a large amount of data simultaneously, parallel transmission is achieved based on the use of the laser array that is comprised of a plurality of integrated semiconductor lasers. The fifth example attains high-speed parallel transmission by use of single-mode high-power surface emitting lasers, thereby providing for an increased amount of data transmission compared with a conventional art.

Furthermore, the use of the surface emitting semiconductor lasers of the invention in an optical communication system makes it possible to provide a reliable optical transmission module at low costs and also to provide a highly reliable optical communications system at low costs. The surface emitting semiconductor laser using GaInNAs has superior temperature characteristics and operates at a low threshold, thereby materializing a system that emits less heat and operates at high temperature without a cooling system.

In the fifth example, the surface emitting semiconductor lasers are provided in one-to-one correspondence with the optical fibers. Alternatively, a plurality of surface emitting semiconductor lasers having different oscillating wavelengths may be arranged in a one or two-dimensional array for wavelength-multiplexed transmission, thereby further increasing a transmission rate.

EXAMPLE 6

Figure 7:
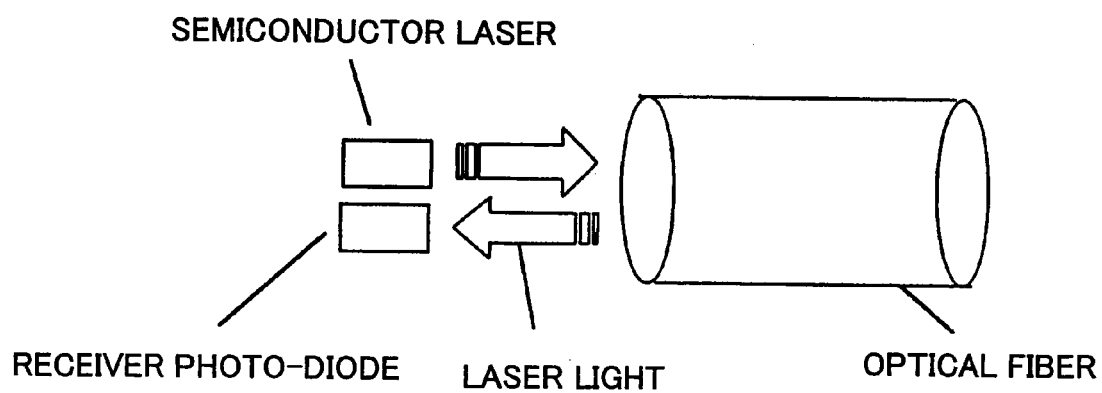
FIG. 7 is a drawing showing an optical transceiver module of a sixth example of the invention.

FIG. 7 is a drawing showing an optical transceiver module of a sixth example of the invention. The optical transceiver module of the sixth example is comprised of the surface emitting semiconductor laser of the third example, a photo-diode as a receiving end, and an optical fiber.

When the surface emitting semiconductor laser of the invention is used in an optical communication system, a highly-reliable optical communication system is provided at low costs by combining the surface emitting semiconductor laser (i.e., 1.3-micrometer-band GaInNAs surface emitting semiconductor laser), the photo-diode as a receiving end, and the optical fiber as shown in FIG. 7. Moreover, the surface emitting semiconductor laser using GaInNAs according to the invention is characterized by a satisfactory temperature characteristic, a low operating voltage, and a low threshold, thereby providing for a low cost system that emits less heat and is operable at high temperature without a cooling system.

When a fluoride-added POF (plastic fiber) incurring small loss at a long-wavelength band such as a 1.3-micrometer range is used in combination, a module can be provided at an extremely low cost. This is because the fiber is inexpensive, and also because the large fiber diameter provides for assembly costs to be reduced due to easy coupling.

The optical communication system based on the surface emitting semiconductor laser of the invention can not only be used for long-distance communication through optical fibers, but also be used for transfer between computers or the like through a LAN (local area network) or the like. It can also be used as an optical interconnection for short-distance communication between boards, between LSIs on a board, and between devices inside an LSI.

In recent years, the processing capacity of LSIs has been increasing. However, the rate of transmission between LSIs will be a bottleneck. When signal connections in a system are changed from electrical connections to optical interconnects (e.g., the optical transmission modules and the optical transceiver modules of the invention are used to connect between boards in a computer system, between LSIs on a board, and between devices inside an LSI), a super-fast computer system can be provided.

Moreover, a super-fast network system can be established by connecting a plurality of computer systems or the like through the optical transmission modules and the optical transceiver modules of the invention. Since surface emitting semiconductor lasers achieve low power consumption at different order of magnitude compared with an edge emitting laser, and are easy to be arranged in a two dimensional array, they are suitable for parallel-transmission-type optical communication systems.

As described above, the use of GaInNAs-type materials as nitrogen-added semiconductor layers makes it possible to create a multi-layer Al(Ga)As/(Al)GaAs-type semiconductor distributed Bragg reflector that has been proven for use in a 0.85-micrometer surface emitting semiconductor laser using the GaAs substrate, and also makes it possible to create a current constrictive structure through selective oxidization of AlAs. Further, the invention can achieve a high-performance surface emitting semiconductor laser having a long wavelength band such as a 1.3-micrometer band that is fit for practical use. The use of such devices also achieves an optical communication system such as an optical fiber communication system and an optical interconnection system that is provided at low costs without a need for a cooling device.

EXAMPLE 7

Figure 8:
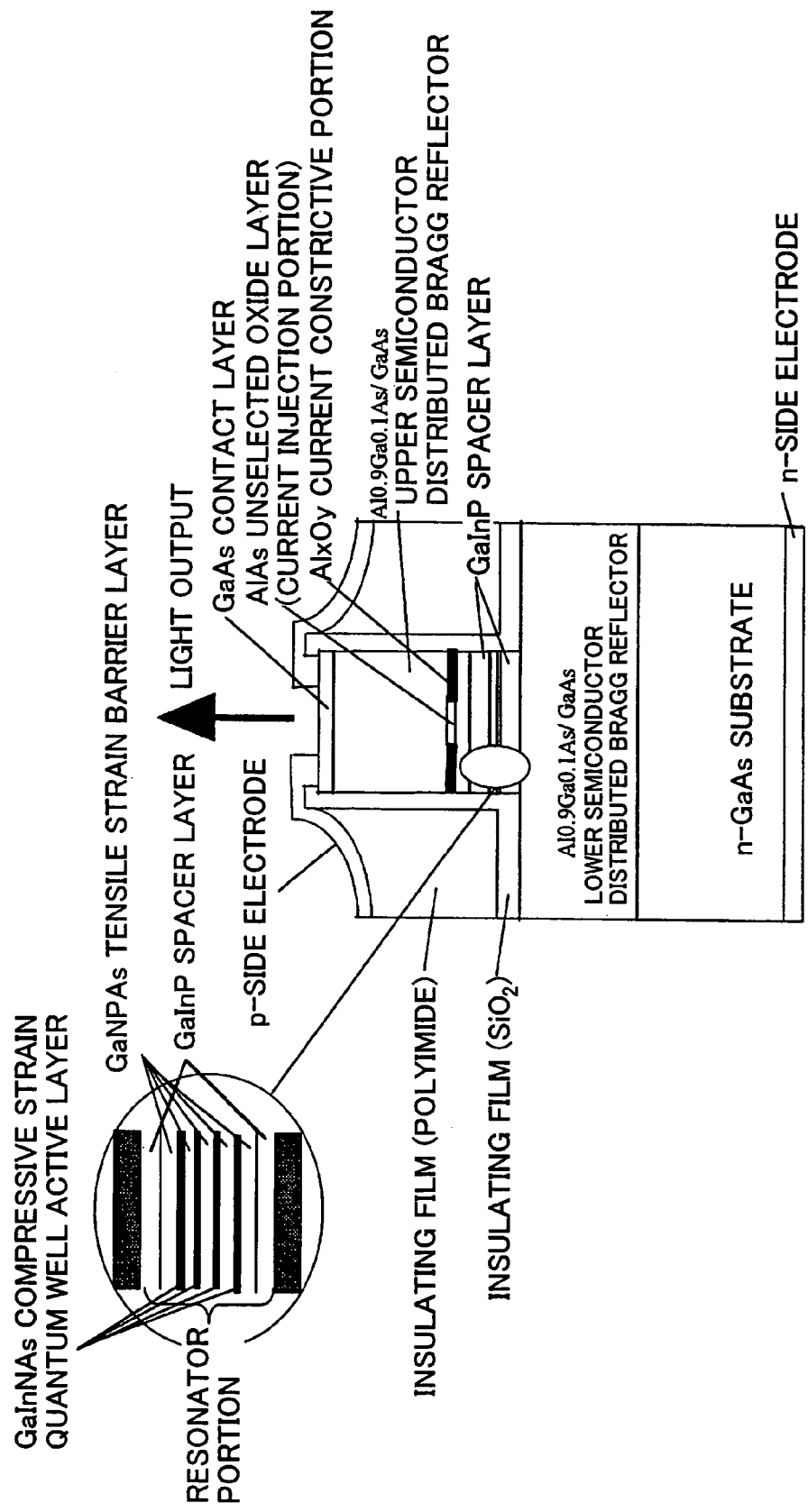
FIG. 8 is a drawing showing a GaInNAs surface emitting semiconductor laser according to a seventh example of the invention.

FIG. 8 is a drawing showing a GaInNAs surface emitting semiconductor laser according to a seventh example of the invention. The seventh example differs from the third example in that the spacer layer is formed of GaInP.

In a surface emitting laser using a GaInNAs-type materials as the active layer, GaAs is typically employed as a spacer layer, which is provided between the active layer and a reflector for the purpose of entrapping light and carriers in the active layer and also adjusting the resonator length. In this case, since the discontinuity of a conduction band is large between GaAs and the GaInNAs-type active layer, electrons can be trapped efficiently. Compared with edge emitting laser, however, a surface emitting laser requires greater carrier density for oscillation, resulting in the larger number of electrons overflowing into the spacer layer. Because of this, it is desirable to provide large discontinuity in the conduction band between the spacer layer and the quantum well active layer. In this example, GaInP having a larger band gap than GaAs was used for the spacer layer, so that the number of electrons overflowing from the quantum well active layer into the spacer layer was reduced in the surface emitting laser, thereby lowring the threshold current. Moreover, the temperature characteristic was also improved.

In this example, GaInP was used as a spacer layer. Alternatively, $Ga_xIn_{1-x}P_yAs_{1-y}$ (0<=x<=1, 0<=y<=1) and AlGaAs having a larger band gap than GaAs can also be used. Moreover, other Group-III-V materials such as Sb and N may be included.

In this example, the thickness of a resonator portion (the upper and lower spacer layers, the quantum well active layer, and the barrier layers) situated between the reflectors is $1\lambda$. Alternatively, it may be an integral multiple of $\frac{1}{2}\lambda$ such as $2\lambda$.

EXAMPLE 8

A GaInNAs surface emitting semiconductor laser according to the eighth example of this invention has the same construction as that of the seventh example shown in FIG. 8, only difference residing in the fact that at least an active layer was grown by the MBE method. In this example, an apparatus having two Ga raw material cells was provided. The cell having the largest supply quantity was used to grow the GaNPAs barrier layer, and the cell having the smallest supply quantity was used to grow the GaInNAs quantum well active layer. The control of an on/off state of each raw material cell alone was sufficient to easily make the N composition of the barrier layer smaller than that of the quantum well active layer.

Second Aspect

In the following, a second aspect of the invention will be described.

Group-III-V mixed-crystal semiconductors that contain nitrogen (N) and other Group-V elements have conventionally attracted attention as a material suitable for semiconductor light emitters. In particular, GaInNAs is able to achieve laser oscillation at the 1.3-micrometer band, which is a wavelength range having a little loss on optical fibers that are used in today's optical communication systems. This material has thus been studied extensively. GaInNAs is a mixed crystal of GaAsN and GaInAs. Since its conduction band level has a large bowing parameter in dependency on the N composition, GaInNAs with an added compressive strain can form a type-I heterojunction in combination with GaAs.

In the quantum well active layer comprised of GaInNAs and GaAs, the band gap discontinuity of a conduction band is large, making the overflowing of carriers less likely, which provides a semiconductor light emitter having satisfactory temperature characteristics. Moreover, GaInNAs is used with an added compressive strain, and is thus suitable for the purpose of reducing a threshold current and increasing an oscillating wavelength.

Since GaInNAs has a strain as described above, defects such as dislocation are likely to occur due to lattice relaxation or the like. It is thus difficult to obtain high-quality active layers. Even if defects are rare at an incipient stage, defects multiply due to a strain, resulting in the deterioration of characteristics with time.

As a countermeasure to obviate such problems, a strain-compensated layer has recently been used to compensate for a total strain near the active layer by providing, in the proximity of the active layer, a crystal layer having a strain opposite the strain of the active layer.

In GaInNAs, GaAsP and GaAsN are used as a strain-compensated layer having a tensile strain opposite the active layer. When a strain-compensated layer is provided alongside the active layer, a strain-compensated layer using GaAsP and GaAsN gives rise to problems as follows.

Figure 9:
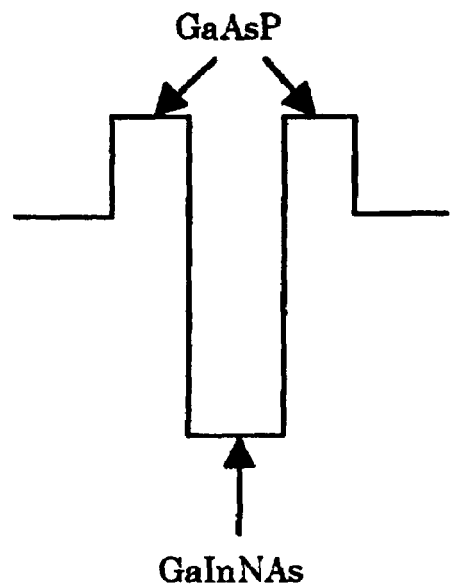
FIG. 9 is an illustrative drawing showing a rise of a quantum level.

As was reported in Appl. Phys. Lett., 78, 91 (2001), when a strain-compensated layer using only GaAsP is provided alongside the active layer, GaAsP has a conduction band higher than that of GaAs, so that the band-gap discontinuity of the conduction band increases. As a result, the quantum level rises, thereby making the oscillating wavelength shorter (see FIG. 9). In order to obtain the same light emission wavelength as the quantum well active layer made in combination with GaAs, it is necessary to increase the strain of GaInNAs active layer and/or to increase the composition of nitrogen (N). However, increasing the strain of the active layer is not desirable as it causes lattice relaxation or the like. Increasing the nitrogen composition is not desirable either because such an increase makes it difficult to grow satisfactory crystal due to an increase of immiscibility.

Figure 10:
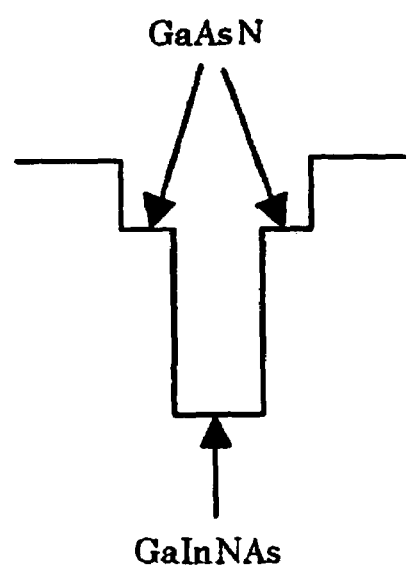
FIG. 10 is an illustrative drawing showing small discontinuity in a conduction band gap.

Moreover, if the strain-compensated layer made only of GaAsN is provided adjacent to an active layer, GaAsN has a lower conduction band than GaAs, resulting in small discontinuity in the conduction band gap. This deteriorates the temperature characteristics of the semiconductor light emitter (see FIG. 10). Although the lowering of N composition is necessary in order to avoid the decreased discontinuity of a conduction band, such lowering causes a decrease in the tensile strain, thereby undermining the effect of strain compensation.

Accordingly, there is a need for a semiconductor light emitter, an optical transmission module, and an optical communication system, in which a semiconductor light emitter uses a mixed-crystal semiconductor containing nitrogen (N) and other Group-V elements with an increased effect of strain compensation while avoiding the shortening of an emission wavelength.

In the following, embodiments of the invention (second aspect) will be described with reference to the accompanying drawings.

(First Embodiment)

The semiconductor light emitter of the first embodiment has an active region that includes a quantum well active layer made of a mixed-crystal semiconductor where the mixed-crystal semiconductor contains nitrogen (N) and other. Group-V elements with a compressive strain, and is grown on a GaAs substrate. In the active region, a strain-compensated layer having a multi-layer structure is provided alongside the quantum well active layer, and includes a first layer inclusive of nitrogen (N) and having a lower conduction band than GaAs and a second layer with a tensile strain inclusive of phosphorus (P) and having a higher conduction band than GaAs, where the first layer is situated closer to the quantum well active layer than the second layer.

In the semiconductor light emitter according to this embodiment, the active region includes the quantum well active layer made of a mixed-crystal semiconductor that contains nitrogen (N) and other Group-V elements with a compressive strain, and is grown on the GaAs substrate. In the active region, the strain-compensated layer having a multi-layer structure is provided alongside the quantum well active layer, and includes the first layer inclusive of nitrogen (N) and having a lower conduction band than GaAs and the second layer with a tensile strain inclusive of phosphorus (P) and having a higher conduction band than GaAs, where the first layer is situated closer to the quantum well active layer than the second layer. This achieves a sufficient strain compensation effect, and provides a high-quality, highly reliable semiconductor light emitter in which the shortening of an emission wavelength caused by an increase in the level of quantum wells is prevented.

(Second Embodiment)

The semiconductor light emitter of the second embodiment has an active region that includes a multiple quantum well active layer made of a mixed-crystal semiconductor where the mixed-crystal semiconductor contains nitrogen (N) and other Group-V elements with a compressive strain, and is grown on a GaAs substrate. In the active region, a strain-compensated layer having a multi-layer structure is provided alongside each quantum well active layer, and includes a first layer inclusive of nitrogen (N) and having a lower conduction band than GaAs and a second layer with a tensile strain inclusive of phosphorus (P) and having a higher conduction band than GaAs, where the first layer is situated closer to the quantum well active layer than the second layer.

In the semiconductor light emitter according to this embodiment, the active region includes the multiple quantum well active layer made of a mixed-crystal semiconductor that contains nitrogen (N) and other Group-V elements with a compressive strain, and is grown on the GaAs substrate. In the active region, the strain-compensated layer having a multi-layer structure is provided alongside each quantum well active layer, and includes the first layer inclusive of nitrogen (N) and having a lower conduction band than GaAs and the second layer with a tensile strain inclusive of phosphorus (P) and having a higher conduction band than GaAs, where the first layer is situated closer to the quantum well active layer than the second layer. This achieves a sufficient strain compensation effect, and provides a high-quality, highly reliable semiconductor light emitter having a multiple quantum well active layer, in which the shortening of an emission wavelength caused by an increase in the level of quantum wells is prevented.

(Third Embodiment)

In the third embodiment of the invention, the layer inclusive of nitrogen (N) and having a lower conduction band than GaAs in the semiconductor light emitter of the first or second embodiment has a tensile strain relative to GaAs.

Since the layer inclusive of nitrogen (N) and having a lower conduction band than GaAs in the semiconductor light emitter of the first or second embodiment has a tensile strain relative to GaAs in the third embodiment of the invention, strain compensation is provided more efficiently.

(Fourth Embodiment)

The semiconductor light emitter of the fourth embodiment has an active region that includes a multiple quantum well active layer made of a mixed-crystal semiconductor where the mixed-crystal semiconductor contains nitrogen (N) and other Group-V elements with a compressive strain, and is grown on a GaAs substrate. In the active region, a strain-compensated layer having a multi-layer structure is provided alongside each quantum well active layer, and includes a first layer inclusive of nitrogen (N) and having a lower conduction band than GaAs and a second layer with a tensile strain inclusive of phosphorus (P) and having a higher conduction band than GaAs, where the first layer is situated closer to the quantum well active layer than the second layer. Also, a barrier layer between the quantum well active layers contains phosphorus (P) or nitrogen (N), and has a tensile strain.

In the semiconductor light emitter according to this embodiment, the active region includes the multiple quantum well active layer made of a mixed-crystal semiconductor that contains nitrogen (N) and other Group-V elements with a compressive strain, and is grown on the GaAs substrate. In the active region, the strain-compensated layer having a multi-layer structure is provided alongside each quantum well active layer, and includes the first layer inclusive of nitrogen (N) and having a lower conduction band than GaAs and the second layer with a tensile strain inclusive of phosphorus (P) and having a higher conduction band than GaAs, where the first layer is situated closer to the quantum well active layer than the second layer. Also, the barrier layer situated between the quantum well active layers contains phosphorus (P) or nitrogen (N), and has a tensile strain. With this provision, even if it is not desirable to thicken the barrier layer between the quantum well active layers, strain compensation can effectively be provided. Further, this provision achieves a sufficient strain compensation effect, and provides a high-quality, highly reliable semiconductor light emitter, in which the shortening of an emission wavelength caused by an increase in the level of quantum wells is prevented.

(Fifth Embodiment)

A semiconductor light emitter of the fifth embodiment of this invention differs from the semiconductor light emitter of the 4th embodiment in that the strain-compensated layer having a multi-layer structure includes the first layer inclusive of nitrogen (N) and having a lower conduction band than GaAs and the second layer with a tensile strain inclusive of phosphorus (P) and having a higher conduction band than GaAs, and the tensile strain of the second layer inclusive of phosphorus (P) and having a higher conduction band than GaAs is larger than the strain of a barrier layer situated between the quantum well active layer.

In the fifth embodiment of the invention, the strain-compensated layer having a multi-layer structure includes the first layer inclusive of nitrogen (N) and having a lower conduction band than GaAs and the second layer with a tensile strain inclusive of phosphorus (P) and having a higher conduction band than GaAs, and the tensile strain of the second layer inclusive of phosphorus (P) and having a higher conduction band than GaAs is larger than the strain of a barrier layer situated between the quantum well active layer. With this provision, a sufficient strain compensation effect is achieved while avoiding lattice relaxation by use of the tensile strain layer inclusive of phosphorous (P) and having a higher conduction band than GaAs even when there is a need for thickening of the barrier layer between the quantum well active layers. This provision achieves a sufficient strain compensation effect, and provides a high-quality, highly reliable semiconductor light emitter, in which the shortening of an emission wavelength caused by an increase in the level of quantum wells is prevented.

(Sixth Embodiment)

The sixth embodiment of the invention differs from the first through fifth embodiments in that an incremental-composition layer having a continuously changing strain is provided in the multi-layer structure, which includes the first layer inclusive of nitrogen (N) and having a lower conduction band than GaAs and the second layer with a tensile strain inclusive of phosphorus (P) and having a higher conduction band than GaAs.

In the sixth embodiment of the invention, the incremental-composition layer having a continuously changing strain is provided in the multi-layer structure, which includes the first layer inclusive of nitrogen (N) and having a lower conduction band than GaAs and the second layer with a tensile strain inclusive of phosphorus (P) and having a higher conduction band than GaAs in the first through fifth embodiments. With the provision of the incremental-composition layer between the layers having large strain variation, the field of strains near the active layer is reduced, thereby providing a highly reliable semiconductor light emitter.

(Seventh Embodiment)

The seventh embodiment of the invention differs from the first through fifth embodiments in that a GaAsP layer is used as the layer with the tensile strain inclusive of phosphorus (P) and having a higher conduction band than GaAs, and a GaAsN layer is used as the layer inclusive of nitrogen (N) and having a lower conduction band than GaAs, with the composition of GaAsP of the GaAsP layer being set to $GaAs_{(1-x)}P_x$ (0<x<=0.2), and the thickness of GaAsN adjoining the quantum well active layer being 1 nm or more.

In the seventh embodiment, the GaAsP layer is used as the layer with the tensile strain inclusive of phosphorus (P) and having a higher conduction band than GaAs, and the GaAsN layer is used as the layer inclusive of nitrogen (N) and having a lower conduction band than GaAs, with the composition of GaAsP of the GaAsP layer being set to GaAs (1−x)Px (0<x<=0.2), and the thickness of GaAsN adjoining the quantum well active layer being 1 nm or more. With this provision, a sufficient thickness is achieved for GaAsN within the range of the GaAsP composition as identified above, such that the shortening of an emission wavelength caused by the increase of a quantum well level is prevented.

(Eighth Embodiment)

According to the eighth embodiment of the invention, the semiconductor light emitter of the first through seventh embodiments is a surface emitting semiconductor laser.

In the eight embodiment, the semiconductor light emitter of the first through seventh embodiments is a surface emitting semiconductor laser, thereby providing a sufficient strain compensation effect. This also prevents the shortening of an emitted wavelength caused by an increase in the quantum well level, the deterioration of crystalline quality that is likely to be caused by growth on a thick multi-layer semiconductor reflector, and the deterioration of surface morphology that is likely to be caused by growing a thick multi-layer semiconductor reflector on the active layer. A high-quality, and highly reliable surface emitting semiconductor laser is thus obtained.

(Ninth Embodiment)

According to the ninth embodiment of the invention, an optical transmission module is provided, in which the semiconductor light emitter of the eighth embodiment is employed as a light source for optical transmission.

The ninth embodiment of the invention is directed to the optical transmission module in which the semiconductor light emitter of the eighth embodiment is employed as a light source for optical transmission, and provides a high-quality, highly reliable optical transmission module by use of the high-performance surface emitting semiconductor laser for long-wavelength optical communication.

(Tenth Embodiment)

According to the tenth embodiment of the invention, an optical communication system is provided that employs the optical transmission module of the ninth embodiment.

Since the tenth embodiment of the invention is directed to the optical communication system that employs the optical transmission module of the ninth embodiment, a high-quality, highly reliable optical communication system is achieved.

In the following, examples of the invention will be described with accompanying drawings.

EXAMPLE 1

Figure 11:
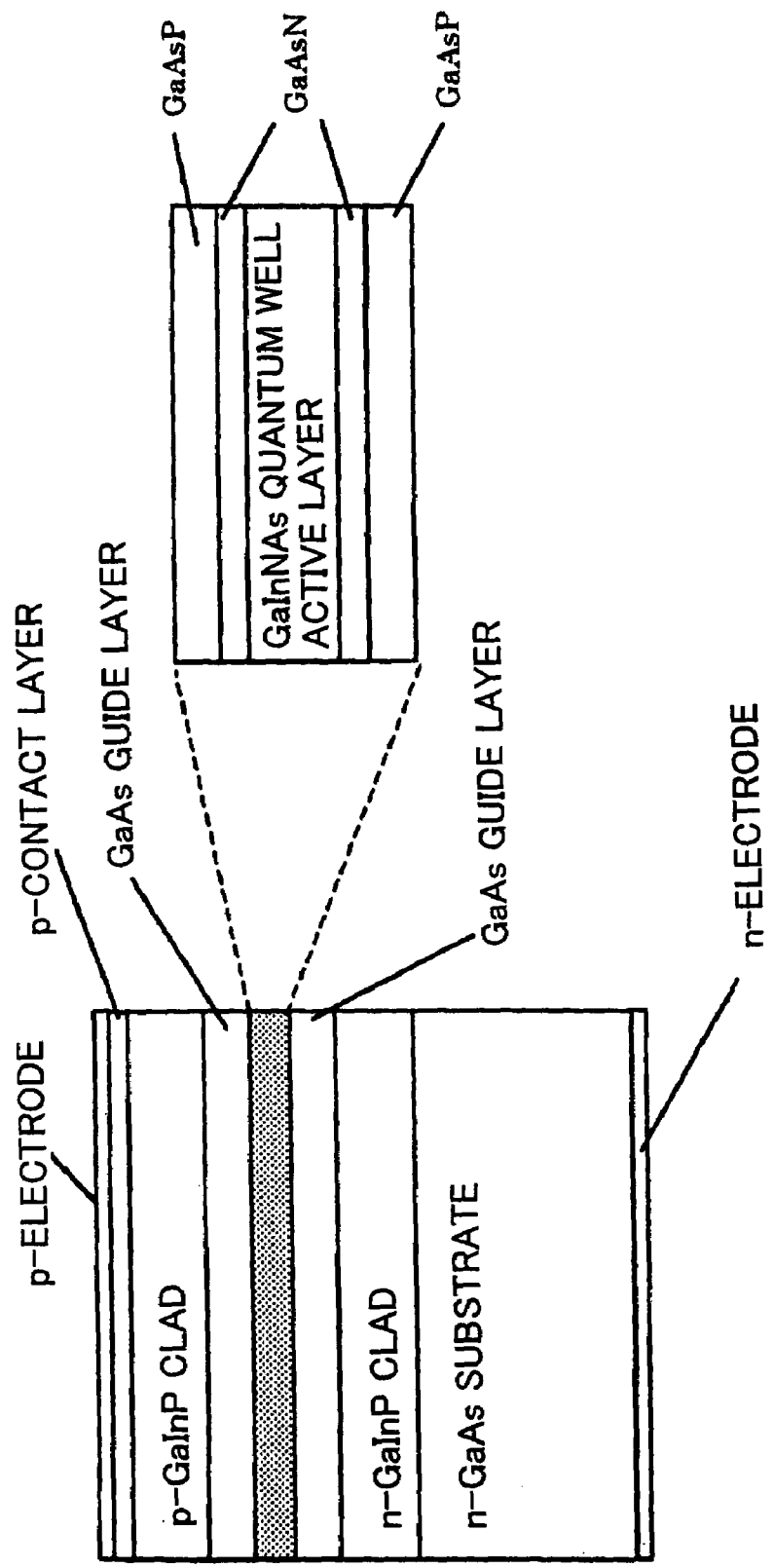
FIG. 11 is a drawing showing a semiconductor light emitter of a first example.

An first example corresponds to the first, third, and seventh embodiments described above. FIG. 11 is a drawing showing a semiconductor light emitter of the first example. The semiconductor light emitter of FIG. 11 is an edge emitting semiconductor laser having a single quantum well structure. An n-GaInP clad layer (2 micrometers in thickness), a GaAs guide layer (0.1 micrometers in thickness), an active region having a strain-compensated structure (i.e., active region including a GaInNAs quantum well active layer), a GaAs guide layer (0.1 micrometers in thickness), a p-GaInP clad layer (2 micrometers in thickness), and a p-contact layer (0.1 micrometers in thickness) are formed on an n-GaAs substrate. The back surface of the substrate and the p-contact layer are provided with respective electrodes (n-electrodes and p-electrodes).

In the first example, the active region (i.e., the active region containing a GaInNAs quantum well active layer) having a strain-compensated structure includes a $GaAs_{0.8}P_{0.2}$ layer (10 nm in thickness), a $GaAs_{0.987}N_{0.013}$ layer (1 nm in thickness), a $Ga_{0.7}In_{0.3}N_{0.01}As_{0.99}$ quantum well active layer (8 nm in thickness), a $GaAs_{0.987}N_{0.013}$ layer (1 nm in thickness), and a $GaAs_{0.8}P_{0.2}$ layer (10 nm in thickness) arranged in this order from the bottom to the top. With this composition, a strain relative to GaAs is −0.71% in GaAsP, −0.26% in GaAsN, and +1.9% in GaInNAs.

The laser structure of FIG. 11 may be made by epitaxial growth based on the Metal-Organic Chemical Vapor Deposition method (the MOCVD method), for example. In this case, TMG (trimethyl gallium) and TMI (trimethyl indium) may be used as the metal organic compounds of Group-III raw materials, and AsH3, PH3, and dimethyl hydrazine (DMHy) can be used as Group-V raw materials. Moreover, H2Se may be used as an n-type dopant, and dimethyl zinc (DMZn) may be used as a p-type dopant. These raw materials are guided by H2 carrier gas into a reaction chamber that is kept under a predetermined pressure (for example, 100 torr), and are dissolved by heat on a substrate, thereby forming semiconductor crystal on the substrate through epitaxial growth. In the first example, the edge emitting laser having the structure shown in FIG. 11 was grown by the MOCVD method. Alternatively, other methods such as the MBE method or the like may be used in the invention to form the same structure.

Figure 12:
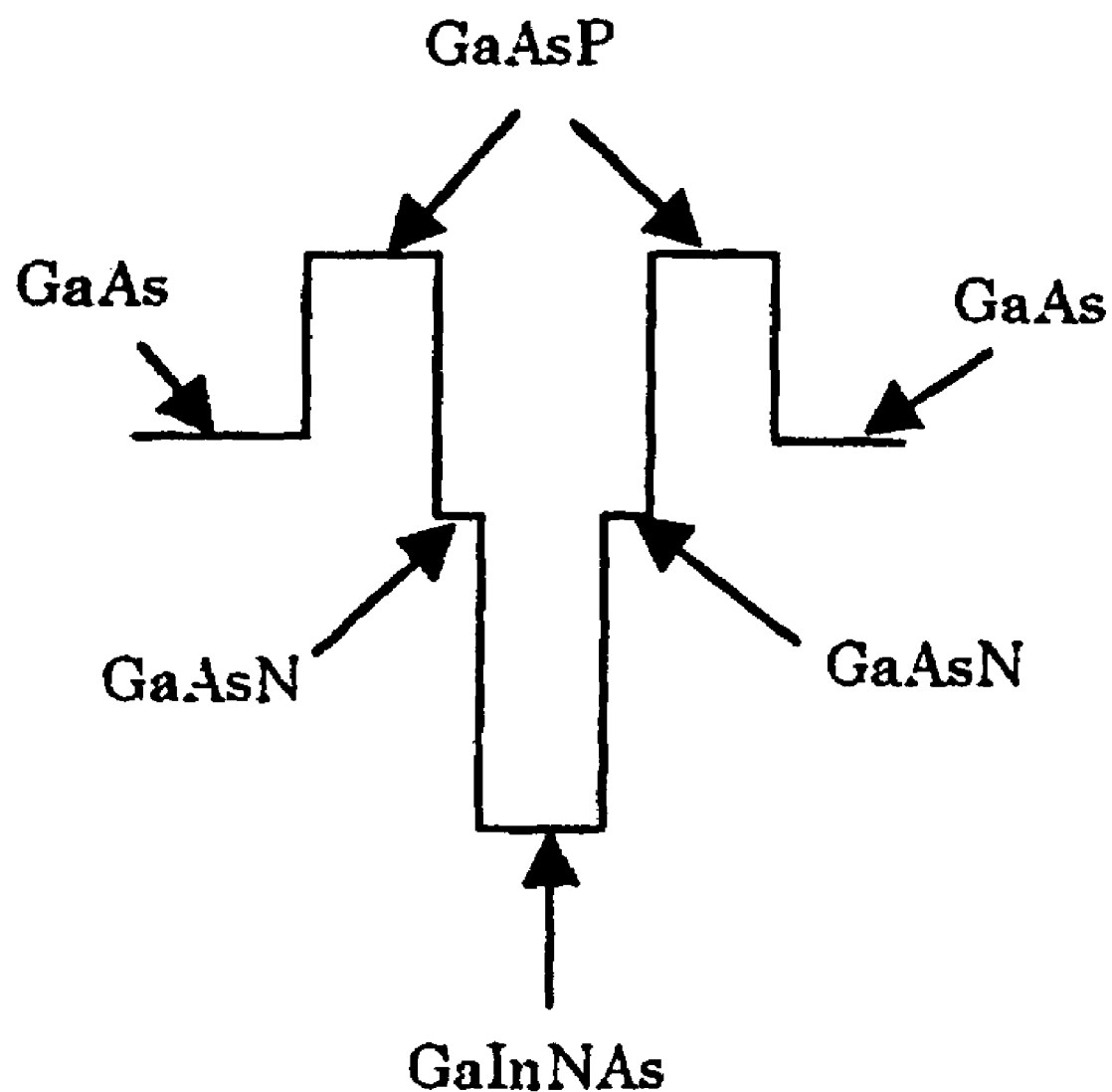
FIG. 12 is an illustrative drawing showing a structure of a conduction band.

With the composition of the active layer which grew as mentioned above, the conduction band will take a structure as shown in FIG. 12. In such a band structure, the quantum level of wells varies, depending on the N composition and thickness of a GaAsN layer situated between the GaInNAs quantum well active layer and the GaAsP strain-compensated layer. Shown in FIG. 13 is the changes of the quantum level calculated as the thickness of the GaAsN layer is changed, with the composition of GaAsP being $GaAs_{(1-x)}P_x$ (x=0.2), and the thickness of the GaInNAs layer being 8 nm.

Figure 13:
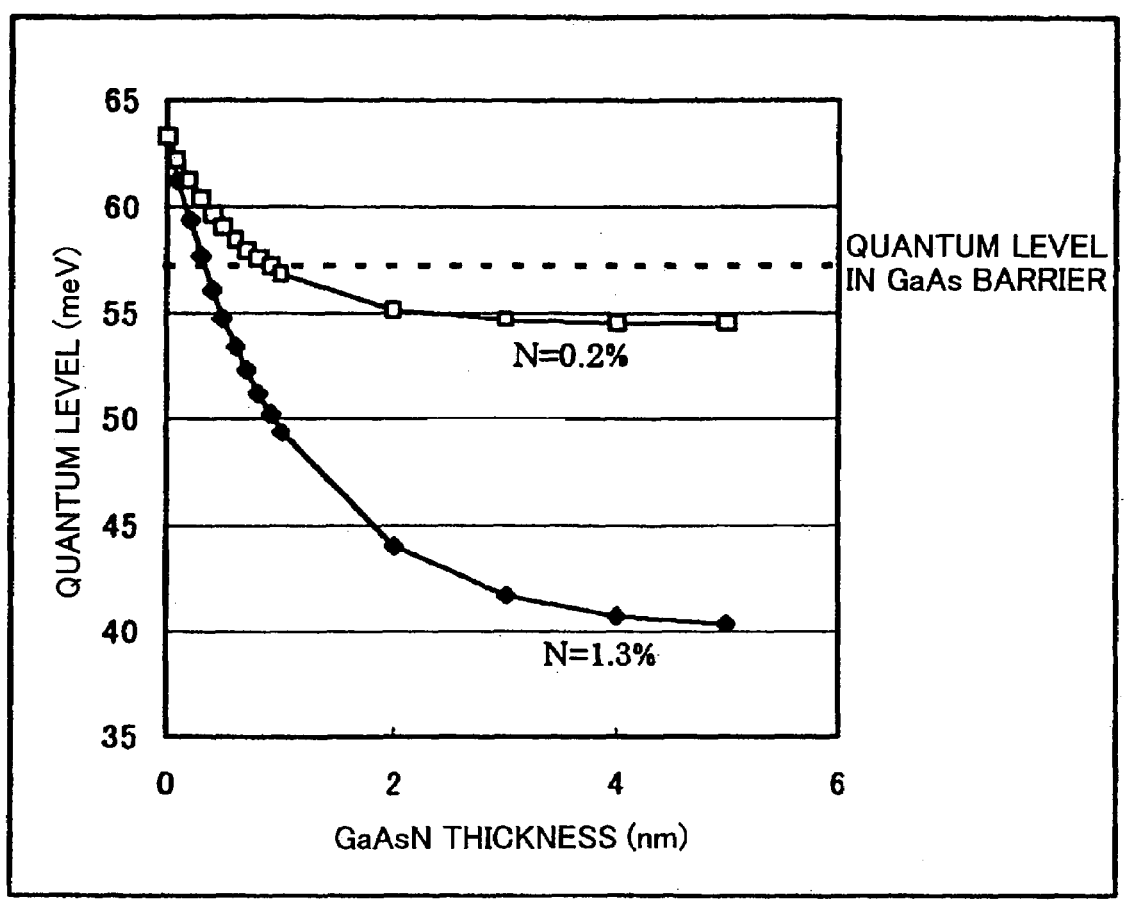
FIG. 13 is a diagram showing changes in a quantum level calculated as the thickness of a GaAsN layer is changed.

As can be seen in FIG. 13, the emitted wavelength of the laser shifts to a shorter wavelength in response to a rise in the quantum level, and the value corresponding to a thickness of 0 nm of the GaAsN layer is a quantum level of a structure having GaInNAs and GaAsP adjoining together. In order to lengthen a wavelength in GaInNAs, there is a need to either increase the In composition for the purpose of increasing a strain or increase the N composition. An increase in a strain, however, is likely to cause lattice relaxation, resulting in defects such as dislocation. Moreover, an increase in N composition makes it difficult to obtain high-quality crystal due to immiscibility, resulting in difficulties in growing crystals. In this manner, there is a limit to the elongation of a wavelength with respect to the GaInNAs crystal itself because the shortening of a wavelength ensues.

There is a lot of merits in terms of crystal growth when a shift to a shorter wavelength is controlled by providing GaAsN between the GaAsP strain-compensated layer and the GaInNAs quantum well active layer as in this invention. Since GaAsN has a low conduction band than GaAs, it can suppress the shortening of a wavelength by use of a relatively thin layer. Furthermore, since GaAsN has a tensile strain relative to GaAs, an effect of tensile compensation can also be expected. As can be seen in FIG. 13, with the 1.3% N composition, the quantum level goes below the level of the GaAs/GaInNAs quantum well structure when a thickness is greater than about 0.4 nm, thereby suppressing a shift to a shorter wavelength. Even if the N composition is as low as 0.2%, a thickness around 1 nm is sufficient to suppress a shift to a shorter wavelength. In this manner, a strain-compensated structure combining GaAsP and GaAsN can produce a sufficient thickness for GaAsN that suppresses a shift to a shorter wavelength within a thickness range between 0.4 nm and 1 nm for GaAsN of $GaAs_{1-y}N_y$ ($0.002 \leq y \leq 0.013$) relative to GaAsP of $GaAs_{(1-x)}P_x$ (x=0.2). That is, with the composition in combination with GaAsP of $GaAs_{(1-x)}P_x$ ($0 < x \leq 0.2$), a thickness of at least 1 nm can suppress a shift to a shorter wavelength even in GaAsN, which is easy to crystallize, and has a relatively low N composition. Moreover, an increase in the N composition of GaAsN will result in carrier overflow being likely to occur because of decreased discontinuity of band gap. The fact that GaAsN having a low N composition can be used is thus desirable.

The effect of strain compensation in the first example is as follows. In the absence of strain compensation, an active layer having a 1.9% compressive strain is 8-nm thick. In the first example, a combined effect of strain compensation of each of GaAsP and GaAsN provides an average strain less than 0.02% in the entirety of the active layer, thereby achieving sufficient strain reduction. Although this first example uses GaAsN to produces a strain compensation effect, the invention is not limited to the use of GaAsN. If a GaAsP layer alone can produces a sufficient strain compensation effect, a material having a conduction band higher than that of GaAs and lower than that of the quantum well layer through the inclusion of N (e.g., GaAsNSb, GaInNAs (different composition than the well active layer), GaInNAsSb, etc.) may be used to suppress a shift to a shorter wavelength, without the use of a tensile strain material such as GaAsN. If such material has a tensile strain, the effect of strain compensation is additionally provided.

Although the first example has been described with reference to the case of GaAsP, the invention is not limited to the use of GaAsP. A layer may include a minute amount of N added to GaAsP or a minute amount of Sb added to GaAsP, and has a higher conduction band than GaAs through the inclusion of P. Such a layer may be used to suppress a shift to a shorter wavelength.

Moreover, although GaInNAs has been used as a material for an active layer in the above example, the active layer material is not limited to GaInNAs. For example, mixed-crystal semiconductors containing nitrogen (N) and other Group-V elements such as GaInNAsP, GaInNSb, GaInNAsSb, and the like may be used as a material having a compressive strain for a semiconductor light emitter. The invention is applicable to these materials.

Figure 14:
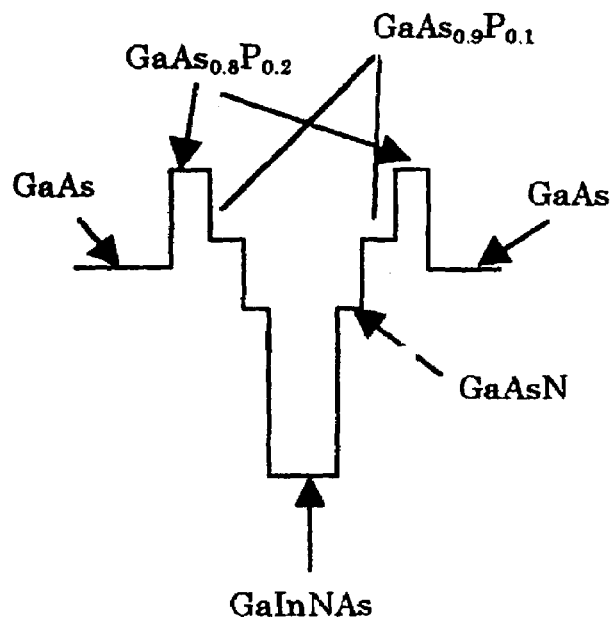
FIG. 14 is an illustrative drawing showing GaAsP provided as two layers of varying compositions that have higher conduction band than GaAs.
Figure 15:
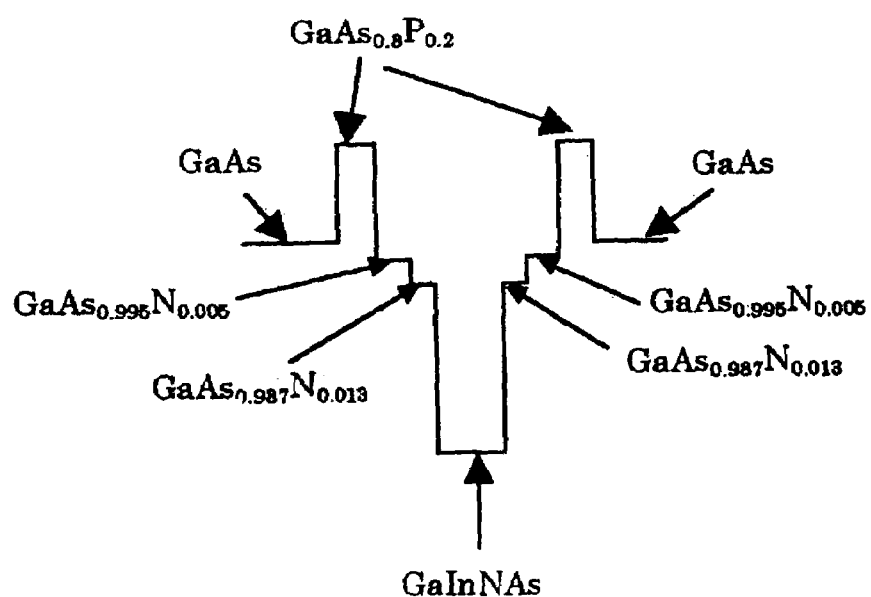
FIG. 15 is an illustrative drawing showing two layers that have a lower conduction band than GaAs and include nitrogen (N)

Moreover, although this first example shows a construction that includes one layer of GaAsN combined with one layer of GaAsP, the invention is not limited to such a one-layer structure. As shown in FIG. 14, GaAsP may be provided as two layers of varying compositions that have higher conduction band than GaAs, and include phosphorus (P) with a tensile strain. Moreover, two layers that have a lower conduction band than GaAs and include nitrogen (N) may be provided as shown in FIG. 15. What is necessary here is to provide a phosphorous-added layer with a tensile strain having a conduction band higher than GaAs in combination with a nitrogen-added layer having a lower conduction band than GaAs within a range that suppresses a shift to a shorter wavelength. Accordingly, these layers each can be multiple layers.

In the edge emitting semiconductor laser according to the first example described above, a strain-compensated structure comprised of the two layers of GaAsP/GaAsN adjoins the GaInNAs quantum well active layer, thereby providing a sufficient strain compensation effect, and also successfully suppressing a shift to a short wavelength caused by the increased level of a quantum well. This provides for a high-quality, highly reliable semiconductor light emitter.

EXAMPLE 2

Figure 16:
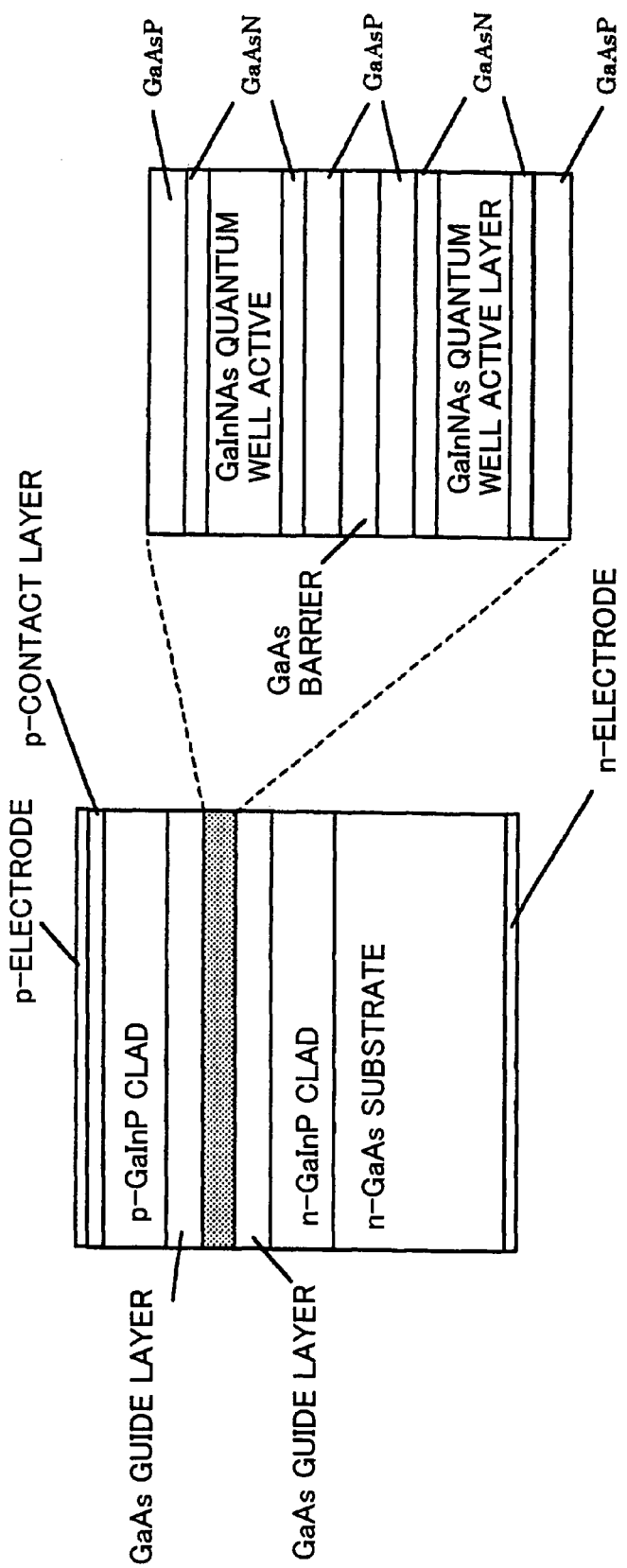
FIG. 16 is a drawing showing a semiconductor light emitter according to a second example.
Figure 17:
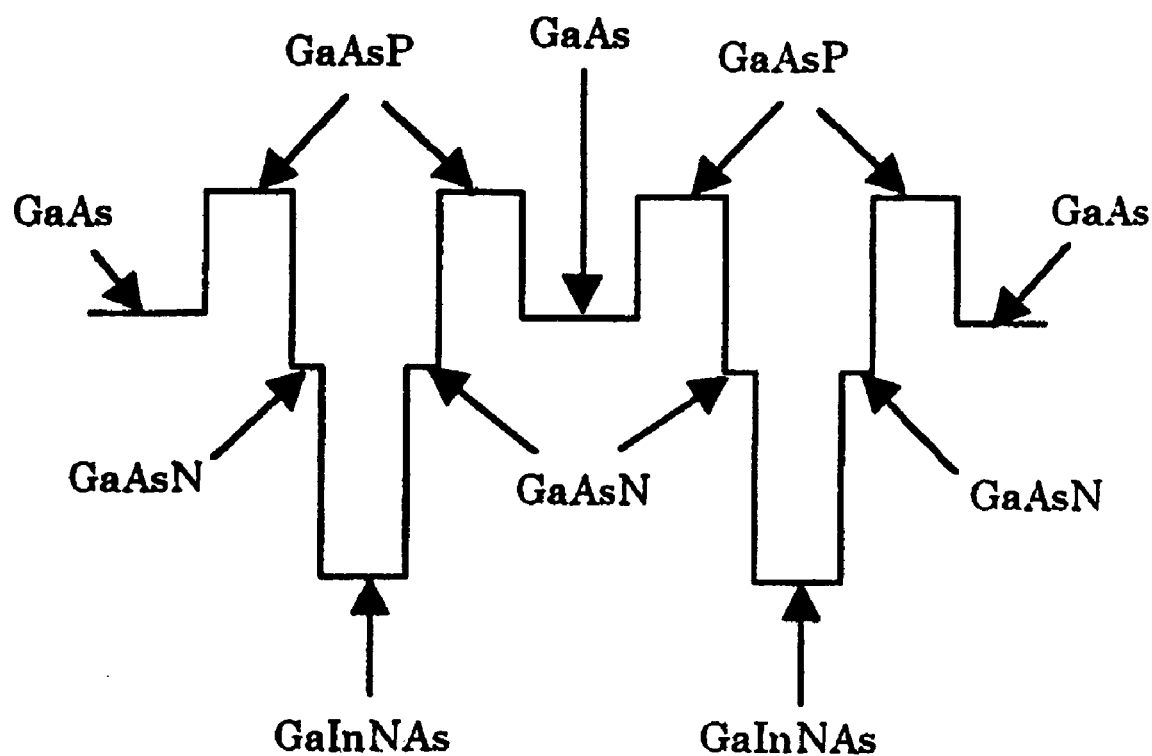
FIG. 17 is an illustrative drawing showing a conduction band.

A second example corresponds to the second embodiment. FIG. 16 is a drawing showing a semiconductor light emitter according to the second example. The basic construction of the semiconductor light emitter of FIG. 16 is the same as that of the semiconductor light emitter of the first example, only difference being that the active layer has a multi-layer quantum well structure (i.e., the DQW structure in this second example). The thickness and composition of the quantum well active layer as well as the strain-compensated structure sandwiching the active layer are identical to those of the first example. GaAs is grown to a thickness of 5 nm as a barrier layer between the GaAsP layers. The conduction band of such a structure is shown in FIG. 17. In a multiple quantum well structure, the absence of strain compensation will result in a larger strain than in a single quantum well structure because of the multiplicity of quantum wells having large strains. This causes defects, and creates reliability problems. The application of the invention to a multiple quantum well structure thus produces a significant advantage. That is, the strain-compensated structure of the invention is provided to compensate for strains, thereby achieving high quality and sufficient reliability, and also makes it possible to provide a semiconductor light emitter having a multiple quantum well structure that suppresses a shift to a shorter wavelength by use of a layer with a tensile strain inclusive of phosphorus (P) and having a conduction band higher than GaAs.

EXAMPLE 3

Figure 18:
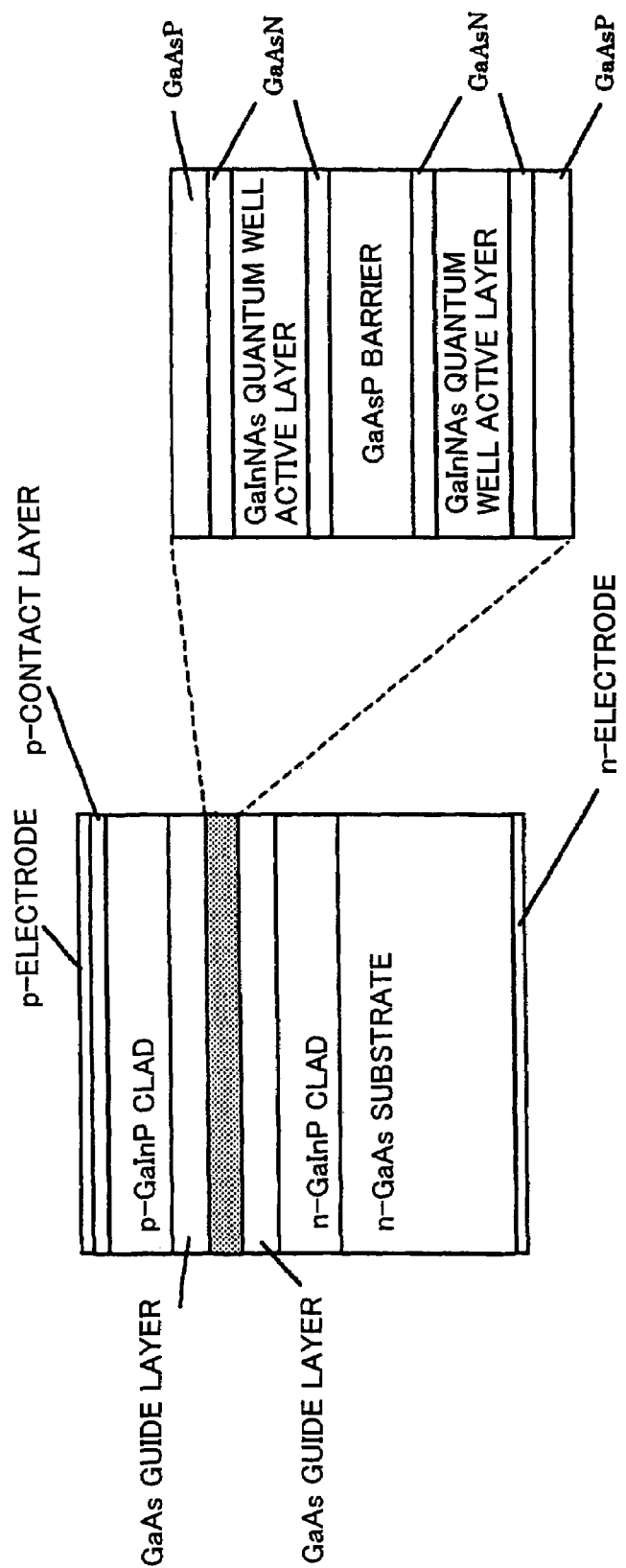
FIG. 18 is a drawing showing a semiconductor light emitter of a third example.
Figure 19:
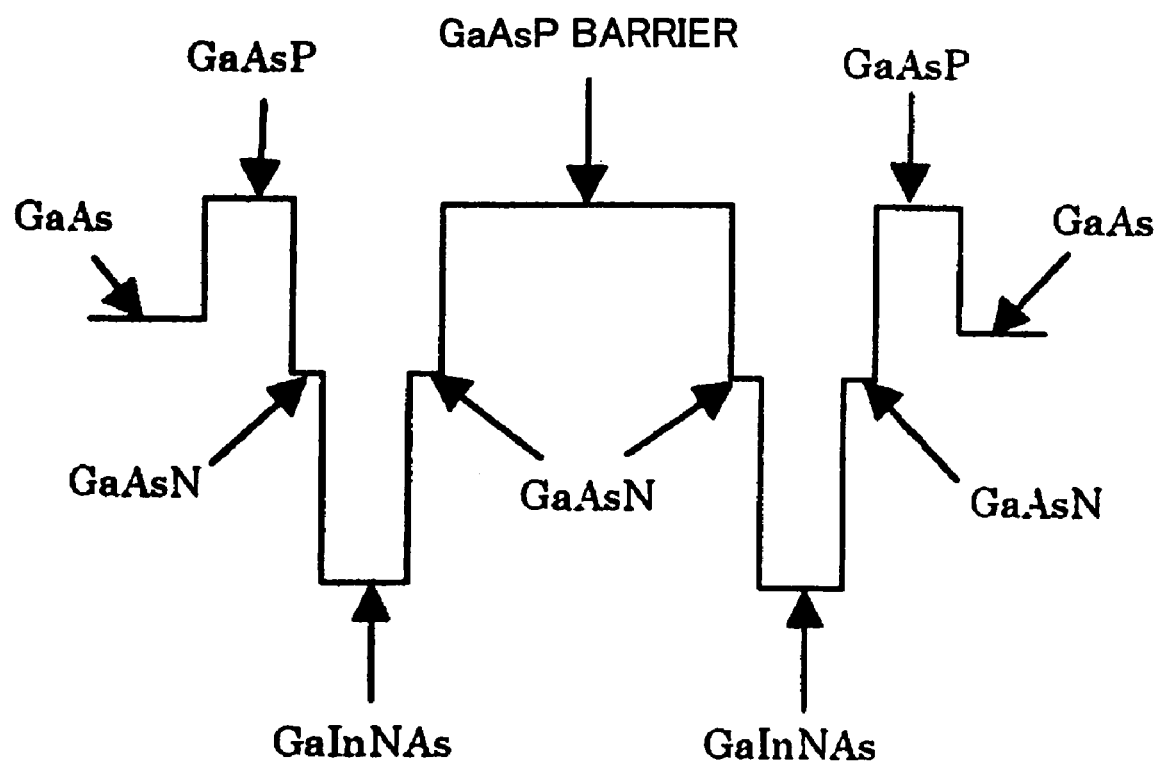
FIG. 19 is an illustrative drawing showing a conduction band.

A third example corresponds to the fourth embodiment. FIG. 18 is a drawing showing a semiconductor light emitter of the third example. The basic construction of the semiconductor light emitter of FIG. 18 is the same as that of the semiconductor light emitter of the second example, only difference being that the barrier layer of the multiple quantum well structure is changed from GaAs to GaAsP. The conduction band of such a structure is shown in FIG. 19. The advantage of this structure resides in the superior characteristics of strain compensation, which are realized by thickening a tensile strain layer compared with the case of a GaAs barrier layer. If it is not desirable to thicken the barrier layer between GaInNAs quantum well active layers, the thickness of the GaAsP layer should be decreased in response to the insertion of a GaAs barrier layer. In such a case, the use of a GaAsP barrier layer in place of a GaAs barrier layer is suitable for the purpose of strain compensation. Of course, the GaAsP layer is acceptable if its tensile strain and thickness is not such a combination as to cause lattice relaxation. Although GaAsP is used as a barrier layer in the third example, the barrier layer is not limited to GaAsP. A tensile strain layer such as GaAsPSb, GaAsNSb, GaAsNP, etc., serves to provide strain compensation relative to GaAs, thereby serving a purpose.

In this manner, a barrier layer having a tensile strain through the inclusion of phosphorus (P) or nitrogen (N) is provided as a strain-compensated layer in a multiple quantum well structure. With this provision, sufficient strain compensation is achieved even if it is not desirable to thicken the barrier layer between the quantum well active layers. This provides for a high-quality, highly reliable semiconductor light emitter that provides a sufficient strain compensation effect, and suppresses a shift to a shorter emission wavelength caused by the increased level of quantum wells.

EXAMPLE 4

Figure 20:
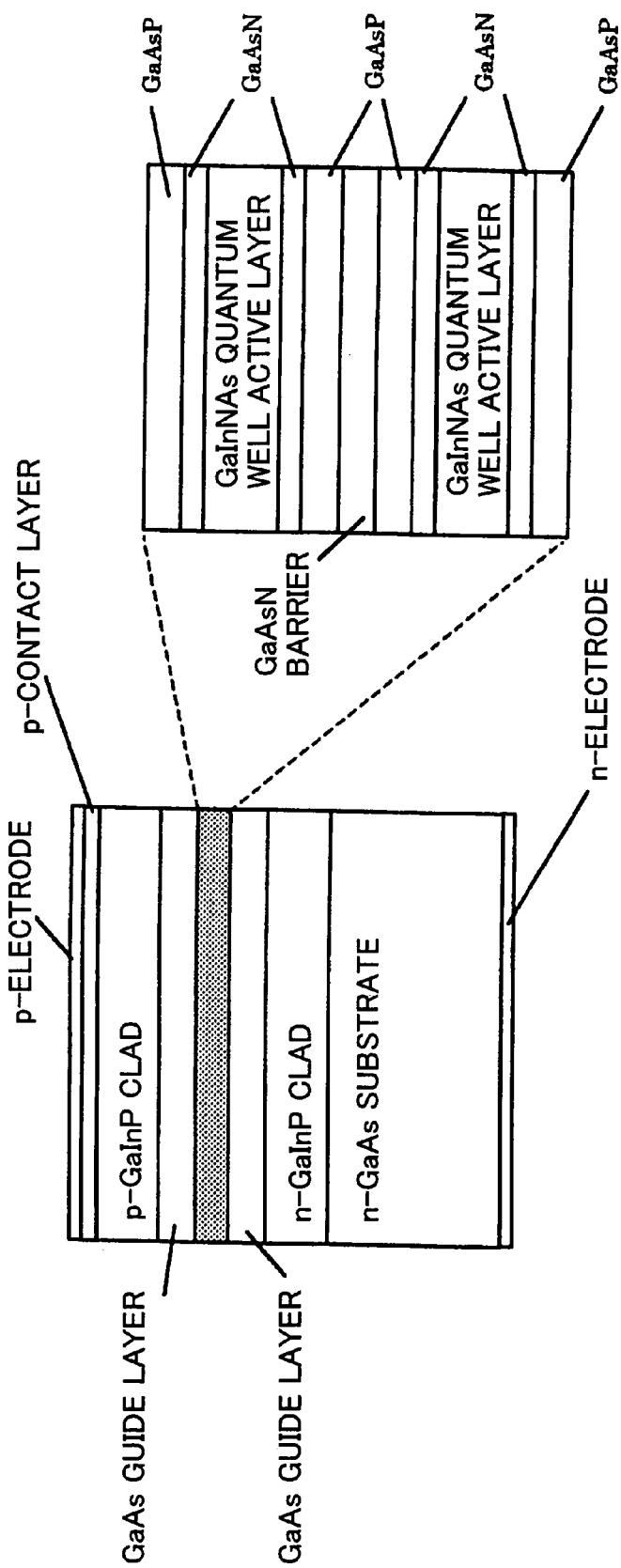
FIG. 20 is a drawing showing a semiconductor light emitter of a fourth example.
Figure 21:
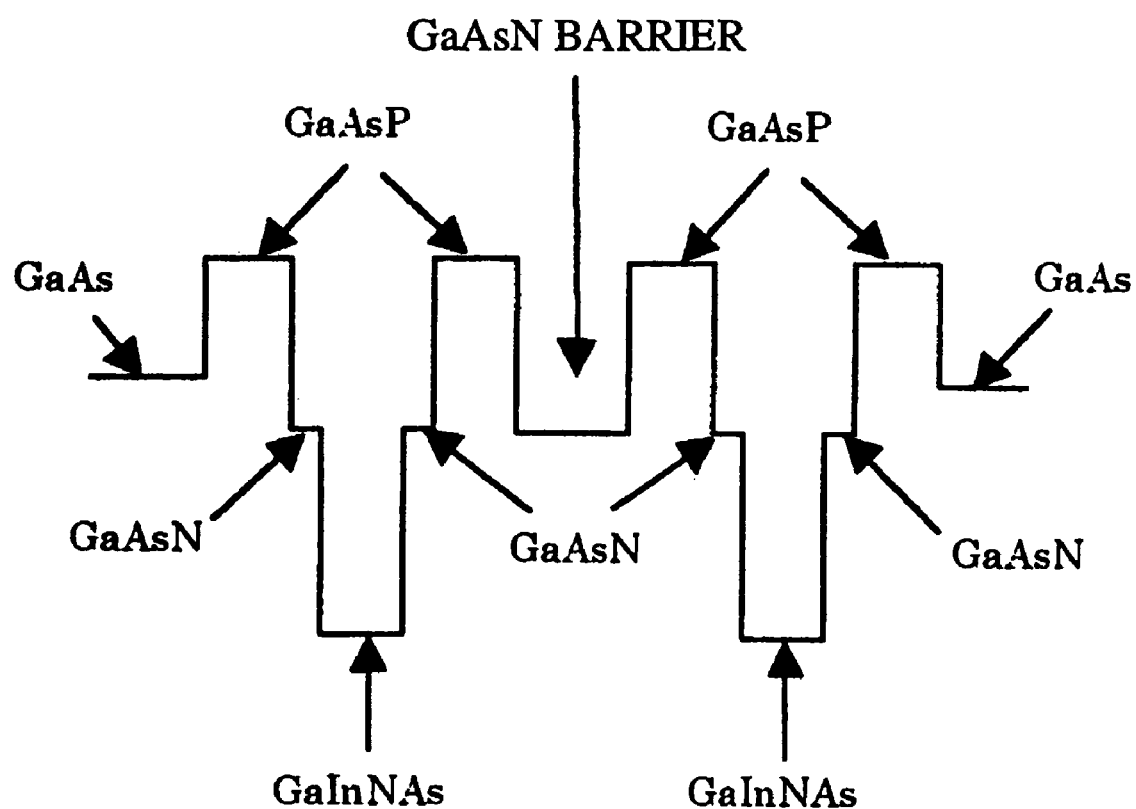
FIG. 21 is an illustrative drawing showing a conduction band.

A fourth example corresponds to the fifth embodiment. FIG. 20 is a drawing showing a semiconductor light emitter of the fourth example. The basic composition of the semiconductor light emitter of FIG. 20 is the same as that of the semiconductor light emitter of the second example, only difference being that the barrier layer in the multiple quantum well structure is changed from GaAs to GaAsN. The conduction band of such a structure is shown in FIG. 21. The construction of the third example previously described is effective when it is not desirable to provide a thick barrier layer between GaInNAs quantum well layers. If the barrier layer is thickened, however, the use of GaAsP for the barrier layer with high phosphorous concentration and large GaAsP crystals may result in the total thickness of GaAsP exceeding a critical film thickness, thereby causing lattice relaxation. On the other hand, the use of GaAsP with low P concentration may not cause a problem. Even if the thickness stays within a range that avoids lattice relaxation, the growth of a layer having a large strain to a certain thickness may be likely to cause the degradation of crystalline quality of GaAsP. In such a case, GaAsN having a relatively small N composition as a barrier layer and having a smaller strain than GaAsP may be used. This makes it possible to avoid lattice relaxation and the degradation of crystalline quality of GaAsP by keeping GaAsP to a certain thickness.

Moreover, GaAsN has a tensile strain although the strain is smaller than that of GaAsP, thereby providing a strain compensation effect despite in small magnitude. Each GaAsP layer can have any thickness as long as it falls within a range that does not causes lattice relaxation and the deterioration of crystalline quality. Although GaAsN is used as a barrier layer in the fourth example, the barrier layer is not limited to GaAsN. A tensile strain layer such as GaAsPSb, GaAsNSb, GaAsP (different composition), GaAsNP, etc., may as well serve a purpose as long as its composition is adjusted such that the strain is smaller than GaAsP.

In the fourth example, the barrier layer between quantum well active layers has a small strain, compared to the tensile strain of the layer that includes phosphorus (P) and has a higher conduction band than GaAs. Because of this, strain compensation is achieved while avoiding lattice relaxation caused by the tensile strain layer including phosphorus (P) and having the higher conduction band than GaAs even if it is desirable to increase the thickness of the barrier layer between the quantum well active layers. This provides for a high-quality, highly reliable semiconductor light emitter that provides a sufficient strain compensation effect, and suppresses a shift to a shorter emission wavelength caused by the increased level of quantum wells.

EXAMPLE 5

Figure 22:
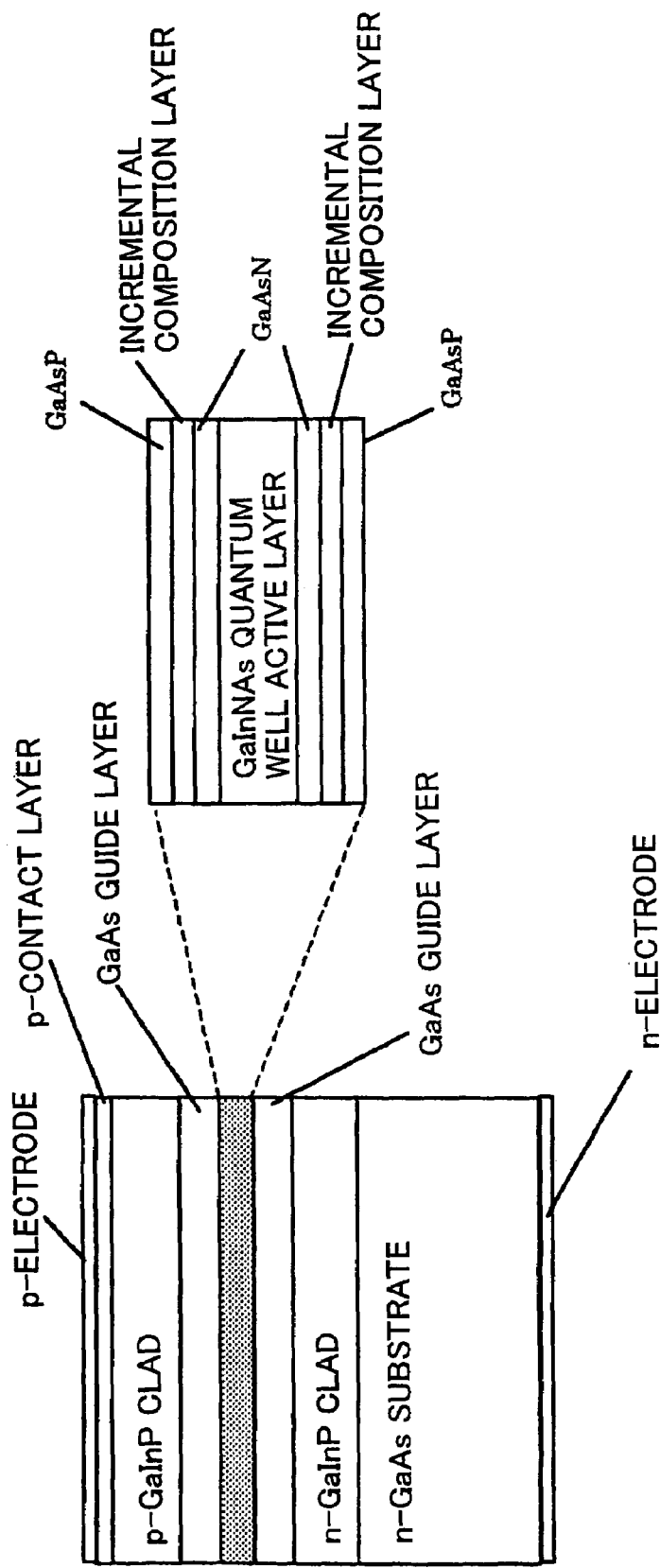
FIG. 22 is a drawing showing a semiconductor light emitter of a fifth example.
Figure 23:
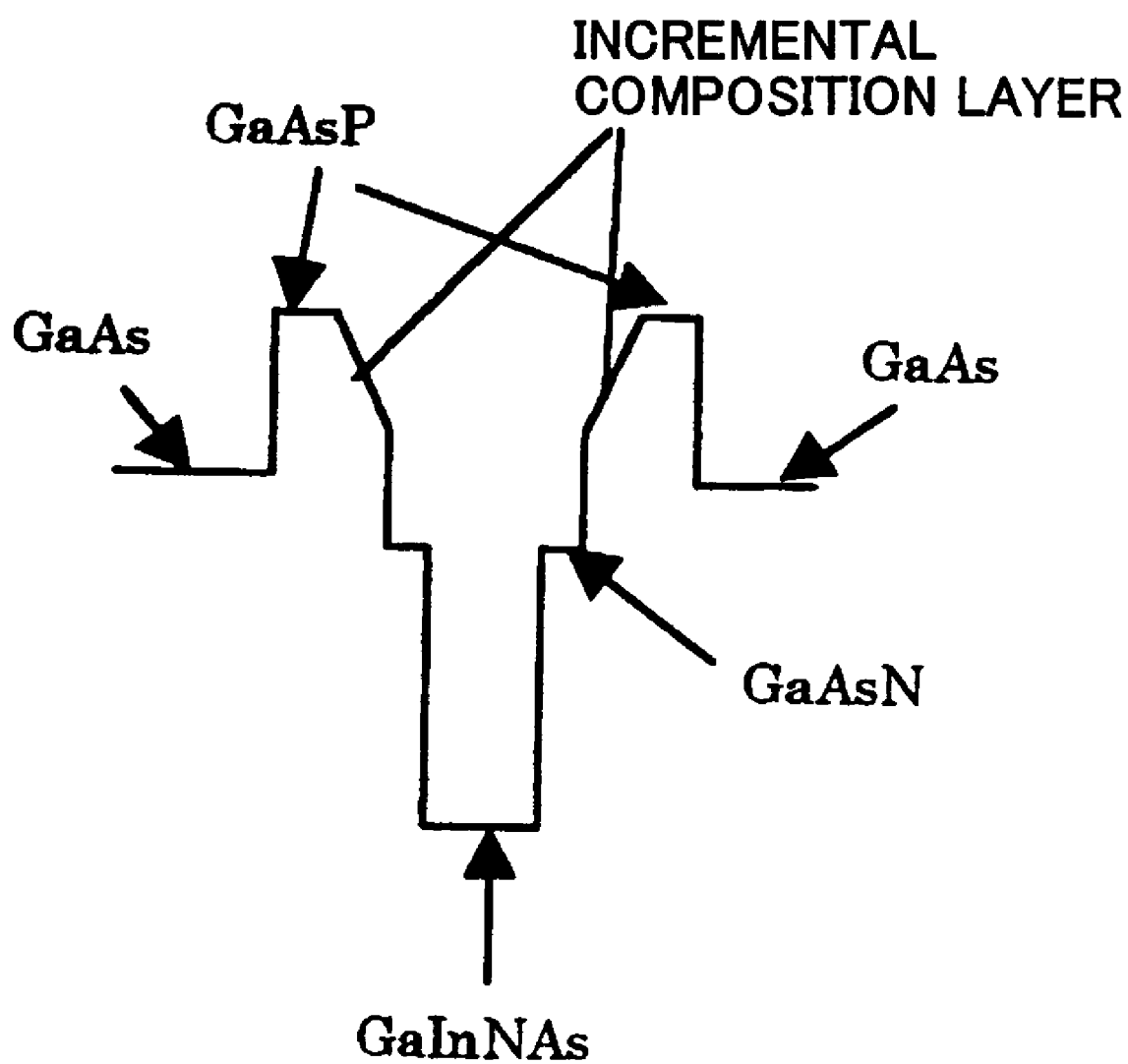
FIG. 23 is an illustrative drawing showing the band construction of the semiconductor light emitter.

A fifth example corresponds to the sixth embodiment. FIG. 22 is a drawing showing a semiconductor light emitter of the fifth example. FIG. 23 is an illustrative drawing showing the band construction of the semiconductor light emitter.

Although the basic composition of the semiconductor laser is almost the same as that of the first example, the fifth example differs from the first example in that an incremental-composition layer having the P composition of GaAsP changing from 0.05 to 0.2 is provided between GaAsP and GaAsN. If a strain difference is large between G aAsN and GaAsP, for example, placing GaAsN and GaAsP next to each other creates a strong strain field, which has a detrimental effect on reliability, and may deteriorate crystallinity at the time of crystal growth. The provision of an incremental-composition layer as in the fifth example makes it possible to introduce a continuous change in the strain, thereby improving reliability and avoiding the deterioration of crystalline quality.

Figure 24:
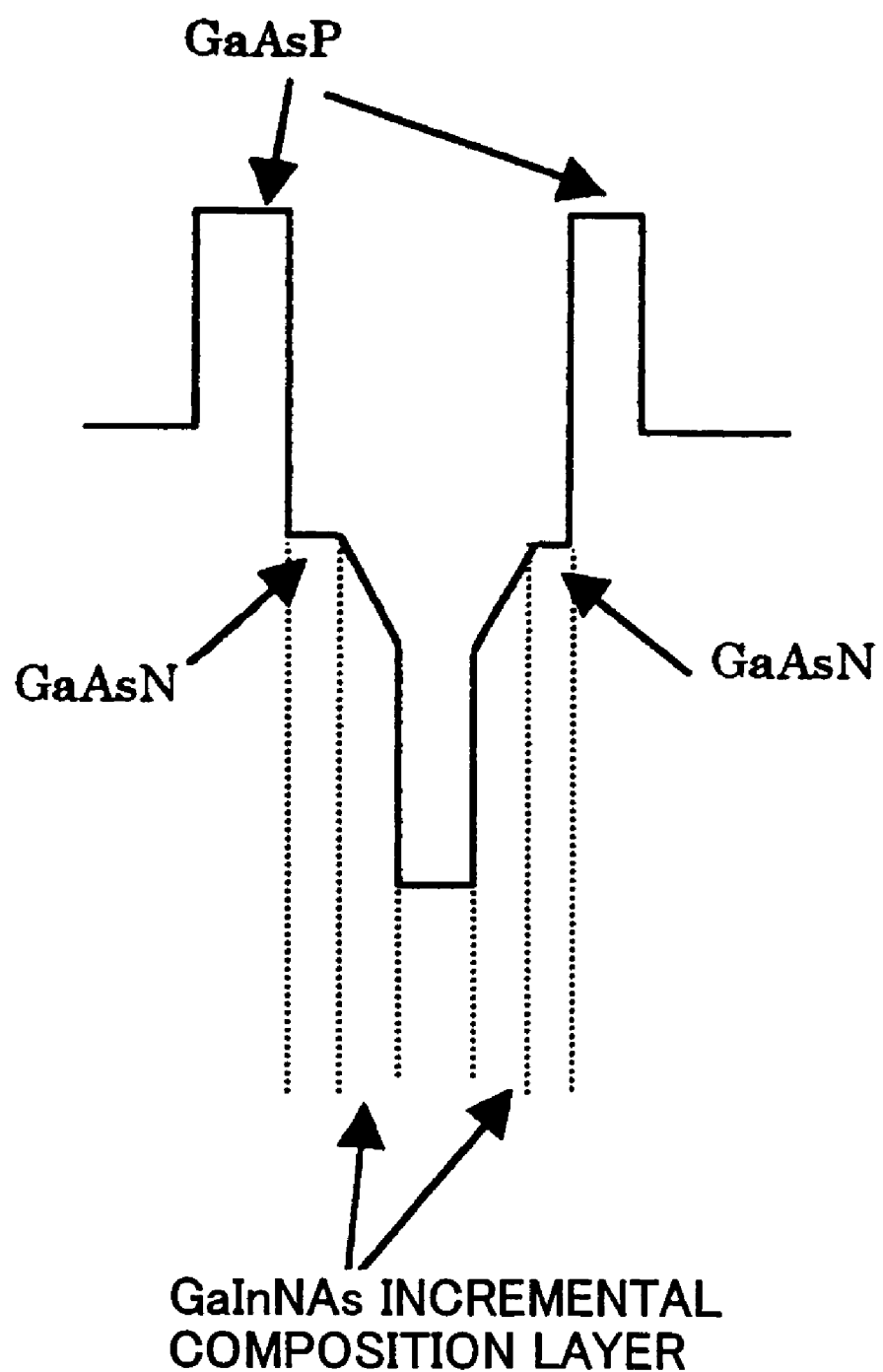
FIG. 24 is an illustrative drawing showing a gradual decrease of indium (In) of GaInNAs to 0 so as to be connected to GaAsN.

Such an incremental-composition layer may be provided between the active layer and the layer inclusive of nitrogen (N) and having a low conduction band than GaAs. For example, provision may be made to decrease the indium (In) of GaInNAs (having a different composition than the active layer) gradually to 0 so as to be connected to GaAsN as shown in FIG. 24. This improves reliability and crystalline quality in the active layer.

In the fifth example as described above, an incremental-composition layer is provided between layers varying greatly in the strain. This reduces the strain field that is generated when the layers having a large strain difference are placed next to each other, and provides a high-quality, highly reliable semiconductor light emitter.

EXAMPLE 6

Figure 25:
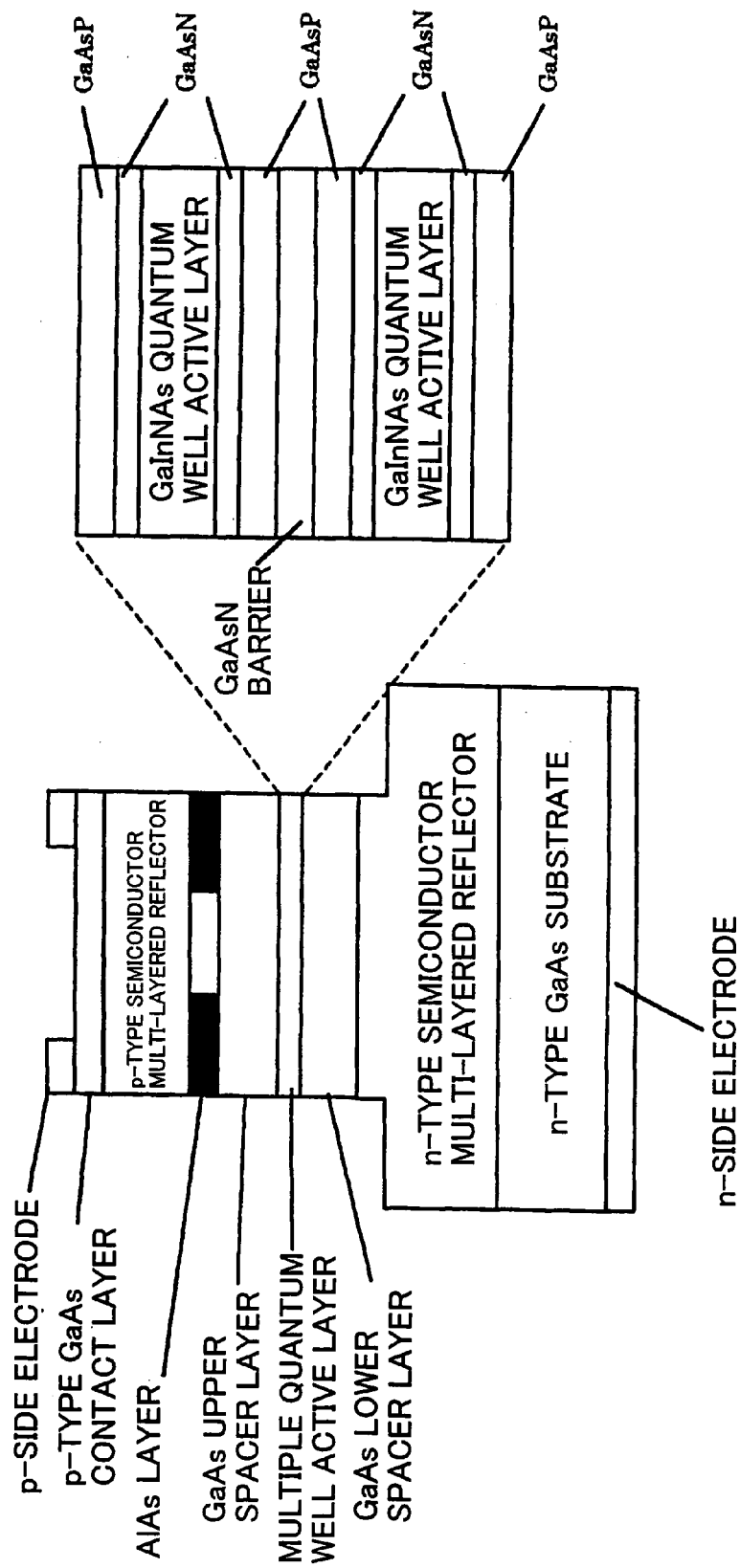
FIG. 25 is a drawing showing the semiconductor light emitter of a sixth example.

The sixth example corresponds to the seventh embodiment. FIG. 25 is a drawing showing the semiconductor light emitter of the sixth example. This semiconductor light emitter is a surface emitting semiconductor laser. In this sixth example, the composition of a multiple quantum well active layer is the same as that of the fourth example, i.e., having the DQW structure with GaAsN barriers.

In this sixth example, the MOCVD method is employed to form an n-type multi-layer semiconductor film reflector, a GaAs lower spacer layer, a GaInNAs/GaAsN/GaAsP multiple quantum well active layer, a GaAs upper spacer layer, an AlAs layer, and a p-type multi-layer semiconductor film reflector one after another on the n-type GaAs substrate.

The n-type multi-layer semiconductor film reflector is a distributed Bragg reflector that is formed by alternately stacking n-type high-refractive-index GaAs layers and n-type low-refractive-index $Al_{0.8}Ga_{0.2}As$ layers. Similarly, the p-type multi-layer semiconductor film reflector is a distributed Bragg reflector that is formed by alternately stacking p-type high-refractive-index GaAs layers and p-type low-refractive-index $Al_{0.8}Ga_{0.2}As$ layers.

A portion that includes the GaAs lower spacer layer, the multiple quantum well active layer, and the GaAs upper spacer layer constitutes λ resonator.

In the sixth example, the stacked-layer structure as described above is etched into a cylindrical shape to a depth where the n-type multi-layer semiconductor film reflector is provided, thereby forming a mesa structure. The mesa size is about 30 micrometers in diameter, for example. The AlAs layer is selectively oxidized from the lateral surface that is exposed by etching, thereby forming an AlOx insulation area, which provides a current constrictive structure. A current concentrates on an opening having a diameter of 5 micrometers that is formed by the AlOx insulation area, for example, and flows into the active layer.

On the surface of the p-type semiconductor multi-layer film reflector is formed a p-type electrode having a ring shape. An n-type electrode is formed on the back surface of the n-type GaAs substrate.

In the laser of an sixth example, light emitted by the multiple quantum well active layer is reflected and amplified by the upper and lower semiconductor reflectors, exiting in the direction perpendicular to the substrate.

As a multi-layer semiconductor film reflector on a GaAs substrate, an AlGaAs/GaAs stacked-layer type is highly suitable because of its capacity to easily produce a high-performance reflector and because of its satisfactory electrical characteristics.

In the surface emitting semiconductor laser based on GaInNAs that operates in the 1.3-micrometer band, a multi-layer semiconductor film reflector having an efficient reflectivity will be 7 micrometers in thickness (e.g., 35 pairs) on the n-type side adjoining the substrate, and will be 5.2 micrometers in thickness (e.g., 26 pairs) on the p-type side adjacent to the light emitting surface. When such a thick multi-layer semiconductor film reflector is grown, the flatness of its surface is easy to deteriorate, compared with the initial condition of the GaAs substrate. If a quantum well active layer such as GaInNAs with a large strain is grown on the surface having poor flatness, the layer is likely to show 3-dimensional growth, failing to provide a high-quality active layer. Moreover, if a multi-layer semiconductor film reflector is grown on the active layer that has poor flatness because of its 3-dimensional growth, the deterioration of morphology becomes conspicuous as its thickness increases. An active layer having a certain crystalline quality may not show the deterioration of surface morphology in the case of an edge emitting semiconductor laser, yet may show the deterioration of surface morphology if grown as a surface emitting semiconductor laser. Such deterioration of morphology causes the deterioration of reflectance of the multi-layer semiconductor film reflector. There is thus a need for strain compensation in an active layer more in a surface emitting semiconductor laser than in an edge emitting semiconductor laser.

In this sixth example, the strain-compensated structure comprised of the two layers of GaAsP/GaAsN is provided alongside a GaInNAs quantum well active layer, thereby providing a sufficient strain compensation effect, and preventing a shift to a shorter wavelength caused by the increased level of quantum wells. Further, the sixth embodiment prevents the deterioration of crystalline quality that may be caused by growth on a thick multi-layer semiconductor film reflector, and prevents the deterioration of surface morphology that may be caused by growing a thick multi-layer semiconductor film reflector on the active layer, thereby providing a high-performance, highly reliable surface emitting semiconductor laser.

EXAMPLE 7

A seventh example corresponds to the ninth and tenth embodiments. FIG. 26 is a drawing showing an optical transceiver module of the seventh example. The optical transceiver module of FIG. 26 is comprised of the surface emitting semiconductor laser of the sixth example, a photo-diode as a receiving end, and an optical fiber.

When the surface emitting semiconductor laser of the invention is used in an optical communication system, an optical communication system is provided at low costs by combining the surface emitting semiconductor laser (i.e., 1.3-micrometer-band GaInNAs surface emitting semiconductor laser), the photo-diode as a receiving end, and the optical fiber as shown in FIG. 26.

Moreover, the surface emitting semiconductor laser using GaInNAs emits light in the band of 1.3 micrometers to 1.5 micrometers, and is regarded as an optimum light source for the communication purpose as such wavelengths incur little loss on silica optical fibers. When a fluoride-added POF (plastic fiber) incurring small loss at a long-wavelength band such as a 1.3-micrometer range is used in combination with the surface emitting semiconductor laser using GaInNAs as the active layer, a module can be provided at an extremely low cost. This is because the fiber is inexpensive, and also because the large fiber diameter provides for assembly costs to be reduced due to easy coupling. Moreover, GaInNAs does not need a powerful cooling system because of its superior temperature characteristics. Costs for cooling can thus be reduced, thereby providing a cost-effective optical communication module.

As a light source for optical communications, the reliability of a surface emitting semiconductor laser is very important. In this invention, the strain-compensated structure comprised of the two layers of GaAsP/GaAsN is provided alongside a quantum well active layer containing N and other Group-V elements, thereby making it easier to produce a high-quality, highly reliable surface emitting semiconductor laser. A high-performance surface emitting semiconductor laser for long-wavelength communication is thus achieved, and is utilized to provide for optical communication systems such as fiber-optic communication systems and optical interconnection systems at low costs.

Third Aspect

In the following, a third aspect of the invention will be described.

Efforts have been directed to the research and development of a mixed-crystal semiconductor (nitrogen-type Group-V mixed-crystal semiconductor) that includes, in a Group-V element, nitrogen and additional Group-V elements, which is used as a semiconductor laser for optical communications conducted in the 1.3-micrometer band or the 1.55-micrometer band. Patent Document 1, for example, teaches a GaInNAs-type semiconductor laser which includes nitrogen and arsenic as Group-V elements. The use of such a nitrogen-type Group-V mixed-crystal semiconductor material for an active layer makes it possible to produce a long wavelength semiconductor laser of the 1.3-micrometer band or the 1.5-micrometer band on a GaAs substrate.

However, nitrogen has a small atomic radius, and has a low miscibility with other Group-V elements. The larger the nitrogen content is, the more difficult it is to obtain proper crystalline quality. This gives rise to a problem in that an increase in the nitrogen content brings about a decrease in light emission efficiency. In order to obviate this problem, it is conceivable to decrease the nitrogen content in a GaInNAs active layer. In order to achieve the emission of light in a long wavelength band exceeding 1.3 micrometers without increasing the amount of nitrogen content, however, it is necessary to provide a high compressive strain of GaInNAs exceeding 2%. With such GaInNAs used for the quantum well structure, GaAs is typically used as a barrier layer.

If a high strain quantum well layer having a compressive strain of 2% or more is used for the active layer of a semiconductor laser, the reliability of the semiconductor laser becomes an important issue. To address this issue, a strain-compensated structure may be considered. A strain-compensated structure provides a barrier layer with a strain opposite the strain of a quantum well layer, thereby reducing the net strain of the quantum well structure in total. The GaInNAs well layer has a compressive strain. As a strain-compensated layer, therefore, GaNAs and GaAsP having a tensile strain are used.

For example, Patent Document 2 teaches a semiconductor laser having a GaInNAsSb well layer and a GaNAs barrier layer. Moreover, Non-patent Document 1 discloses a semiconductor laser having a GaInNAs well layer and a GaAsP strain-compensated layer.

There is also are report about the problem of an increase in interface roughness, which is caused by mutual dispersion of In and Ga after anneal at the interface between a GaInNAs well layer and a GaAs or GaNAs barrier layer in the GaInNAs/GaAs quantum well structure and GaInNAs/GaNAs quantum well structure.

Moreover, Patent Document 3 provides a GaInAs intermediate layer between a GaInNAs well layer and a GaAs barrier layer in order to improve the interface of the GaInNAs well layer and the barrier layer. Further, Non-patent Document 2 teaches providing a GaInNAs diffusion prevention layer between a GaInNAs well layer and a GaNAs barrier layer.

Moreover, Patent Document 3 discloses a semiconductor device having a quantum well structure that includes a $Ga_{x1}In_{1-x1}N_{y1}As_{1-y1}$ ($0<x1<=1$, $0<y1<1$) quantum well layer and a $Ga_{x2}In_{1-x2}As_{y2}P_{1-y2}$ ($0<=x2<=1$, $0<=y2<=1$) barrier layer. Here, if $0<x1<=0.5$, $0.5x1<=x2<=1.5x1$ will be satisfied. If $0.5<x1<=1$, $0.5(1-x1)<=1-x2<=1.5(1-x1)$ will be satisfied. In this manner, the density gradient of an In composition is reduced in the well layer and the barrier layer, thereby suppressing the diffusion of In.

[Patent reference 1] Japanese Patent Application Publication No. 8-195522

[Patent reference 2] Japanese Patent Application Publication No. 2002-118329

[Non-Patent Document 1] Appl. Phys. Lett., Vol. 78, p. 91 (2001)

[Non-Patent Document 2] Appl. Phys. Lett., Vol. 80, p. 4720 (2002)

[Non-Patent Document 3] IEEE Photon. Technol. Lett., Vol. 14, p. 896 (2002)

[Patent Document 3] Japanese Patent Application Publication No. 2001-251021

The GaInAs intermediate layer reported by Non-patent Document 3 has an In composition of 32% and a compressive strain as high as 2.3%. The GaInNAs diffusion prevention layer reported by Non-patent Document 2 has a compressive strain as high as 1.84%.

Because of this, the GaInAs intermediate layer or the GaInNAs diffusion prevention layer provided at the interface of a GaInNAs well layer and a barrier layer does not serve as a strain-compensated layer. If the film thickness of the GaInNAs well layer stays the same, the provision of a high-strain intermediate layer rather results in an increase in the net strain.

There is a need to decrease the thickness of a GaInNAs quantum well layer if the intermediate layer is provided while keeping the net strain unchanged. This gives rise to a problem in that the wavelength of light emission shifts toward shorter wavelengths due to the quantum effect.

In Patent Document 3, the band gap of a barrier layer becomes larger than the band gap of GaAs when the lattice of the GaInAsP barrier layer matches that of the GaAs substrate or when it has a tensile strain. As a result, the base level of the quantum well structure rises, shifting the emitted wavelength to a shorter wavelength. An increase in nitrogen composition is thus needed to match the emitted wavelength, resulting in the degradation of crystallinity. If the GaInAsP barrier layer has a compressive strain, such material can be used as the band gap of a barrier layer does not exceeds the band gap of GaAs. The use of such material, however, cannot provide a strain-compensated structure, thereby resulting in a significant increase in the net strain.

Accordingly, there is a need for a quantum well structure, a semiconductor light emitter, an optical transmitting module, and an optical transmission system, in which roughness at the interface between a GaInNAs quantum well layer and a barrier layer is increased while suppressing an increase in the net strain of the quantum well structure and suppressing a shift to a shorter wavelength of the emitted wavelength.

In the following, embodiments of the invention will be described with reference to the accompanying drawings.

(First Embodiment)

The quantum well structure of the first embodiment includes a quantum well layer with a compressive strain that contains In, nitrogen, and other Group-V elements, and also includes barrier layers provided on the upper and lower sides of the quantum well layer. The barrier layers are constructed by stacking a layer (serving as an intermediate layer) inclusive of In and phosphorous (P) adjacent to the quantum well layer and a layer having a tensile strain.

A mixed-crystal semiconductor containing nitrogen and other Group-V elements, i.e., a nitrogen-type Group-V mixed-crystal semiconductor, is known to have an extremely large bowing parameter regarding the relationship between a band gap energy and a lattice constant. In the areas where nitrogen composition is small, therefore, the band gap energy decreases as the lattice constant decreases.

Although the band gap energy of GaN is larger than that of GaAs, GaNAs having small nitrogen composition has a band gap energy smaller than that of GaAs. This makes it possible to form a light emission layer of a long wavelength on a GaAs substrate.

Addition of In also decreases the band gap energy. With the use of a nitrogen-type Group-V mixed-crystal semiconductor containing In, thus, light emission in the long-wavelength band can be attained by smaller nitrogen composition than in the case where no In is added. This suppresses the lowering of light emission efficiency caused by an increase in nitrogen composition. As a material containing In, nitrogen, and other Group-V elements for use as a compressive-strain quantum well layer, GaInNAs, GaInNAsP, GaInNAsSb, GaInNAsPSb, etc. can be used.

However, InAs and GaAs have a difference in the lattice constant as large as 7.2%, so that an increase in In composition entails an increase in a compressive strain relative to a GaAs substrate. For example, a GaInNAs quantum well layer of the 1.3-micrometer band has a large compressive strain ranging from 2.0% to 2.6%.

In the quantum well structure of the invention, the barrier layers formed on the upper and lower sides of the quantum well layer are constructed by stacking a layer (serving as an intermediate layer) inclusive of In and phosphorous (P) adjacent to the quantum well layer and a layer having a tensile strain.

Since the layer having a tensile strain has a strain opposite the compressive strain of the quantum well layer, a strain-compensated structure is provided that reduces the net strain of the entirety of the quantum well structure. This suppresses the occurrence of dislocation, thereby improving the reliability of the quantum well structure. As a material for a layer having a tensile strain, GaAsP, GaNAs, GaNAsP, AlGaAsP, etc., may be used. Moreover, In or Sb may be added in small amount to the above-noted materials.

Furthermore, layers that are, among the barrier layers, adjacent to the quantum well layer (i.e., the layers serving as intermediate layers) include In. At an interface between the quantum well layer containing In and the barrier layers, therefore, diffusion of In contained in the quantum well layer and Ga contained in the barrier layers can be controlled. This can reduce roughness at the interface between the quantum well layer and the barrier layer.

The inclusion of In, however, results in the lattice constant being increased in the barrier layers adjoining the quantum well layer. Therefore, if GaInAs and GaInNAs are provided at the interface as in the conventional art, it gives rise to a problem in that the net strain of the entirety of the quantum well structure will increase.

In consideration of the above, the invention is characterized in that the barrier layers adjoining the quantum well layer include phosphorus (P) in addition to In. Since the additional P reduces the lattice constant of a mixed-crystal semiconductor, a strain of the barrier layers adjoining the quantum well layer can be reduced. This makes it possible to suppress an increase in the net strain of the entirety of the quantum well structure, thereby securing sufficient reliability.

The layer (intermediate layer) that adjoins the quantum well layer and includes In and phosphorus (P) is provided for the purpose of controlling diffusion of In and Ga. Such layer suffices if it has a thickness of approximately 0.5 nm to 5 nm.

The barrier layer includes at least a layer having a tensile strain and a layer (intermediate layer) containing phosphorus (P) and adjoining the quantum well layer. The structure does not have to be a two-layer structure, and a multi-layer structure having more than two layers of varying mixed-crystal compositions may be used.

The quantum well structure of the first embodiment may also be used for the gain layer of an optical amplifier, the light absorbing layer of a light receiver, and the modulation layer of an optical modulator, in addition to the active layer of a light emitter.

(Second Embodiment)

The semiconductor light emitter of the second embodiment of the invention includes a quantum well layer with a compressive strain that contains In, nitrogen, and other Group-V elements, and also includes barrier layers provided on the upper and lower sides of the quantum well layer. The barrier layers are constructed by stacking a layer (serving as an intermediate layer) inclusive of In and phosphorous (P) adjacent to the quantum well layer and a layer having a tensile strain. Namely, the quantum well structure of the first embodiment is utilized as the active layer of a semiconductor light emitter.

With this provision, the active layer is provided with a strain-compensated structure, which suppresses the net strain of the entirety of the quantum well structure, thereby improving the reliability of a semiconductor light emitter.

Furthermore, layers that are, among the barrier layers, adjacent to the quantum well layer include In. At an interface between the quantum well layer containing In and the barrier layers, therefore, diffusion of In contained in the quantum well layer and Ga contained in the barrier layers can be controlled. This can reduce roughness at the interface between the quantum well layer and the barrier layer. As a result, light emission efficiency is improved for the quantum well layer, which has a compressive strain and includes In, nitrogen, and other Group-V elements.

Since the interface between the quantum well layer and the barrier layers can be formed with steepness, a shift to shorter wavelengths of the active layer caused by anneal is reduced. A strain or nitrogen composition of the quantum well layer can thus be decreased for the same wavelength of light emission. This improves reliability and light emission efficiency.

Moreover, a strain of the barrier layer that adjoins the quantum well layer can be reduced by including phosphorus (P) in addition to In according to the invention. Compared with a conventional structure, therefore, the barrier layer adjoining the quantum well layer achieves a smaller increase in the net strain of the entirety of the quantum well structure, and achieves a smaller roughness at the interface between the quantum well layer and the barrier layer.

(Third Embodiment)

The third embodiment of the invention differs from the semiconductor light emitter of the second embodiment in that the layer (i.e., layer which functions as an intermediate layer) adjoining the quantum well layer and including In and phosphorus (P) has a band gap energy smaller than that of GaAs.

With the structure in which the layer including In and phosphorus (P) alongside the quantum well layer has a band gap energy smaller than that of GaAs, an increase in the quantum level of the quantum well layer can be suppressed even when the band gap energy of a layer having a tensile strain is larger than the band gap energy of GaAs. This makes it possible to form the quantum well active layer having a strain-compensated structure while controlling a shift to shorter wavelengths of the emitted wavelength.

When the layer containing In and phosphorus (P) alongside the quantum well layer is formed of GaInAsP, for example, a compressive strain needs to be provided in order to achieve a band gap energy of GaInAsP smaller than the band gap energy of GaAs. Even in this case, however, the compressive strain can be reduced compared with the GaInAs intermediate layer and the GaInNAs diffusion prevention layer of the conventional art, thereby successfully suppressing an increase in the net strain.

For example, $Ga_{0.65}In_{0.35}N_{0.01}As_{0.99}$ is used for the quantum well layer, $Ga_{0.8}In_{0.2}As_{0.8}P_{0.2}$ for a layer having a 2-nm thickness adjoining the quantum well layer, and $GaAs_{0.85}P_{0.15}$ for the layer having a tensile strain. $Ga_{0.8}In_{0.2}As_{0.8}P_{0.2}$ has a band gap energy slightly smaller than GaAs. On the other hand, $GaAs_{0.85}P_{0.15}$ has a tensile strain of 0.53%, with a band gap energy that is 100-meV higher than GaAs.

The conduction-band quantum level of a quantum well layer having a thickness of 4 nm to 10 nm is about the same as that of the quantum well structure in which $Ga_{0.65}In_{0.35}N_{0.01}As_{0.99}$ is used for the quantum well layer and GaAs for the barrier layer. Even if the band gap energy of the layer having a tensile strain is larger than that of GaAs, a shift to shorter wavelengths of emitted light can be suppressed by setting the band gap energy of the layer adjoining the quantum well layer below that of GaAs.

Here, a compressive strain of $Ga_{0.8}In_{0.2}As_{0.8}P_{0.2}$ alongside the quantum well layer is 0.73%. This percentage is reduced to less than a half, compared with 1.8% to 2.3% of the compressive strain of the GaInAs intermediate layer or the GaInNAs diffusion prevention layer of the conventional construction.

(Fourth Embodiment)

The fourth embodiment of the invention is characterized in that a strain of the layer (which functions as the intermediate layer) including In and phosphorus (P) alongside the quantum well layer is ±0.1% or less in the semiconductor light emitter of the second embodiment.

An increase in the In composition entails an increase in the lattice constant of a mixed crystal. An increase in the P composition, on the other hand, entails a decrease in the lattice constant of a mixed crystal. Controlling the In and P compositions in the layer containing In and phosphorus (P) alongside the quantum well layer makes it possible to form a layer having the substantially same lattice constant as the GaAs substrate, i.e., to form a layer having a ±0.1% or less strain.

In the fourth embodiment, therefore the quantum well layer has a compressive strain, and the barrier layer includes a layer having a tensile strain, with a thin layer formed therebetween having a ±0.1% or less strain. With this provision, the layers having opposite strains may not be in direct contact with each other, so that dislocation may not occur at the interface, thereby further improving the reliability of a semiconductor light emitter.

When GaInAsP is used for the layer adjoining the quantum well layer and containing In and phosphorus (P), the band gap energy of GaInAsP having a matching lattice with the GaAs substrate may become larger than that of GaAs. Because of this, if the barrier layer in its entirety is made of lattice matching GaInAsP, band discontinuity with the quantum well layer increases, resulting in a shift to shorter wavelength of light emission due to the quantum effect.

In the invention, the barrier layer has a stacked layer structure comprised of the layer adjoining the quantum well layer and containing In and phosphorus (P) and the outside layer having a tensile strain. Further, the layer adjoining the quantum well layer is formed such as to be 0.5 nm to 2 nm in thickness, and the outside layer having a tensile strain is formed such as to have band gap energy smaller than that of the layer adjoining the quantum well layer. This provides for a shift to shorter wavelengths of the quantum well layer to be reduced.

For example, $Ga_{0.65}In_{0.35}N_{0.01}As_{0.99}$ is used for the quantum well layer, $Ga_{0.7}In_{0.3}As_{0.4}P_{0.6}$ with a thickness of 1 nm for the layer adjoining the quantum well layer, and $GaN_{0.01}As_{0.89}P_{0.1}$ for the layer having a tensile strain. $Ga_{0.7}In_{0.3}As_{0.4}P_{0.6}$ has a composition that attains lattice matching with GaAs, and its conduction band is 300-meV higher than GaAs. On the other hand, a tensile strain of $GaN_{0.01}As_{0.89}P_{0.1}$ is 0.55%, and its conduction band is 80-meV lower than GaAs. The quantum well layer with a thickness of 8 nm has a conduction band quantum level that is only 4-meV higher than the quantum well structure that employs $Ga_{0.65}In_{0.35}N_{0.01}As_{0.99}$ for the quantum well layer and GaAs for the barrier layer. Therefore, even if the band gap energy of the layer adjoining the quantum well layer is larger than that of GaAs, reduction in the thickness of the layer adjoining the quantum well layer can suppress a shift of light emission to shorter wavelengths.

Here, GaAsP, GaNAs, AlGaAsP, etc., other than GaNAsP provided above as an example, may be used as a material for the layer having a tensile strain.

(Fifth Embodiment)

The fifth embodiment of the invention differs from the semiconductor light emitter of the second embodiment in that the barrier layer includes an incremental composition layer.

In the barrier layer, a layer adjoining the quantum well layer and containing In and phosphorus (P) may be provided as an incremental composition layer, or an incremental composition layer may be provided between the layer containing In and phosphorus (P) and the layer having a tensile strain.

When the layer adjoining the quantum well layer and containing In and phosphorus (P) is to be provided as an incremental composition layer, it becomes possible to stack layers so as to achieve a continuously varying strain between the quantum well layer having a compressive strain and the barrier layer having a tensile strain. By the same token, the provision of an incremental composition layer between the layer adjoining the quantum well layer and containing In and phosphorus (P) and the layer having a tensile strain can achieve a stacked layer structure having a continuously changing strain at the interface. With such provision, no abrupt change occurs in the lattice constant in the stacked layer structure, preventing dislocation at the interface, thereby further improving reliability.

(Sixth Embodiment)

The sixth embodiment of this invention is characterized in that the active layer has a multiple quantum well structure in the semiconductor light emitter of the second through fifth embodiments.

With the multiple quantum well structure in which quantum well layers having a high strain are stacked one over another, the larger the number of wells, the more likely the lattice relaxation occurs. In this invention, a compressive strain of the barrier layer adjoining the quantum well layer is reduced by adding phosphorus (P) in addition to In, and the layer having a tensile strain is also provided, thereby achieving a strain-compensated structure. This reduces the net strain of the entire quantum well structure. A highly reliable semiconductor light emitter can thus be provided, even with the use of a multiple quantum well structure in which quantum well layers having a high strain are stacked one over another.

(Seventh Embodiment)

The seventh embodiment of the invention is directed to a construction in which the semiconductor light emitter of the second through sixth embodiments is a surface emitting semiconductor laser (i.e., surface emitting semiconductor laser including a pair of multi-layer reflectors and a resonator structure sandwiched by the pair of multi-layer reflectors).

Compared with edge emitting semiconductor laser, a surface emitting semiconductor laser has a relatively short resonator length and a relatively small gain region. In order to provide satisfactory laser characteristics in terms of a threshold current, a maximum optical output, and temperature-related performance, a plurality of quantum well active layers needs to be provided for the purpose of boosting the gain of the active layer.

The active layer of the invention has a strain-compensated structure by providing a tensile strain for the barrier layer. In the barrier layer, further, the layer with added In and phosphorus (P) adjacent to the quantum well layer has a reduced compressive strain. This suppresses lattice relaxation, thereby allowing for an increase in the number of quantum wells. In this manner, a surface emitting semiconductor laser is provided that oscillates at a low threshold current, with a sufficiently high maximum optical output and satisfactory temperature characteristics.

(Eighth Embodiment)

The eighth embodiment of the invention is characterized in that the layer adjoining the quantum well layer and containing In and phosphorus (P) is made of GaInAsP in the semiconductor light emitter of the second through seventh embodiments.

Al is also a Group-III element, in addition to Ga and In. The provision of a layer containing Al at the interface with the quantum well layer containing nitrogen, however, causes nitrogen segregation at the interface because chemically active Al and nitrogen are easy to be combined. This causes the deterioration of flatness at the interface between the quantum well layer and the barrier layer. It is thus desirable to avoid the inclusion of Al in the layer adjoining the quantum well layer and containing In and phosphorus (P).

Sb and N are Group-V elements, in addition to As and P, and may also be included. The inclusion of Sb, however, increases the lattice constant. It is thus preferable to have a small Sb composition in order to suppress an increase in a compressive strain.

Moreover, the inclusion of nitrogen causes a significant drop in the position of a conduction band, resulting in the entrapment of electrons in the quantum well layer being undermined. It is thus preferable to keep an added N composition to a minute amount.

It follows that a material for the barrier layer adjoining the quantum well layer of the invention is GaInAsP if the mixed-crystal semiconductor is to be constituted from the fewest number of elements.

(Ninth Embodiment)

An optical transmitting module according to the ninth embodiment of the invention is characterized by comprising the semiconductor light emitter of the second through eighth embodiments.

The semiconductor light emitter of the second through eighth embodiments has high light emission efficiency and a highly reliable quantum well active layer, and can thus operate at a low current with sufficient reliability. In the ninth embodiment, such a semiconductor light emitter is used for an optical transmitting module, thereby achieving a highly reliable optical transmission module operating with low power consumption.

(Tenth Embodiment)

An optical transmission system according to the tenth embodiment of the invention is characterized by employing the optical transmitting module of the ninth embodiment. In the tenth embodiment, the use of the highly reliable optical transmitting module operable with low power consumption makes it possible to reduce power consumption and to provide a highly reliable optical transmission system.

In the following, examples of the invention will be described.

EXAMPLE 1

FIGS. 27A and 27B are illustrative drawings showing a semiconductor laser of the first example according to the invention. FIG. 27B shows the details of a quantum well active layer 104 illustrated in the semiconductor laser of FIG. 27A.

In FIG. 27A, an n-type AlGaAs clad layer 102, a GaAs lower optical waveguide layer 103, a quantum well active layer 104, a GaAs upper optical waveguide layer 105, a p-type AlGaAs clad layer 106, and a p-type GaAs contact layer 107 are stacked one over another on a n-type GaAs substrate 101. A p-side electrode 108 is formed on the upper surface of the p-type GaAs contact layer 107, and an n-side electrode 109 is formed on the back surface of the n-type GaAs substrate 101.

The feature of the semiconductor laser of the first example resides in the quantum well structure of the active layer 104. As shown in FIG. 27B, the quantum well active layer 104 includes GaInNAs as a quantum well layer 104a and barrier layers provided on the upper side and the lower side. The barrier layers each include a GaInAsP intermediate layer 104b and a GaAsP layer 104c.

The thickness of the GaInNAs quantum well layer 104a may be 8 nm, and the thickness of the GaAsP layer 104c may be 20 nm. Further, the GaInAsP intermediate layer 104b is 2 nm in thickness.

The GaInNAs quantum well layer 104a has the band gap energy of a 1.3-micrometer band, thereby achieving a semiconductor laser that oscillates in the 1.3-micrometer band. The GaInNAs quantum well layer 104a has a larger lattice constant than the GaAs substrate, and has a compressive strain as high as 2.3%.

On the other hand, the GaAsP layer 104c has a 0.3% tensile strain. A strain-compensated structure is thus provided that alleviates a high compressive strain of the GaIn-NAs quantum well layer 104a. In this manner, the strain is controlled with respect to the GaInNAs quantum well layer 104a, thereby improving the reliability of the semiconductor laser.

Furthermore, the GaInAsP intermediate layer 104b situated between the GaInNAs quantum well layer 104a and the GaAsP layer 104c includes In, thereby serving to suppress interdiffusion of In and Ga at the interface between the GaInNAs quantum well layer 104a with In and the GaAsP layer 104c without In. In this manner, the roughness of the interface between the GaInNAs quantum well layer 104a and the GaAsP layer 104c is reduced, thereby improving light emission efficiency of the GaInNAs quantum well layer 104a.

Since the interface between the GaInNAs quantum well layer 104a and the barrier layers can be formed with steepness, a shift of light emission to shorter wavelengths caused by anneal is reduced. A nitrogen composition of the GaInNAs quantum well layer can thus be decreased for the same wavelength of light emission. This improves light emission efficiency.

Moreover, the invention is characterized in that the GaInAsP intermediate layer 104b is includes P in addition to In. The addition of P can reduce a compressive strain of the GaInAsP intermediate layer 104b, compared with the case where no P is added.

FIGS. 28A through 28F are diagrams showing the conduction band energy and strain profiles of the quantum well structure.

FIGS. 28A and 28B illustrate the conduction band energy and strain profile of a conventional quantum well active layer, respectively. The GaInNAs quantum well layer having a thickness of 8 nm is situated alongside the GaInAs intermediate layer having a thickness of 2 nm, which is situated alongside the GaAsP layer. In the structure of FIGS. 28A and 28B, the GaInNAs quantum well layer having a 2.3% compressive strain and the GaInAs layers having a 2.0% compressive strain are stacked together, thereby providing a high compressive strain region as thick as 12 nm. This exceeds a critical film thickness, thereby causing dislocation in the quantum well structure.

FIGS. 28C and 28D illustrate the conduction band energy and strain profile of another conventional quantum well active layer, respectively. The GaInNAs quantum well layer having a thickness of 4 nm is situated alongside the GaInAs intermediate layer having a thickness of 2 nm, which is situated alongside the GaAsP layer. In the structure of FIGS. 28C and 28D, the thickness of a high compressive strain region is 8 nm, which is below the critical film thickness. Since the thickness of a GaInNAs quantum well layer is as thin as 4 nm, however, the quantum level of a conduction band becomes high. This gives rise to a problem in that the wavelength of light emission is shifted to a shorter wavelength even if GaInNAs maintains the same composition.

FIGS. 28E and 28F illustrate the conduction band energy and strain profile, respectively, of the quantum well active layer of the first example. The GaInNAs quantum well layer having a thickness of 8 nm is situated alongside the GaInAsP intermediate layer having a thickness of 2 nm, which is situated alongside the GaAsP layer. Since the GaInAsP intermediate layer includes P, a compressive strain can be further reduced compared with GaInAs of the same In composition. Unlike the structure of FIGS. 28A and 28B, the net strain is thus reduced, thereby suppressing dislocation. Unlike the structure of FIGS. 28C and 28D, further, there is no need to reduce the thickness of the GaInNAs quantum well layer, which makes it possible to suppress a shift of light emission to a shorter wavelength.

It should be noted that the compressive strain of the intermediate layer can also be reduced by lowering an In composition in the GaInAs intermediate layer. A decrease in the In composition, however, results in the effect of suppressing interdiffusion of Ga and In being reduced at the quantum well interface. In order to suppress interdiffusion of Ga and In, the In composition of the intermediate layer and the In composition of the quantum well layer need to be set as close to each other as possible. In the conventional structures, it was not possible to reduce the compressive strain of the intermediate layer while suppressing the interdiffusion of Ga and In. The invention provides for the net strain to be reduced without undermining the effect of suppressing Ga-and-In interdiffusion, thereby improving the reliability of a semiconductor laser.

EXAMPLE 2

FIG. 29 is a drawing showing a surface emitting semiconductor laser according to the second example of the invention. In FIG. 29, an n-type GaAs/AlGaAs distributed Bragg reflector (DBR) 301 is stacked on the n-type GaAs substrate 101. The n-type GaAs/AlGaAs DBR 301 is fomred by stacking n-type GaAs high-refractive-index layers and n-type $Al_{0.9}Ga_{0.1}As$ low-refractive-index layers one over the other with a layer thickness equal to ¼ of the medium-dependent wavelength. On top of the n-type GaAs/AlGaAs DBR 301, a GaAs lower spacer layer 302, a multiple quantum well active layer 303, a GaAs upper spacer layer 304, a p-type AlAs layer 305, and a p-type GaAs/AlGaAs DBR 306 are stacked one over another.

The stacked layer structure described above is etched from its upper surface to a depth of the n-type GaAs/AlGaAs DBR 301 so as to leave a cylindrical shape, thereby forming a mesa structure. The AlAs layer 305 is then selectively oxidized from the side surface of the mesa structure, forming an AlOx insulation region 307.

On the upper surface of the mesa structure, a p-side ring-shape electrode 108 is formed by leaving an area for light emission. Moreover, an n-side electrode 109 is formed on the back surface of the n-type GaAs substrate 101.

FIG. 30A is a drawing showing the detail of the stacked layer structure of a multiple quantum well active layer in the surface emitting semiconductor laser according to the second example of the invention. In FIG. 30A, 303a denotes a GaInNAs quantum well layer of a 8-nm thickness. The compressive strain of the GaInNAs quantum well layer 303a is 2.3%. Alongside the GaInNAs quantum well layer 303a, a GaInAsP intermediate layer 303b of a 2-nm thickness is provided, further followed by a GaAsP strain-compensated layer 303c that is 27-nm thick. The tensile strain of the GaAsP strain-compensated layer 303c is set to 0.4%. The number of the quantum well layers is three.

FIG. 30B is a drawing showing the energy diagram of the conduction band position of the multiple quantum well active layer. In the multiple quantum well active layer of the second example, the band gap energy of the GaInAsP intermediate layer 303b is set lower than that of GaAs.

The GaAsP strain-compensated layer 303c has band gap energy larger than that of GaAs. Because of this, the use of a GaInNAs quantum well layer/a GaAsP barrier layer results in the wavelength of light emission being shifted to a shorter wavelength by several dozen nanometers, compared with the structure having a GaInNAs quantum well layer/a GaAs barrier layer. In the structure of FIGS. 30A and 30B, the GaInAsP intermediate layer 303b is provided that has band gap energy the same as or lower than that of GaAs. With this provision, an increase in the quantum level is suppressed.

Figure 34:
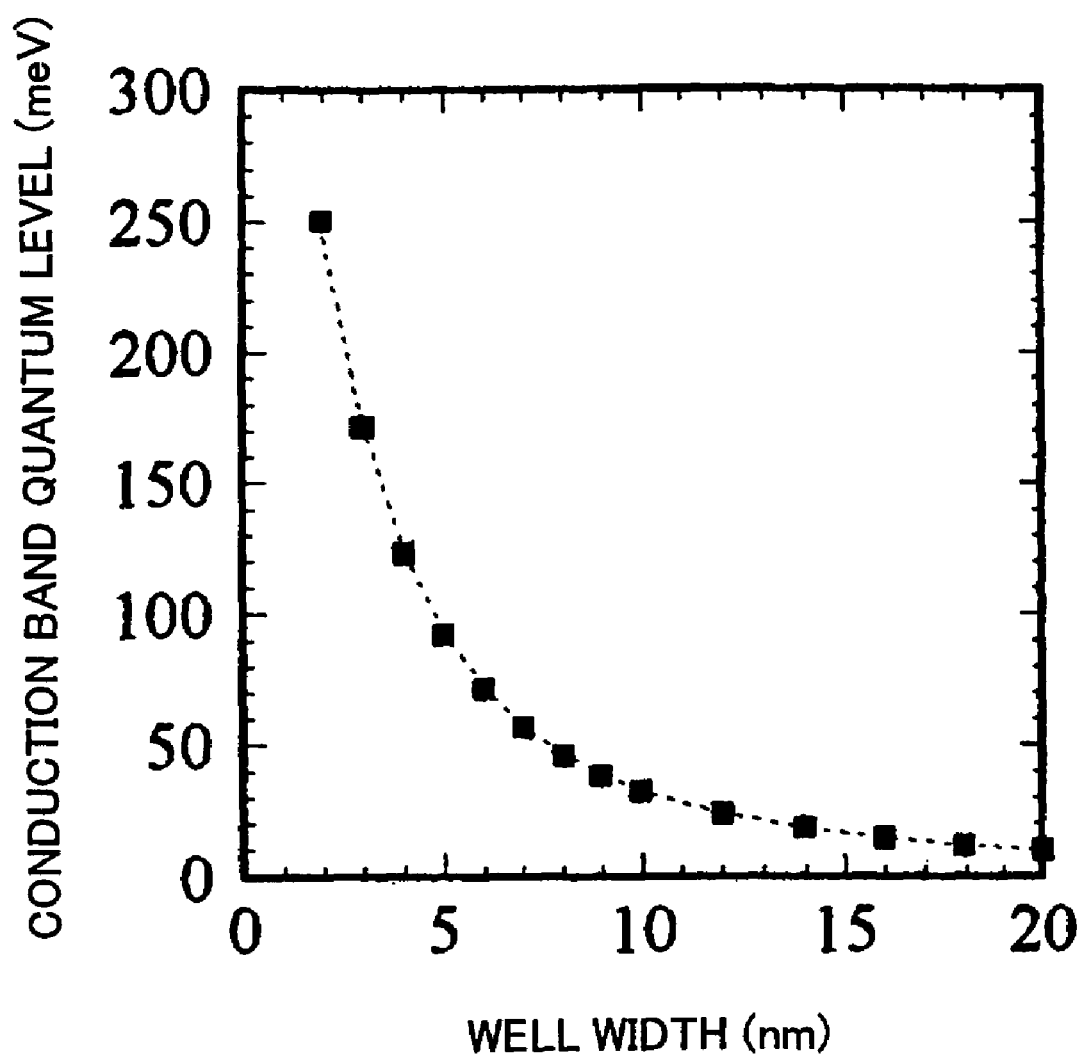
FIG. 34 is a diagram showing the relationship between the quantum level of a conduction band and the width of wells.

FIG. 34 is a diagram showing the relationship between the quantum level (ground level) of the conduction band and the width of wells. In FIG. 34, solid squares are plotted to indicate the quantum level of the quantum well structure shown in FIG. 30A, and a dotted line represents the quantum level of the GaInNAs quantum well layer/the GaAs barrier layer. The position of the conduction band of the GaInAsP intermediate layer is 30 meV lower than that of GaAs, and the position of the conduction band of the GaAsP strain-compensated layer is 100 meV higher than that of GaAs.

As shown in FIG. 34, even if the GaAsP strain-compensated layer having a higher energy barrier than GaAs is used, the insersion of a GaInAsP intermediate layer having a 2-nm thickness can achieve a quantum level almost identical to that of the GaInNAs/GaAs quantum well structure. Thus, a shift to shorter wavelengths of light emission can be suppressed.

The strain profile of the multiple quantum well active layer is shown in FIG. 30C. When the band gap energy of GaInAsP is lowered below that of GaAs, the lattice constant becomes larger than that of GaAs, generating a compressive strain. For example, the use of $Ga_{0.8}In_{0.2}As_{0.8}P_{0.2}$ for the intermediate layer causes band gap energy to be slightly lower than that of GaAs, with a resulting compressive strain of 0.73%. Compared with a compressive strain of 1.43% of $Ga_{0.8}In_{0.2}As$ with no P, the compressive strain can thus be reduced to a half. As a result, the net strain is reduced from 0.2% to 0.14%.

EXAMPLE 3

The surface emitting semiconductor laser according to the third example of the invention is similar to the structure shown in FIG. 29. The third example differs from the second example in the structure of a multiple quantum well active layer.

FIG. 31A is a illustrative drawing showing the stacked layer structure of a multiple quantum well active layer in the surface emitting semiconductor laser according to the third example. In FIG. 31A, 501a denotes a GaInNAs quantum well layer of a 8-nm thickness. Alongside the GaInNAs quantum well layer 501a, a GaInAsP intermediate layer 501b of a 1-nm thickness is provided, further followed by a GaNAsP strain-compensated layer 501c that is 27-nm thick. The number of the quantum well layers is three.

The strain profile of the multiple quantum well active layer is shown in FIG. 31B. A compressive strain of the GaInNAs quantum well layer 501a is 2.3%, and the $GaN_{0.009}As_{0.89}P_{0.1}$ strain-compensated layer 501c has a 0.5% tensile strain. The GaInAsP intermediate layer 501b is characterized by a mixed-crystal composition that substantially has lattice matching with the GaAs substrate.

As a composition that substantially has lattice matching with the GaAs substrate, $Ga_{0.7}In_{0.3}As_{0.4}P_{0.6}$ may be used, for example. The In composition of the GaInNAs quantum well layer 501a is about 0.3 to 0.35, and the $Ga_{0.7}In_{0.3}As_{0.4}P_{0.6}$ intermediate layer 501b has an In composition that is close to that of the GaInNAs quantum well layer 501a. This makes it possible to reduce interdiffusion of Ga and In at the interface of the GaInNAs quantum well layer 501a.

With the structure of FIG. 31B, the net strain is reduced to +0.1% by the strain-compensated structure. Moreover, the intermediate layer 501b having no strain is provided between the GaInNAs quantum well layer 501a having a compressive strain and the GaNAsP strain-compensated layer 501c having a tensile strain. This ensures that layers having opposite strains are not in direct contact with each other, thereby suppressing dislocation at the interface. This further improves the reliability of a semiconductor laser element.

FIG. 31C is a drawing showing the energy diagram of the conduction band position of the multiple quantum well active layer 501. The conduction band position of Ga0.7In0.3As0.4P0.6 having lattice matching with the GaAs substrate is 300 meV higher than GaAs. As shown in FIG. 31C, therefore, the GaInAsP intermediate layer 501b has an increased electron energy barrier. Moreover, the conduction band position of GaN0.009As0.89P 0.1 strain-compensated layer 501c is 80 meV lower than that of GaAs.

If the thickness of the GaInAsP intermediate layer 501b is thickened for use as a barrier layer, the discontinuity of the conduction band increases relative to the GaInNAs quantum well layer 501a. As a result, the quantum level of the conduction band rises, causing a shift of light emission to a shorter wavelength. In the structure shown in FIG. 31A, however, the thickness of the GaInAsP intermediate layer 501b having a high energy barrier is reduced to 1 nm, flanked outside by the GaNAsP strain-compensated layer 501c, thereby forming the barrier layer. With this provision, an increase in the quantum level is successfully suppressed.

Figure 35:
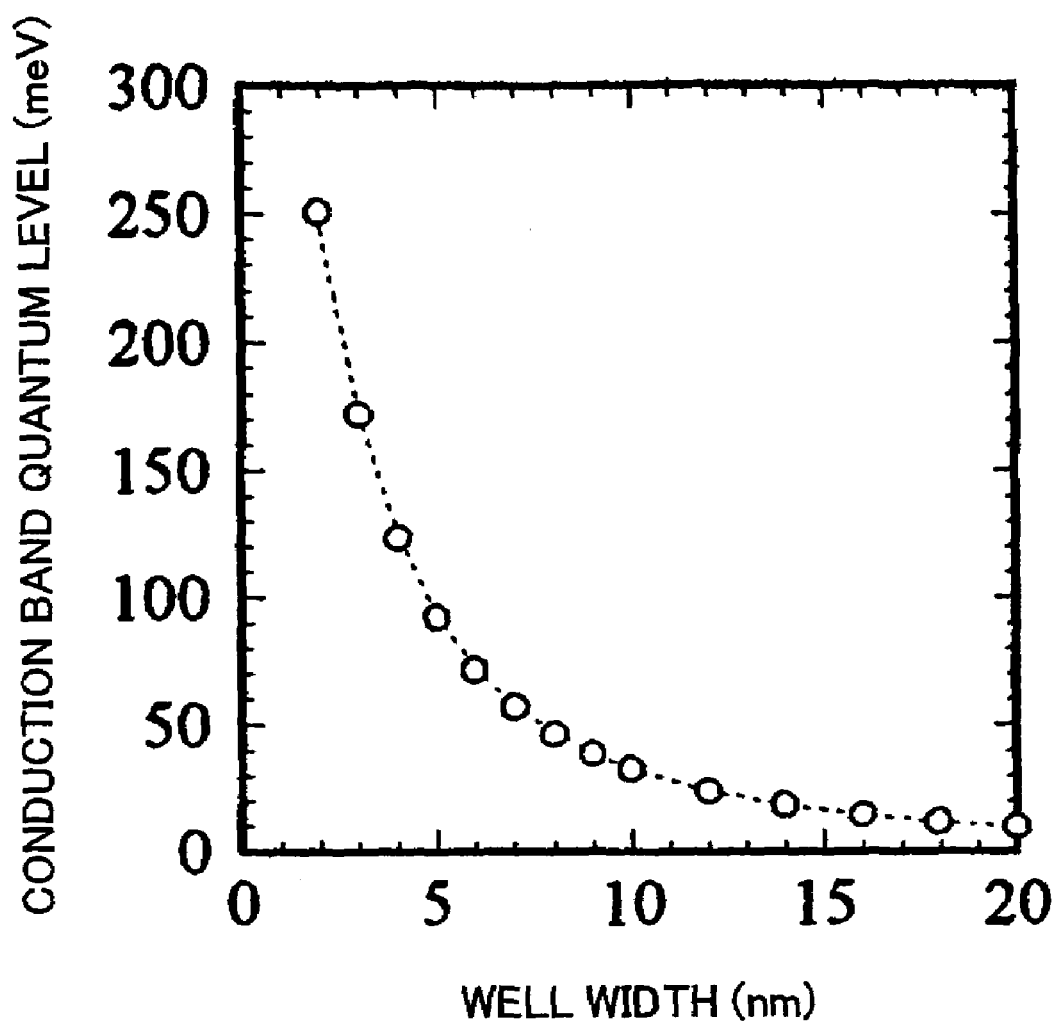
FIG. 35 is a diagram showing the relationship between the quantum level of a conduction band and the width of wells.

FIG. 35 is a diagram showing the relationship between the quantum level (ground level) of the conduction band and the width of wells. In FIG. 35, open circles are plotted to indicate the quantum level of the quantum well structure shown in FIG. 31A, and a dotted line represents the quantum level of the GaInNAs quantum well layer/the GaAs barrier layer. As shown in FIG. 35, even if the GaInAsP intermediate layer 501b having a high energy barrier is provided, a quantum level almost identical to that of the GaInNAs/GaAs quantum well structure is achieved. Thus, a shift to shorter wavelengths of light emission can be suppressed.

EXAMPLE 4

The surface emitting semiconductor laser of the fourth example of the invention is similar to the structure shown in FIG. 29. The fourth embodiment differs from the surface emitting semiconductor laser of the second and third embodiments in the structure of a multiple quantum well active layer.

Figure 32B:
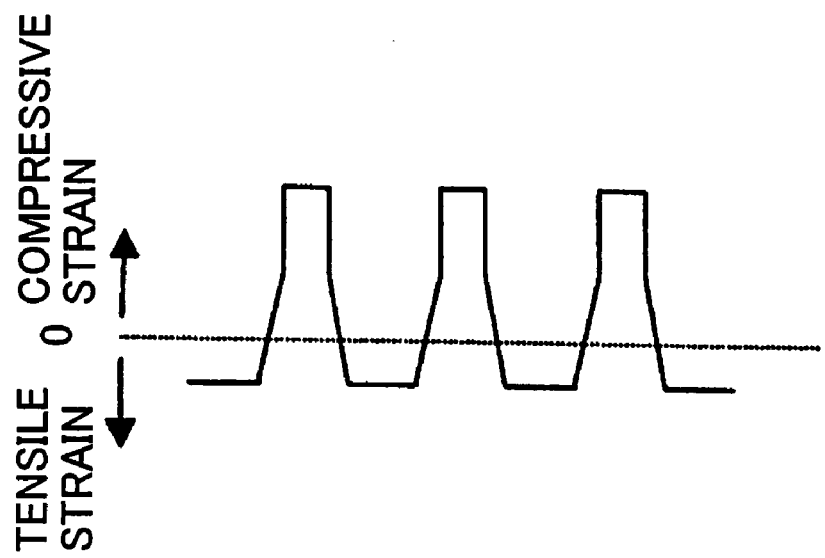
FIG. 32B is a drawing showing a strain profile of the multiple quantum well active layer.
Figure 32A:
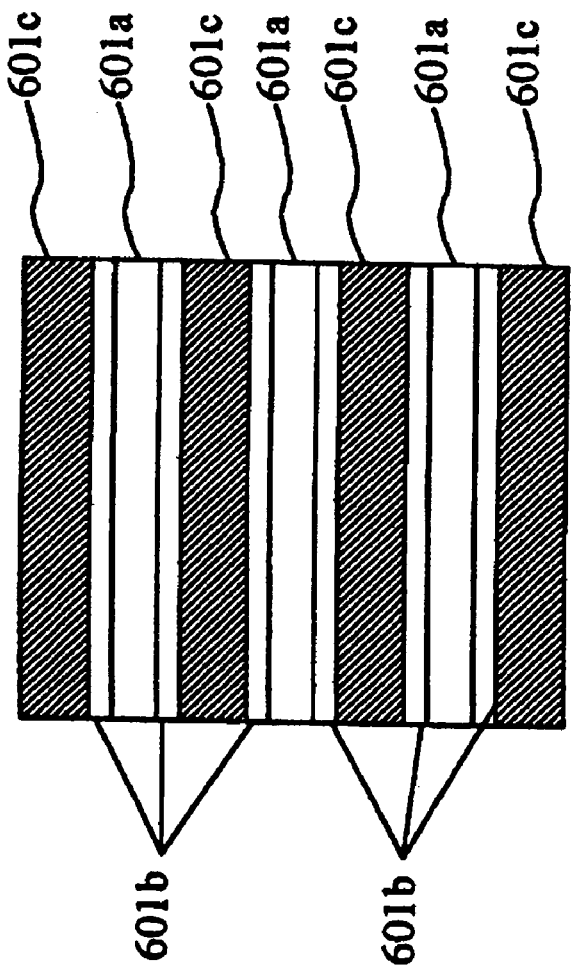
FIG. 32A is a drawing showing the detail of the stacked layer structure of a multiple quantum well active layer in the surface emitting semiconductor laser according to a fourth example of the invention.

FIG. 32A is a drawing showing the detail of the stacked layer structure of a multiple quantum well active layer in the surface emitting semiconductor laser according to the fourth example of the invention. In FIG. 32A, 601a denotes a GaInNAs quantum well layer of a 8-nm thickness. The compressive strain of the GaInNAs quantum well layer 601a is 2.3%. Alongside the GaInNAs quantum well layer 601a, a GaInAsP incremental composition layer 601b of a 2-nm thickness is provided, further followed by a GaAsP strain-compensated layer 601c that is 27-nm thick. The tensile strain of the GaAsP strain-compensated layer 601c is set to 0.4%. The number of the quantum well layers is three.

The strain profile of the multiple quantum well active layer is shown in FIG. 32B. In the $Ga_{1-x}In_xAs_{1-y}P_y$ incremental composition layer 601b, both the In composition x and the As composition y exhibit gradual changes, which creates a continuously changing strain. As a result, the lattice constant does not show a steep change at the interface, which suppresses dislocation at the quantum well layer interface. The reliability of a semiconductor laser is thus improved.

EXAMPLE 5

FIG. 33 is an illustrative drawing showing an optical transmission system according to the fifth example of the invention. In the optical transmission system of FIG. 33, an optical signal generated by an optical transmitting module 701 is transmitted to an optical receiving module 702 through a quartz optical fiber 704. In FIG. 33, two sets of the optical transmitting module 701, the optical fiber 704, and the optical receiving module 702 are provided for the purpose of achieving two-way communication. The optical transmitting module 701 and the optical receiving module 702 are integrated in a single package, which constitutes an optical transceiver apparatus 703.

In the fifth example, the semiconductor laser of any one of the first through fourth examples is used as a light source of the optical transmitting module 701. As previously described, such semiconductor laser is constructed such that inter-diffusion of In and Ga is suppressed at the interface between the GaInNAs quantum well layer and the barrier layer, thereby reducing roughness at the interface and improving light emission efficiency of the GaInNAs quantum well layer. The operating current of the semiconductor laser is thus successfully lowered, resulting in the power consumption of the optical transmitting module being reduced.

Moreover, the net strain of the quantum well active layer having a strain-compensated structure is successfully reduced to improve the reliability of a semiconductor laser. This makes it possible to provide a highly reliable optical transmitting module.

In this manner, the power consumption of the optical transmission system is successfully reduced, and the highly reliable optical transmission system is provided.

Fourth Aspect

In the following, a fourth aspect of the invention will be described.

In recent years, the amount of information that is exchanged and processed has been increasing exponentially as can be seen in the promulgation of the Internet, and such increase is expected to accelerate further. Because of this, optical fibers are beginning to be used not only in trunk systems but also in communication systems closer to users such as the subscriber systems of individual households and offices and LANs (local area networks), and are also beginning to be used for connections between and inside individual apparatuses, which makes large-capacity information transmission a vital technology.

As a light source for use in such technology, a semiconductor laser of a 1.3-micrometer band or a 1.55-micrometer band is necessary that incurs a little transmission loss on silica fibers and provides good matching characteristics. In order to achieve a market progress for application closer to users, further, communications systems must be provided at low costs.

For the 1.3-micrometer waveband and the 1.55-micrometer waveband, the system of materials used on the InP substrate are typical, and have been reliably used in edge emitting lasers. Such long-wavelength-band semiconductor lasers, however, have drawbacks in that the operating current increases three-folds when the ambient temperature increases from a room temperature to 80 degrees Celsius. In order to provide a low-cost system that does not use a cooling device, it is vital to develop long-wavelength-band semiconductor lasers that have better temperature characteristics.

The system of materials that can form a 1.3-micrometer-band semiconductor laser on a GaAs substrate has recently been attracting attention. Research has been directed to (Ga)InAs quantum dots, GaAsSb, and GaInNAs (e.g., Patent Document 1). Especially, GaInNAs is recognized as a material that substantially suppresses the temperature dependency of laser characteristics. Here, materials of the GaInNAs system include other Group-III-V elements such as P, Sb, and Al.

GaInNAs is a Group III-V mixed-crystal semiconductor that contains nitrogen (N) and other Group V elements. In GaInNAs, the addition of nitrogen (N) to GaInAs having a larger lattice constant than GaAs provides for the latice constant to be matched with that of GaAs. Further, band-gap energy is reduced to make it possible to emit light in the 1.3-micrometer band or the 1.55-micrometer band.

In Non-Patent Document 1, for example, Kondo et. al. calculate the band lineup of GaInNAs. GaInNAs has band-gap energy that is reduced by the addition of nitrogen (N). Since the energy of the conduction band and the valence band also lowers, the discontinuity of the conduction band becomes significantly large compared with GaAs matched-latice materials such as GaInP, AlGaAs, and GaAs. This is expected to provide for a semiconductor laser having superior temperature characteristics. A 10% In composition with a 3% nitrogen composition can produce 1.3-micrometer band. However, there is a problem in that the threshold current density increases rapidly as the nitrogen composition increases.

Figure 36:
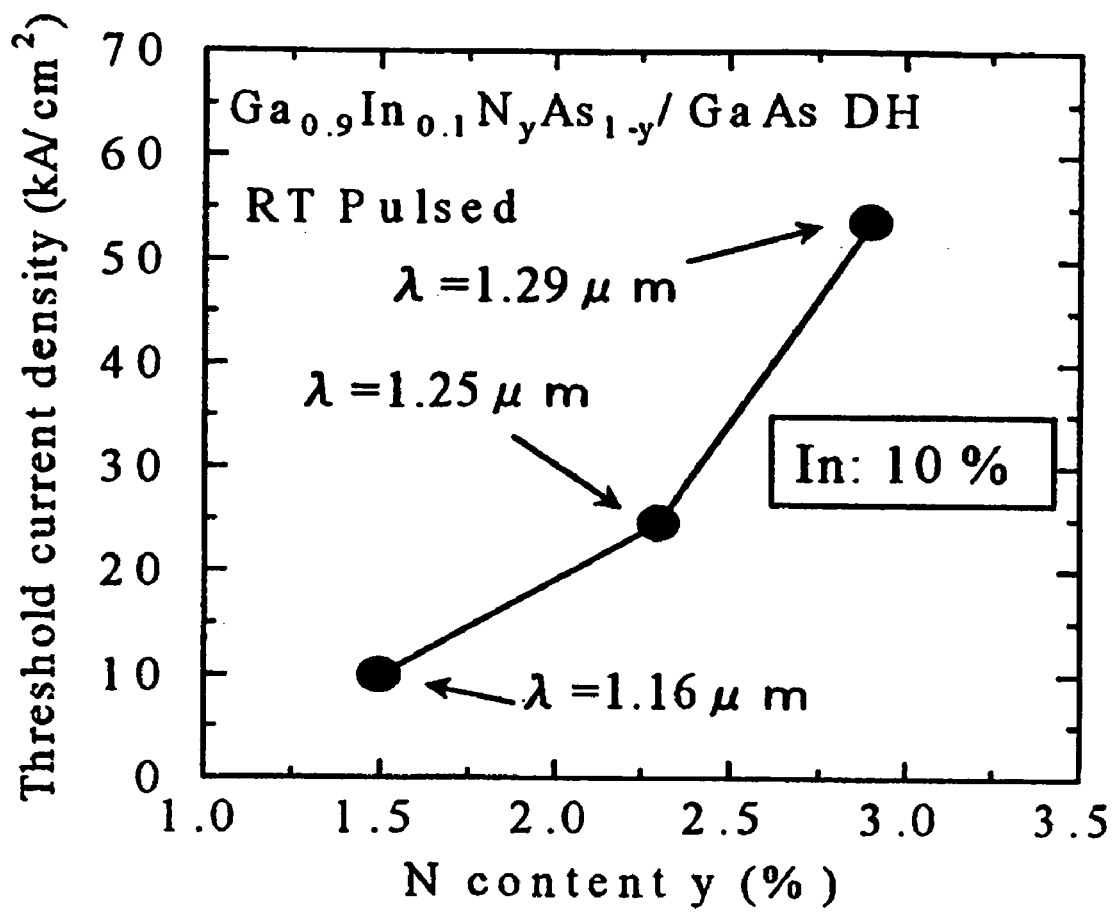
FIG. 36 is a chart showing a threshold current density that is dependent on the nitrogen composition according to experiments.

FIG. 36 is a chart showing a threshold current density that is dependent on the nitrogen composition according to experiments. The horizontal axis represents the percentage (%) of nitrogen composition, and the vertical axis represents the threshold current density. As shown in FIG. 36, the threshold current density increases rapidly with the increase of nitrogen composition. This is because the crystallinity of the GaInNAs layer deteriorates with the increase of nitrogen composition. As a counter measure, the In composition is raised while the nitrogen composition is lowered (e.g., Patent Document 2 and Patent Document 3), with the use of a GaInNAs-system quantum well active layer that has a compressive strain as large as 2% or more relative to the substrate. Based on this construction, some studies (e.g., Non-Patent Document 2) provide a laser device that has a characteristic temperature exceeding 200 K, with the threshold current density of the semiconductor laser being smaller than 1 kA/cm$^2$, and the operating current increasing only 1.3 times even when the ambient temperature rises from room temperature to 80 degrees Celsius. A GaAs layer is used for the barrier layer. When the GaInNAs-system quantum well active layer having a compressive strain is employed, GaAs is often used for the barrier layer.

In the presence of such a high strain, however, there is a need to secure film growth close to a critical film thickness at which three-dimensional growth takes the place of two-dimensional growth. A technique must be contrived for this purpose. For example, a method that achieves a surfactant-like effect by adding Sb and facilitates two-dimensional growth while suppressing three-dimensional growth is known (e.g., Patent Document 3). The growth method is the MBE method. With respect to the MBE method, there is a report about an example in which Sb and N are added in both the barrier layer and the quantum well active layer (Electronics Letters, Vol. 38, No. 6 (2002), pp. 277–278). The barrier layer and the well layer has the same Sb composition, and the N composition is larger for the barrier layer.

However, the addition of Sb to the GaInNAs quantum well active layer results in an increased compressive strain relative to a GaAs substrate. Because of this, the amount of added Sb should preferably be as small as possible.

Moreover, it is known that in a growth method such as the MOCVD method using an organic metal or a hydride material, the Sb composition is strongly dependent on the ratio of Group-V supplies. For example, there are reports about the facts that in the growth of GaNAsSb, an increase in the N supply causes an extremely small Sb composition (Non-patent Document 3), and the use of Sb raw material suppresses an N composition (Non-patent Document 4). These facts indicate that the control of compositions is extremely difficult.

[Patent Document 1] Japanese Patent Application Publication No. 6-37355

[Patent Document 2] Japanese Patent Application Publication No. 2000-332363

[Patent Document 3] Japanese Patent Application Publication No. 2002-118329

[Non-Patent Document 1] Jpn. J. Appl. Phys. Vol. 35(1996), pp. 1273–1275

[Non-Patent Document 2] Jpn. J. Appl. Pyys. Vol. 39 (2000), pp. 3403–3405

[Non-Patent Document 3] Uesugi et al., The 62nd Japan Society of Applied Physics, 13p-T-13

[Non-Patent Document 4] Tateno et al., The 62nd Japan Society of Applied Physics, 13p-T-12

Accordingly, there is a need for a semiconductor light emitter, an optical transmission module, an optical transceiver module, and an optical communication system, in which a semiconductor light emitter using a GaInNAs-type quantum well active layer with a compressive strain provides improved active layer quality, high light emission efficiency, and a low threshold.

In the following, embodiments of the invention will be described with reference to accompanying drawings.

(First Embodiment)

In the first embodiment of the invention, a semiconductor light emitter has an active layer that is comprised of a quantum well active layer including nitrogen (N) and other Group-V elements and having a compressive strain relative to a GaAs substrate and barrier layers formed alongside the quantum well active layer. In the active layer, the barrier layers are made of a Group-III-V mixed-crystal semiconductor inclusive of antimony (Sb) while the quantum well active layer is formed without antimony (Sb).

Epitaxial growth proceeds under the influence of a base. In the growth of a quantum well active layer having a strain, the early stage of growth (e.g., first layer) where different types of materials are combined to create a heterostructure is most important, and there is a need to secure two-dimensional growth at the early stage of growth. The surface of a barrier layer serving as a base includes Sb, which provides a surfactant-like effect that facilitates two-dimensional growth by suppressing three-dimensional growth through lowering of surface energy. At the early stage of growth, therefore, the quantum well active layer having a strain achieves satisfactory two-dimensional growth. Thereafter, epitaxial growth continues on the earlier grown portion of an active layer to form the remaining portion of the active layer made of the same material, thereby achieving satisfactory two-dimensional growth until the critical film thickness is reached. In this manner, satisfactory two-dimensional growth is achieved even if Sb is not included in the quantum well active layer having a strain.

Further, since the quantum well active layer does not include Sb which makes a lattice constant larger than a GaAs substrate, there is no increase in the lattice constant of the quantum well active layer. This successfully prevents undesired side effects such as lattice relaxation caused by an increase in the lattice constant, three-dimensional growth, etc.

(Second Embodiment)

The second embodiment of the invention differs from the semiconductor light emitter of the first embodiment in that the barrier layers also include nitrogen (N).

In the second embodiment, the inclusin of N in the barrier layers provides the following advantages. A high-quality interface is provided between the barrier layers and the quantum well active layer. Specifically, when the MOCVD method is employed to grow a GaInNAs-type material, the supply of an N raw material needs to be in such a large quantity that the mole percentage relative to the supply of an As raw material ("N raw material"/("N raw material"+"As raw material")) exceeds 0.9. Since the N raw material needs to be supplied in large quantity, it is difficult to achieve diligent control of on/off of the raw material supply, i.e., to achieve diligent control at an interface. Moreover, growth by the MBE method is sustained by supplying an N raw material activated by RF or the like, which makes it difficult to achieve speedy on/off switching. Like the MOCVD method, it is thus difficult to achieve diligent control at an interface. With the provision of N added to the barrier layers, however, there is no need to control the on/off switching of raw material supply at the interface, thereby providing better control at the interface.

Moreover, since the lattice constant of GaSb is 6.094 angstroms, a compressive strain of 0.0780% per 1% Sb is obtained relative to GaAs. A compressive strain of the barrier layer causes reduction in the critical layer thickness of the quantum well active layer, which has a compressive strain and grows on the barrier layer. This is not desirable.

Since the lattice constant of GaN having a zinc blende structure is 4.5 angstroms, a 0.204% tensile strain per 1% N is obtained relative to GaAs. The addition of N to the barrier layer containing Sb thus successfully compensate for a strain caused by the addition of Sb, thereby avoiding reduction in the critical layer thickness of the quantum well active layer having a compressive strain. As a method of compensating for a strain caused by the addition of Sb, the addition of phosphorus (P) may as well serve a purpose besides the addition of N.

(Third Embodiment)

In the third embodiment of the invention, a semiconductor light emitter has an active layer that is comprised of a quantum well active layer including nitrogen (N) and other Group-V elements and having a compressive strain relative to a GaAs substrate and barrier layers formed alongside the quantum well active layer. In the active layer, the barrier layers are made of a Group-III-V mixed-crystal semiconductor inclusive of antimony (Sb) and nitrogen (N) while the quantum well active layer has a Sb concentration smaller than the Sb concentration of the barrier layer, or is formed without antimony (Sb) while having a larger N concentration than the barrier layer.

As previously described, epitaxial growth proceeds under the influence of a base. In the growth of a quantum well active layer having a strain, the early stage of growth creating a heterostructure is most important. The surface of a barrier layer serving as a base includes Sb, which provides a surfactant-like effect that facilitates two-dimensional growth by suppressing three-dimensional growth through lowering of surface energy. At the early stage of growth, therefore, the quantum well active layer having a strain achieves satisfactory two-dimensional growth. Thereafter, the epitaxial growth of the same material continues on the earlier grown portion of an active layer, thereby achieving satisfactory two-dimensional growth until the critical film thickness is reached. In this manner, satisfactory two-dimensional growth is achieved even if Sb is not included in the quantum well active layer having a strain. Needless to say, the quantum well active layer may include Sb in minute quantity.

Moreover, since the quantum well active layer does not include Sb which increases the lattice constant above that of the GaAs substrate, or, even if present, Sb is provided in minute amount smaller than the Sb concentration of the barrier layer, the lattice constant does not exceed that of the conventional structure. This successfully prevents lattice relaxation caused by an increased lattice constant, three-dimensional growth, etc.

The advantages attained by the addition of N to the barrier layer have been described in connection with the second embodiment. In the third embodiment, a smaller N composition of the barrier layer than the N composition of the quantum well active layer provides satisfactory temperature characteristics that are as good as when no N is added to the barrier layer. With 1% of N added to GaAs, a band gap decreases 156 meV, and a conduction band falls 175 meV, with the valence band dropping 19 meV (see "16th Semiconductor Laser Symposium" by Kitatani et. al.). In this manner, a minute addition of N results in a significant drop of the conduction band. When the N composition of the barrier layer is larger than that of the quantum well active layer, the drop of conduction band energy of the barrier layer becomes significant in comparison, resulting in the discontinuity of a conduction band being smaller than in the case where the quantum well active layer and the barrier layer are both formed from materials with no added N. This degrades the temperature characteristics of a semiconductor laser. Materials with no added N that can be used for the quantum well active layer and the barrier layer may be GaInAs for the quantum well active layer and GaAs for the barrier layer, for example. As shown in IEEE Photon. Technol. Lett. Vol. 12 (2000), pp. 125–127, such combination of materials provides a good temperature characteristic of 140K–170K, achieving sufficient discontinuity in the conduction band. When the N composition of the barrier layer is smaller than the N composition of the quantum well active layer, on the other hand, the drop of conduction band energy of the quantum well active layer is larger in comparison, attaining sufficient discontinuity in the conduction band, and providing a semiconductor laser having good temperature characteristics. In epitaxial growth, the crystalline quality of a base material greatly affects the quality of a growing layer. There is a tendency that an increased N composition causes the degradation of crystallinity. When the N composition of the barrier layer is smaller than the N composition of a quantum well active layer, the crystallinity of the barrier layer used as the base layer for growth of the quantum well active layer improves. As a result, the crystallinity of the quantum well active layer also improves.

It is not easy, however, to achieve the N composition of a barrier layer smaller than the N composition of a quantum well active layer, especially in the MBE method. In the case of the MBE method, a hetero structure is generally formed by controlling the on/off state of a shutter. When the hetero structure of GaInNAs and GaNAs is to be formed, for example, the on/off state of a shutter is controlled for In. A growth rate is thus faster for GaInNAs. In the MBE method, the N composition becomes large when a growth rate is slow. Since the In-composition dependency of N inclusion is small, the N composition becomes larger in the GaNAs barrier layer. If a growth rate is to be changed, the amount of raw material supply must be controlled by changing the temperature of a raw material cell. Since such procedure takes time, optimization for growth suspension periods needs to be provided, making it a rather difficult option. Such difficulties can be avoided, however, by providing a plurality of Ga raw material cells with a function to change the amount of raw material supply on a cell-by-cell basis. The supply of Ga of a cell used for the growth of a quantum well active layer is set smaller than the supply of Ga of a cell used for the growth of a barrier layer, and switching is made between GaInNAs and GaNAs at the time of growth. In the case of the MOCVD method, the In-composition dependency of N inclusion is quite high, and the rate of N inclusion drops rapidly with the In composition. Because of this, a ratio of As to N in the raw material supply needs to be significantly changed. Such a need can be addressed by controlling the amount of raw material gas supply by use of a mass-flow controller having a fast response rate.

In the semiconductor light emitter of the first (also second and third) embodiment, the barrier layer is formed of GaAsSb, GaNAsSb, GaInNAsSb, GaNPAsSb, GaPAsSb, GaInNPAsSb, GaInPAsSb, GaInAsSb, or the like.

(Fourth Embodiment)

The fourth embodiment of the invention differs from the semiconductor light emitter of the first, second, and third embodiments in that the barrier layer or intermediate layer including Sb has a tensile strain relative to the GaAs substrate.

The use of a barrier layer having a tensile strain relative to the quantum well active layer having a compressive strain achieves a strain-compensated structure, which creates synergy with the addtion of Sb, thereby improving the crystallinity of the quantum well active layer. Furthermore, the reduction of a strain in the active layer makes it possible to increase the number of wells. This provides greater latitude in the design of a multiple quantum well active layer.

(Fifth Embodiment)

In the fifth embodiment of the invention, a semiconductor light emitter has an active layer that is comprised of a quantum well active layer including nitrogen (N) and other Group-V elements and having a compressive strain relative to a GaAs substrate and barrier layers formed alongside the quantum well active layer. Between the quantum well active layer and the barrier layers, an intermediate layer made of a Group-III-V mixed-crystal semiconductor inclusive of antimony (Sb) is formed.

In order to provide a surfactant-like effect that facilitates two-dimensional growth by suppressing three-dimensional growth through lowering of surface energy, Sb does not necessarily need to be added to the entire barrier layer. For the attainment of the effect described above, it suffices to include Sb in a surface layer of the growth base on which the quantum well active layer having a strain starts to grow. If a material that does not include Sb is used for a barrier layer, the insertion of an intermediate layer inclusive of Sb between the barrier layer and the quantum well active layer having a strain can improve the crystallinity of the quantum well active layer. Needless to say, Sb may as well be included in the barrier layer.

In the semiconductor light emitter of the fifth embodiment, the intermediate layer described above is formed of GaAsSb, GaNAsSb, GaInNAsSb, GaNPAsSb, GaPAsSb, GaInNPAsSb, GaInPAsSb, GaInAsSb, or the like.

(Sixth Embodiment)

In the sixth embodiment of the invention, the semiconductor light emitter of the fifth embodiment is configured such that the barrier layer has a tensile strain relative to a GaAs substrate, and the lattice constant of the intermediate layer containing Sb is larger than that of the barrier layer and smaller than that of the quantum well active layer.

The quantum well active layer having a large compressive strain and the barrier layer having a tensile strain are stacked together to provide a strain-compensated structure, thereby reducing (compensating for) the strain of the active layer. Since the strain is increased at the interface, a strain compensation effect may not be achieved. The insertion of an intermediate layer having a medium lattice strain between the compressive strain layer and the tensile strain layer provides for strain reduction, thereby successfully providing a strain compensation effect.

(Seventh Embodiment)

According to the seventh embodiment of the invention, a semiconductor light emitter having a quantum well active layer including both nitrogen (N) and other Group-V elements is configured such that the quantum well active layer is comprised of stacked layers in which A layers including In, Sb, and other Group-V elements and B layers including a zero or larger composition of In smaller than that of the A layers, N, and other Group-V elements are stacked one over the other in cyclic arrangement.

In order to provide a surfactant-like effect that facilitates two-dimensional growth by suppressing three-dimensional growth through lowering of surface energy, the quantum well active layer may as well be comprised of stacked layers in which A layers including In, Sb, and other Group-V elements and B layers including a zero or larger composition of In smaller than that of the A layers, N, and other Group-V elements are stacked one over the other in a short-cycle super lattice structure.

Microscopic surface distribution of N composition increases as the composition of N increases. When In is also included, distribution becomes even larger. As it progresses, three-dimensional growth will take place. It is thus desirable to avoid the inclusion of both N and In at the same time. In the MOCVD method, it is not easy to add Sb to a mixed crystal inclusive of both N and other Group-V elements, so that it is desirable to avoid the inclusion of both N and Sb at the same time. On a GaAs substrate, therefore, it is desirable to use a quantum well active layer having a short-cycle super lattice structure in which layers including In, As, and Sb and layers including N and As are stacked one over the other in cyclic arrangement.

The quantum well active layer as described above has the A layers and B layers stacked one over the other with a thickness of each layer being a few atoms and without inclusion of both N and Sb at the same time, and may thus be regarded as a mixed crystal having an average composition of the A layers and B layers.

In the semiconductor light emitter of the seventh embodiment, GaInAsSb, GaNAs, etc., may be used for the A layers (including In, Sb, and other Group-V elements) and the B layers (including N and other Group-V elements excluding In) that constitute the quantum well active layer having a short-cycle super lattice structure.

If the A layers are made of GaInAsSb, and the B layers are made of GaNAs, for example, it is possible to produce psudo GaInNAsSb while real GaInNAsSb is a mixed crystal that includes In, Sb, N, and other Group-V elements, and is difficult to be grown by use of the MOCVD method. Moreover, the use of GaInNAs presents the problem of three-dimensional growth caused by the segregation of In composition in the presence of added N. Since In is entrapped in the A layers, and N is entrapped in the B layers, however, three-dimensional growth is successfully suppressed.

Although the GaInAsSb layer includes In and has a compressive strain, added Sb produces a surfactant-like effect to suppress three-dimensional growth of the GaInAsSb layer. Also, the inclusion of Sb in the base crystal for the growth of a GaNAs layer successfully reduces the segregation of N composition in the GaNAs layer.

Here, the A layers may include N as long as its quantity is smaller than that of the B layers. The B layers may include In as long as its quantity is smaller than that of the A layers. Moreover, both of the layers may include another Group-III-V element such as P.

When the semiconductor light emitter of the first through seventh embodiments is to be produced, at least the active layer is preferably formed through crystal growth by the MOCVD method. That is, the semiconductor light emitter of the invention is especially effective for crystal growth by the MOCVD method. In the growth method such as the MOCVD method involving the reaction of raw materials using an organic metal or a hydride material, the Sb composition largely depends on the supply ratio of Group-V materials. It is thus not easy to add Sb to the layer already including N and other Group-V elements. If In is not included, however, sufficient growth can be attained. If In is included, there exists an extreme difficulty. The GaInNAs-type quantum well active layer typically includes 30% to 40% In. In the MOCVD method, an increase in the In composition causes a sharp decline in the inclusion of N, which makes it necessary to supply a large quantity of N raw material. The further addition of Sb is thus extremely difficult. The invention improves crystallinity when the quantum well active layer (or the B layers that mainly include N) includes no Sb or a minute amount of Sb. The invention is thus particularly effective for use with the MOCVD method.

Moreover, the semiconductor light emitter of each embodiment described above may be implemented as a surface emitting semiconductor laser.

In order to achieve high-capacity optical networks and optical fibers at low costs without any regard to distance, a semiconductor laser of a 1.3-micrometer band or a 1.55-micrometer band is necessary as a light source that incurs a little transmission loss on silica fibers and provides good matching characteristics, and such semiconductor laser needs to have proper temperature characteristics without a need for a cooling device. To this end, a surface emitting laser device (VCSEL: vertical cavity surface emitting laser) is quite suitable. The surface emitting semiconductor laser is better suited for cost reduction, power consumption reduction, miniaturization, 2-dimensional circuit integration than the edge emitting laser. In actuality, a 0.85-micrometer-band laser that can be formed on a GaAs substrate has been put to practical use in the 1 Gbit/sec Ethernet of a high-speed LAN. The use of GaInNAs-type materials for an active layer in the surface emitting semiconductor laser makes it possible to cope with such wavelengths.

Further, with the provision of the barrier layers or intermediate layers inclusive of Sb in direct contact with the quantum well active layer, the two-dimensional growth of the active layer is satisfactorily achieved, thereby producing a long-wavelength surface emitting semiconductor laser that has high emission efficiency and a low threshold. In addition, the use of the MOCVD method makes it possible to reduce the resistance of semiconductor distributed Bragg reflectors of a surface emitting laser. This is preferable as low-voltage drive is achieved.

Moreover, an optical transmitting module may be implemented by using the surface emitting semiconductor laser of the invention as a light source.

The surface emitting semiconductor laser of the invention as described above, which has low resistance and operates at a low voltage and at a low threshold current with satisfactory temperature characteristics, may be utilized to provide an optical transmitter module at low costs without a need for a cooling device.

Moreover, the surface emitting semiconductor laser of the invention may be used as a light source of an optical transceiver module.

The surface emitting semiconductor laser of the invention as described above, which has low resistance and operates at a low voltage and at a low threshold current with satisfactory temperature characteristics, may be utilized to provide an optical transceiver module at low costs without a need for a cooling device.

Moreover, the surface emitting semiconductor laser of the invention may be used as a light source of an optical communication system.

The surface emitting semiconductor laser as described above, which has low resistance and operates at a low voltage and at a low threshold current with satisfactory temperature characteristics, may be utilized to provide an optical communication system such as an optical fiber communication system and an optical interconnection system at low costs with no need for a cooling device.

EXAMPLE 1

Figure 37:
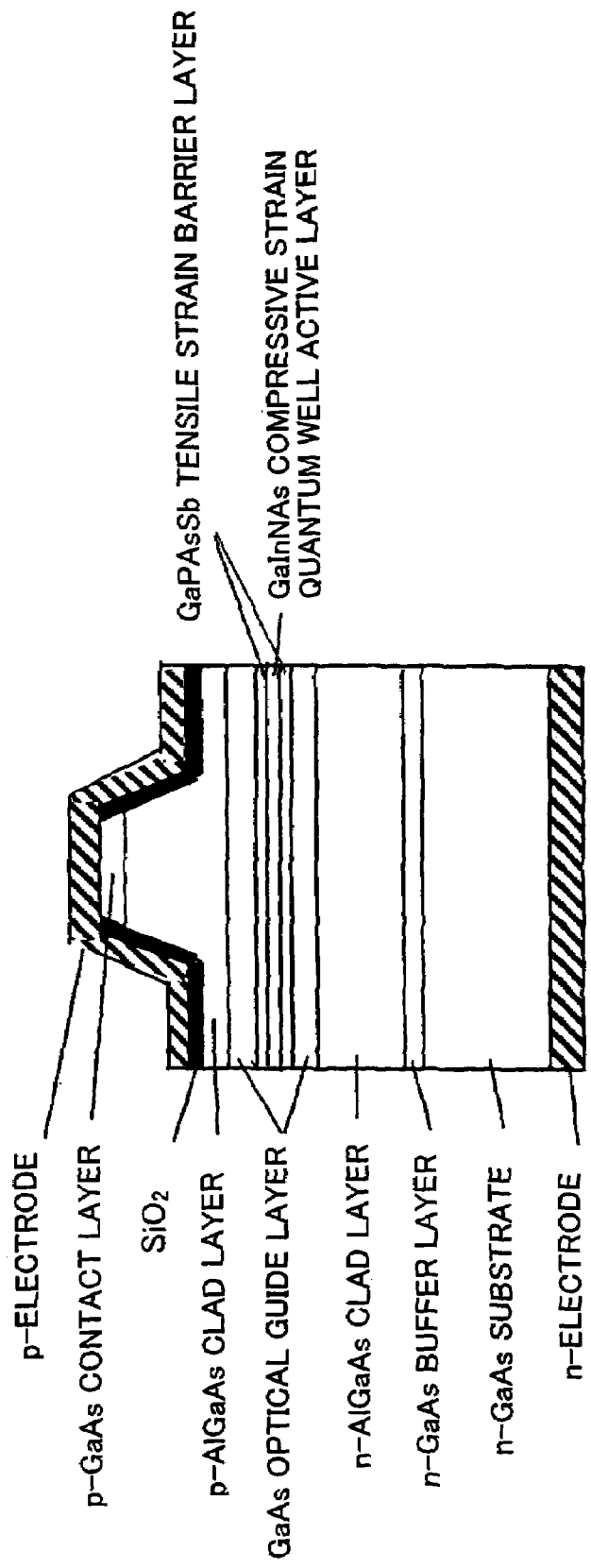
FIG. 37 is a drawing showing a GaInNAs edge emitting semiconductor laser according to a first example of the invention.

FIG. 37 is a drawing showing a GaInNAs edge emitting semiconductor laser according to the first example of the invention. An example of FIG. 37 shows a ridge-stripe-type laser. The GaInNAs edge emitting semiconductor laser of FIG. 37 has a SCH-SQW (separate confinement heterostructure single quantum well) layer structure.

In the example of FIG. 37, a Se dope n-GaAs buffer layer, a Se dope n-AlGaAs lower clad layer, an undope GaAs lower light guide layer, an active layer, an undope GaAs upper light guide layer, a Zn dope p-AlGaAs upper clad layer, and a Zn dope p-GaAs contact layer are successively formed by growing on an n-GaAs substrate with a plane direction (100).

The active layer includes a single GaInNAs quantum well active layer (well layer) having a compressive strain and GaPAsSb barrier layers that are formed on both sides of the well layer and exhibit lattice matching with the substrate. The well layer has an In-composition x of 35% and a nitrogen (N) composition of 0.8%. The thickness of a well layer is 8 nm. The MOCVD method was used as a growth method. $H_2$ was used as a carrier gas. As raw materials, TMG (trimethyl gallium), TMI (trimethyl indium), $AsH_3$ (arsine), and $PH_3$ (phosfin) were used. As a raw material for nitrogen, DMHy (dimethyl hydrazine) was used. Since DMHy is decomposed at low temperature, it is suitable for low-temperature growth below 600 degrees Celsius. In the first example, the GaInNAs layer was grown at 550 degrees Celsius. When a quantum well layer having a large strain is to be grown, low-temperature growth around 500–600 degrees Celsius is desirable. The GaPAsSb barrier layer was also grown at the same 550 degrees Celsius as the GaInNAs layer.

Photolithography and etching were performed to remove layers to a depth of the middle of the p-AlGaAs layer while leaving a 3-micrometer stripe region, thereby forming a ridge structure. A p-side electrode was then formed on the ridge structure while inserting an insulating film, part of which was removed to allow the injection of an electric current. Further, an n-side electrode was formed on the bottom surface of the substrate.

In the first example, the GaPAsSb barrier layer is formed between the GaAs optical guide layer and the GaInNAs quantum well active layer. The lattice constant decreases 0.036% per 1% P relative to GaAs, and increases 0.078% per 1% Sb relative to GaAs. In order to provide lattice matching, the P composition was 2.2 times as large as the Sb composition. Specifically, the P composition was 6%, and the Sb composition was 2.7%.

In the first example, since the quantum well active layer does not include Sb which makes a lattice constant larger than a GaAs substrate, there is no increase in the lattice constant of the quantum well active layer. This successfully prevents undesired side effects such as lattice relaxation caused by an increase in the lattice constant, three-dimensional growth, etc.

The barrier layer serving as a base for the growth of the GaInNAs quantum well active layer having a large compressive strain includes Sb, which provides a surfactant-like effect that facilitates two-dimensional growth by suppressing three-dimensional growth through lowering of surface energy. This improves the crystallinity of the quantum well active layer, and provides a semiconductor laser that has high emission efficiency and a low threshold.

Furthermore, the inclusion of P in the barrier layers makes the band discontinuity of its conduction band larger than that of a conventional GaAs barrier layer, reducing the overflowing of carriers (electrons). Even though only a single well layer is provided, thus, temperature characteristics are satisfactory.

Moreover, in the growth method such as the MOCVD method involving the reaction of raw materials using an organic metal or a hydride material, the Sb composition largely depends on the supply ratio of Group-V materials. It is thus not easy to add Sb to the layer already including N and other Group-V elements. The GaInNAs-type quantum well active layer typically includes 30% to 40% In. In the MOCVD method, an increase in the In composition causes a sharp decline in the inclusion of N, which makes it necessary to supply a large quantity of N raw material. The further addition of Sb is thus extremely difficult. In the first example, the MOCVD method is employed for crystal growth. Since Sb is not included in the quantum well active layer, the crystal growth of the quantum well active layer becomes easy, compared with the case where Sb is included.

Although the above example has been described with reference to an example in which the MOCVD method is used for growth, other growth methods such as the MBE method may as well be used. Moreover, although DMHy is used as the raw material of nitrogen, activated nitrogen or other nitrogen compounds such as $NH_3$ may instead be used.

In the first example, GaPAsSb was used for the barrier layer. The barrier layer suffices as long as Sb is included, and may be made of GaAsSb, GaN AsSb, GaInNAsSb, GaNPAsSb, GaInNPAsSb, GaInPAsSb, or GaInAsSb instead of GaPAsSb.

Although the example of FIG. 37 shows a single quantum well structure (SQW) as an example of a stacked layer structure, a multiple quantum well structure may also be used. The thickness of a layer of each composition may be determined according to needs. An AlGaInP-type material having a wide gap may be used for a clad layer in the same manner as AlGaAs-type material is used. Moreover, a laser structure may be altered to other structures.

EXAMPLE 2

Figure 38:
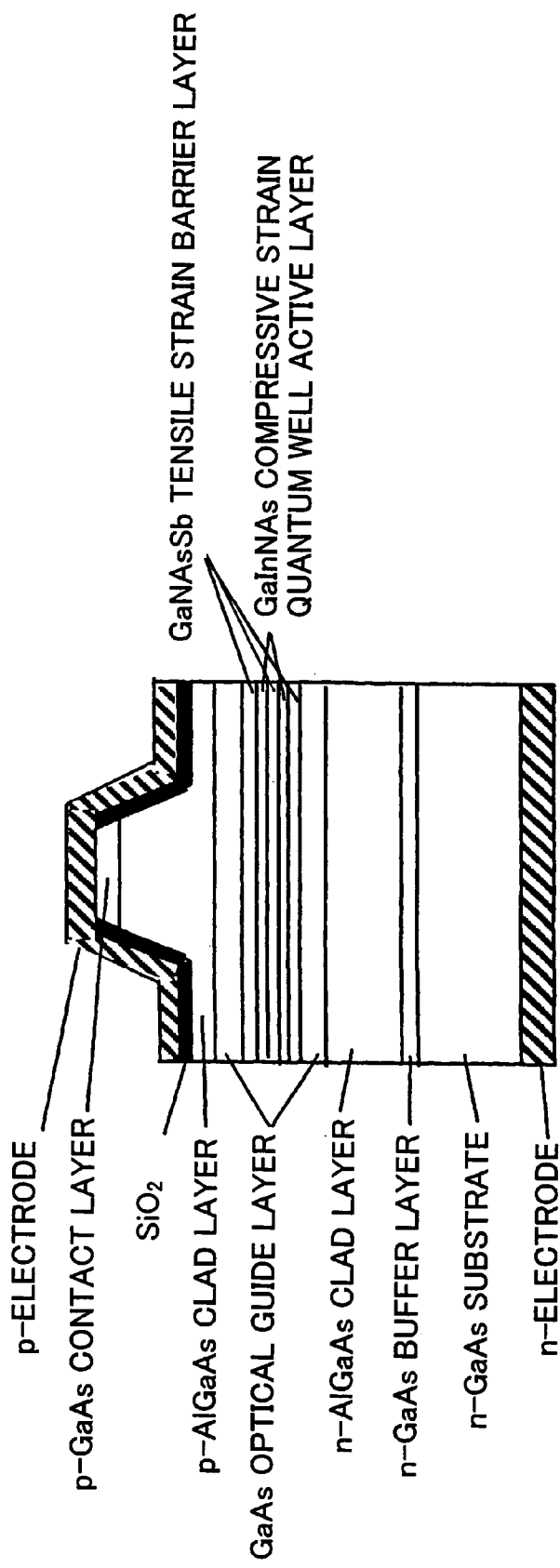
FIG. 38 is a drawing showing a GaInNAs edge emitting semiconductor laser according to a second example of the invention.

FIG. 38 is a drawing showing a GaInNAs edge emitting semiconductor laser according to a second example of the invention. The second example differs from the first example in that the quantum well active layer (well layer) is formed as two layers, with barrier layers formed alongside these layers being made of GaNAsSb having a tensile strain.

In GaNAsSb, a 0.204% tensile strain per 1% N is obtained relative to GaAs. Also, a 0.078% compressive strain per 1% Sb is obtained. In order to provide a tensile strain, therefore, the N composition was set larger than 0.38 times the Sb composition. Specifically, an N composition of 1.5% and an Sb composition of 2% were used. In this manner, barrier layers having a tensile strain were used in respect of the quantum well active layers having a compressive strain, thereby providing a strain-compensated structure. Although two layers were provided as the well layer, a synergy effect with the effect of added Sb improved the crystallinity of the quantum well active layer.

In epitaxial growth, the crystalline quality of a base material greatly affects the quality of a growing layer. When the MOCVD method is employed to grow GaInNAs-type materials, the supply of an N raw material needs to be in such a large quantity that the mole percentage relative to the supply of an As raw material ("N raw material"/("N raw material"+"As raw material")) exceeds 0.9. Since the N raw material needs to be supplied in large quantity, it is difficult to achieve diligent control of on/off of the raw material supply, i.e., to achieve diligent control at an interface. Moreover, growth by the MBE method is sustained by supplying an N raw material activated by RF or the like, which makes it difficult to achieve speedy on/off switching. Like the MOCVD method, it is thus difficult to achieve diligent control at an interface. With the provision of N added to the barrier layers as in the second example, however, there is no need to control the on/off switching of raw material supply at the interface, thereby providing better control at the interface. This provides a semiconductor laser having higher emission efficiency and a lower threshold.

EXAMPLE 3

Figure 39:
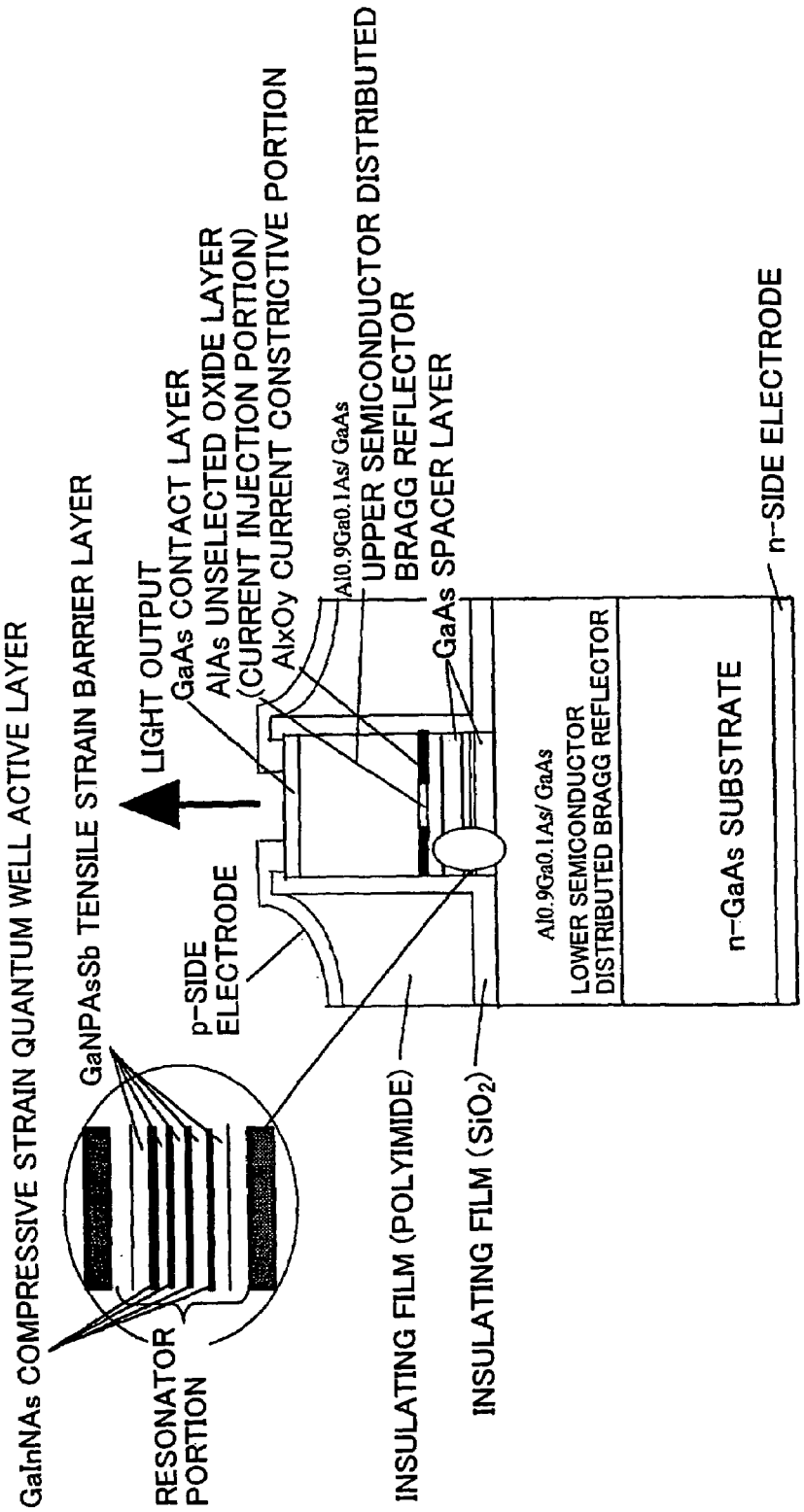
FIG. 39 is a drawing showing a GaInNAs surface emitting semiconductor laser according to a third example of the invention.

FIG. 39 is a drawing showing a GaInNAs surface emitting semiconductor laser according to the third example of the invention. As shown in FIG. 39, the surface emitting semiconductor laser of the third example includes an n-semiconductor distributed Bragg reflector (lower-side semiconductor distributed Bragg reflector), which is formed on an n-GaAs substrate that is 3 inches wide and has a plane direction (100). This lower-side reflector has a structure in which n-AlxGa1-xAs (x=0.9) and n-GaAs each ¼ times as thick as the oscillation wavelength inside the respective medium are alternately repeated 35 cycles.

On top of the reflector are formed an undope lower GaAs spacer layer, an active layer including four GaInNAs quantum well active layers and five GaNPAsSb barrier layers, and an undope upper GaAs spacer layer.

On top of these layers, p-semiconductor distributed Bragg reflector (upper-side semiconductor distributed Bragg reflector) is formed. The upper-side reflector is comprised of a periodic structure (e.g., 25 cycles) in which C-dope p-$Al_xGa_{1-x}$As (x=0.9) and p-GaAs, each ¼ times as thick as the oscillation wavelength inside the respective medium, are alternately stacked one over the other. In addition, an unselected oxide layer of AlAs is formed to a thickness of 30 nm in the upper-side reflector at a position near the active layer. Moreover, the GaAs layer at the top of the upper-side reflector also serves as a contact layer for providing a contact with an electrode.

In the third example, the In-composition x of the well layer in the active layer was 33%, and its nitrogen (N) composition was 1.0%. The well layer was 7 nm in thickness, and had about 2.1% compressive strain (high strain) relative to the GaAs substrate. The GaNPAsSb barrier layer had an N composition of 0.5%, a P composition of 9%, an Sb composition of 3%, and a thickness of 20 nm, and had a 0.2% tensile strain relative to the GaAs substrate.

The MOCVD method was employed as a growth method. H2 was used as a carrier gas. As raw materials for a GaInNAs active layer, TMG (trimethyl gallium), TMI (trimethyl indium), AsH3 (arsine), and PH3 (phosfin) were used. As a raw material for nitrogen, DMHy (dimethyl hydrazine) was used. Since DMHy is decomposed at low temperature, it is suitable for low-temperature growth below 600 degrees Celsius. It is especially suitable for the purpose of growing a large strain quantum well layer required to grow at low temperature. When an active layer having a large strain such as that of the GaInNAs surface emitting semiconductor laser of the third example is to be grown, low-temperature growth that achieves non-equilibrium is desirable. In the third example, the GaInNAs layer was grown at 540 degrees Celsius.

In the third example, a mesa having predetermined size is formed by exposing at least a lateral surface of p-AlAs layer, and AlAs with its lateral surface exposed is oxidized from the lateral surface by steam, thereby forming an $Al_xO_y$ current constrictive part. Polyimide was then embedded into the etched part for flattening, the polyimide then removed from the top of the upper-side reflector having a p contact portion and a light emitting portion, a p-side electrode formed on the p-contact layer excluding the light emitting portion, and an n-side electrode formed on the back surface of the substrate.

The oscillating wavelength of the surface emitting semiconductor laser produced in this manner was approximately 1.3 micrometers. Since GaInNAs was used for the active layer, the surface emitting semiconductor laser having a long wavelength band was successfully formed on the GaAs substrate.

In epitaxial growth, the crystalline quality of a base material greatly affects the quality of a growing layer. When the N composition of a barrier layer is smaller than the N composition of a quantum well active layer as in the third example, the crystallinity of the barrier layer used as the base layer for growth of the quantum well active layer improves. As a result, higher emission efficiency and a lower threshold current were achieved.

Moreover, the N composition of the barrier layers was smaller than the N composition of the quantum well active layer, so that the drop of conduction band energy caused by added N was larger in the quantum well active layer than in the barrier layers. This provides sufficiently large discontinuity in the conduction band, resulting in a surface emitting semiconductor laser having satisfactory temperature characteristics.

Although the N composition of the barrier layers was small, the addition of P produced a sufficient tensile strain composition. Despite the use of an active layer having a large compressive strain, therefore, the number of wells was able to be increased without creating crystalline defects, successfully producing a high-power output, and improving the reliability of the device through strain reduction.

Moreover, a current was constricted by selective oxidization of the p-AlAs layer which had Al and As as main components, thereby achieving a low threshold current. With the current constrictive structure using a current constrictive layer that was comprised of an Al oxide film obtained by selective oxidization of an oxide layer, the current constrictive layer was formed close to the active layer to suppress the spreading of a current, thereby efficiently entrapping carries in a small area that was not exposed to atmosphere. The Al oxide film obtained through further oxidization reduced a refraction index, which created a convex lens effect to focus light at the small area where carriers were entrapped. This achieved a significantly high efficiency, and reduced the threshold current. Moreover, a simple step was able to form the current constrictive structure, resulting in the reduction of manufacturing costs.

The MBE method is mainly employed for producing semiconductor layers such as GaInNAs layers including nitrogen and other Group-V materials. Since this method requires growth in high vacuum, however, the amount of raw material supply cannot be increased. That is, an increase in the amount of raw material supply entails the excess load on the exhaust system. An exhaust pump of a high vacuum exhaust system is thus needed. With the use of such an exhaust pump, the exhaust system suffers the excess load when removing residual raw materials and the like from the MBE chamber. This results in a likely malfunction and thereby a poor throughput.

A surface emitting semiconductor laser includes multilayer semiconductor film reflectors and an active region sandwiched between the reflectors where the active region includes at least one active layer for emitting laser light. The thickness of a crystal growth layer of an edge emitting laser is about 3 micrometers. A surface emitting semiconductor laser of a 1.3-micrometer wavelength band requires a thickness exceeding 10 micrometers for a crystal growth layer. Since the MBE method does not allow the amount of raw material supply to be increased due to the necessity of high vacuum, a growth rate can only be 1 micrometer per hour. Growing a layer to a thickness of 10 micrometers requires at least 10 hours without taking into account growth suspension periods that are needed to change the amount of raw material supply.

The thickness of an active region is generally very thin compared with the total thickness (10% or less), and most layers are accounted for by the multi-layer film reflectors. A multi-layer semiconductor film reflector is formed by stacking a low-refractive-index layer and a high-refractive-index layer alternately one over the other (e.g., 20–40 times) where each layer is ¼ times as thick as the oscillation wavelength in the respective medium ($\lambda/4$). In the surface emitting semiconductor laser on the GaAs substrate, AlGaAs-type materials are used, and Al composition is changed to create a low-refractive-index layer (large Al composition) and a high-refractive-index layer (small Al composition). In actuality, resistance becomes large on the p side due to the hetero barrier of each layer. In consideration of this, an intermediate layer having a medium Al composition is inserted between a low-refractive-index layer and a high-refractive-index layer so as to reduce the resistance of a multi-layer film reflector.

As described above, the manufacturing of a surface emitting semiconductor laser involves growing more than 100 semiconductor layers having different compositions, with a need for an intermediate layer between the low-refractiveindex layer and a high-refractive-index layer. There is thus a need for instant control of the amount of raw material supply. In the MBE method, however, the amount of raw material supply is controlled by changing the temperature of a materials cell, which prohibits the flexible control of compositions. It is thus difficult to reduce the resistance of a multi-layer semiconductor film reflector grown by the MBE method, and the operating voltage is generally high.

On the other hand, controlling the amount of raw material gases is all that is necessary in the MOCVD method for achieving the instant control of compositions, without a need for high vacuum unlike the MBE method. A growth rate can be increased to 3 micrometers per hour, for example, thereby easily boosting throughput. The MOCVD method is thus suitable for mass production.

In the third example as described above, a surface emitting semiconductor laser of a 1.3-micrometer band with low resistance and low power consumption is provided at low costs.

EXAMPLE 4

Figure 40:
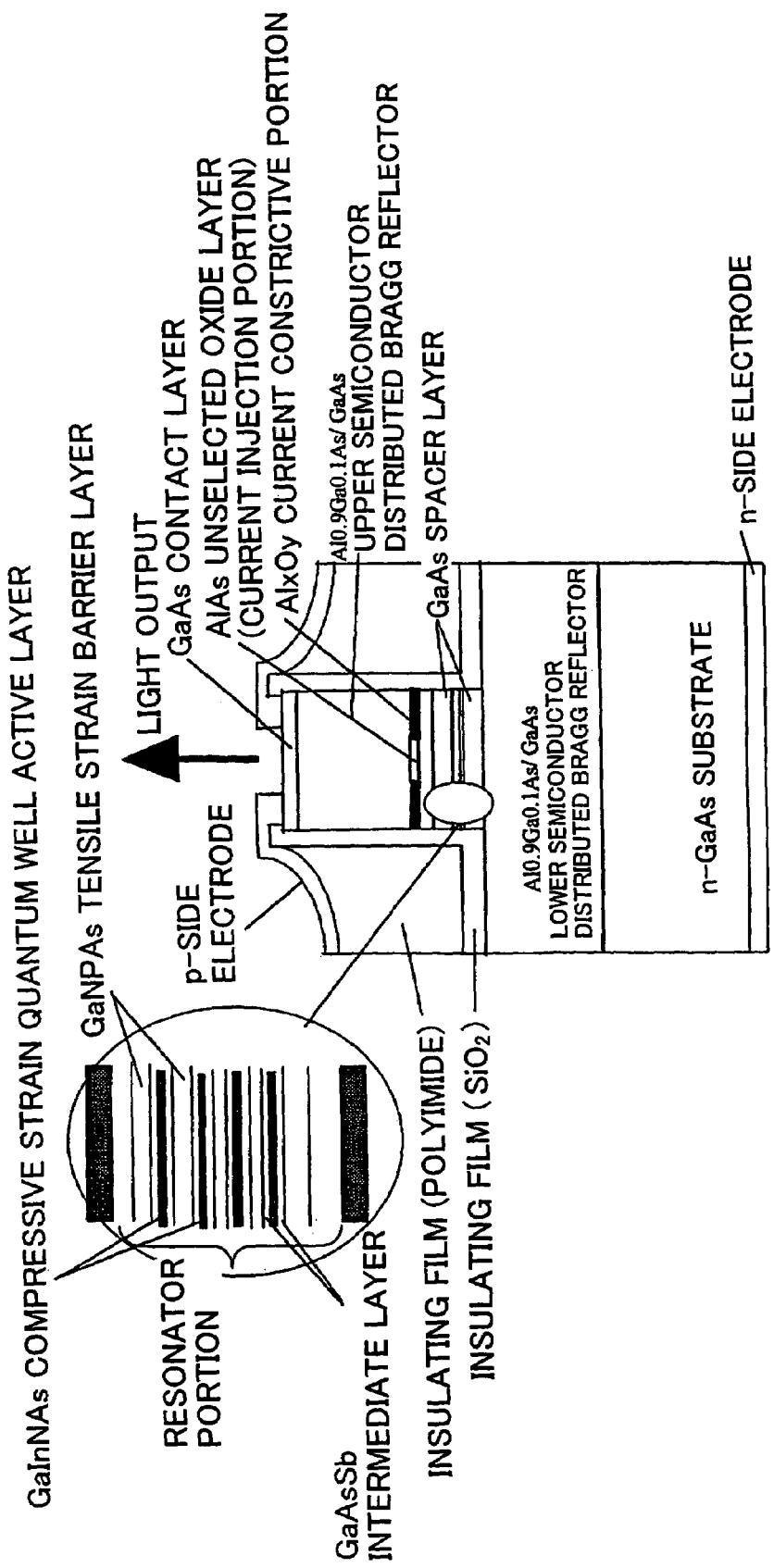
FIG. 40 is a drawing showing a 1.3-micrometer-band surface emitting semiconductor laser element according to a fourth example of the invention.

FIG. 40 is a drawing showing a 1.3-micrometer-band surface emitting semiconductor laser element according to a fourth example of the invention.

The fourth example differs from the third example in that GaNPAs having a tensile strain is used for the barrier layer, and in that an intermediate layer made of GaAsSb with a medium lattice constant is formed between the barrier layer having a tensile strain and the quantum well active layer having a large compressive strain. The intermediate layer had an Sb composition of 5% and a compressive strain of 0.4% relative to the GaAs substrate. The intermediate layer is 1 nm in thickness.

In order to provide a surfactant-like effect that facilitates two-dimensional growth by suppressing three-dimensional growth through lowering of surface energy, Sb does not necessarily need to be added to the entire barrier layer. For the attainment of the effect described above, it suffices to include Sb in a surface layer of the growth base on which the quantum well active layer having a strain starts to grow. If a material that does not include Sb is used for a barrier layer as in the fourth example, for example, the insertion of an intermediate layer inclusive of Sb between the barrier layer and the quantum well active layer having a strain can improve the crystallinity of the quantum well active layer.

The quantum well active layer having a large compressive strain and the barrier layer having a tensile strain are stacked together to provide a strain-compensated structure, thereby reducing (compensating for) the strain of the active layer. Since the strain is increased at the interface, a strain compensation effect may not be achieved. The insertion of an intermediate layer having a medium lattice strain between the compressive strain layer and the tensile strain layer as in this forth example provides for strain reduction, thereby successfully providing a strain compensation effect.

The fourth example has been desribed with reference an example in which GaAsSb was used as the intermediate layer. Alternatively, GaNAsSb, GaInNAsSb, GaNPAsSb, GaPAsSb, GaInNPAsSb, GaInPAsSb, or GaInAsSb may as well be used as long as Sb is included.

In the growth method such as the MOCVD method involving the reaction of raw materials using an organic metal or a hydride material, the Sb composition largely depends on the supply ratio of Group-V materials. It is thus not easy to add Sb to the layer already including N and other Group-V elements. When growth is to take place on a GaAs substrate, therefore, GaAsSb may be preferable as it is the easiest to facilitate crystal growth.

EXAMPLE 5

Figure 41:
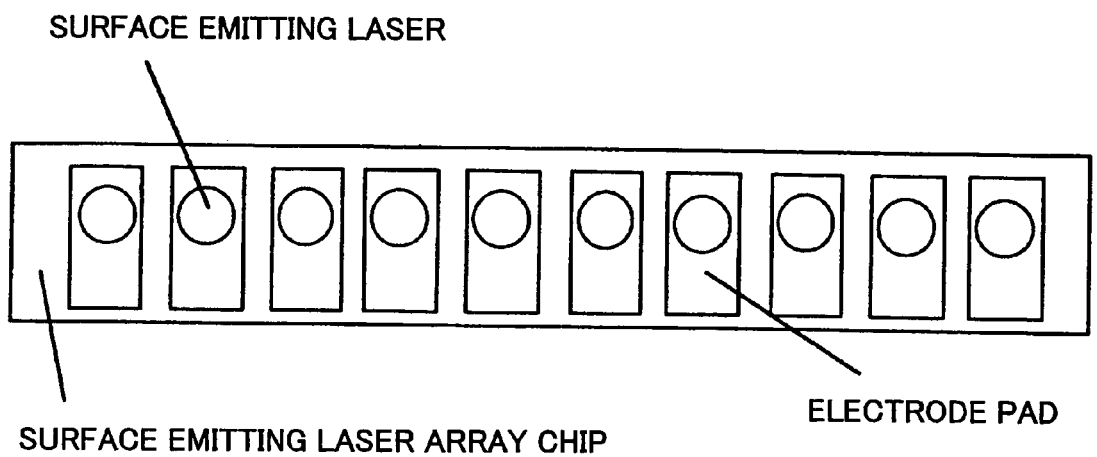
FIG. 41 is a top plan view of a surface emitting laser array according to a fifth example of the invention.

FIG. 41 is a top plan view of a surface emitting laser array according to a fifth example of the invention.

The surface emitting laser array of the fifth example includes 10 surface emitting laser devices of the fourth example arranged in a line. These laser devices may be provided in two dimensional arrangement. The surface emitting laser array of the fifth example has conductive types p and n that are reversed relative to the fourth example. In the surface emitting laser array of the fifth example, the n-side individual electrodes are formed on the top surface, and p-side common electrode is formed on the back surface of the substrate. This is because a plurality of devices can simultaneously transfer a larger amount of data by use of a bipolar transistor drive circuit that is operable at high speed as an anode common. This makes it possible to achieve the parallel transfer of a large amount of data.

EXAMPLE 6

Figure 42:
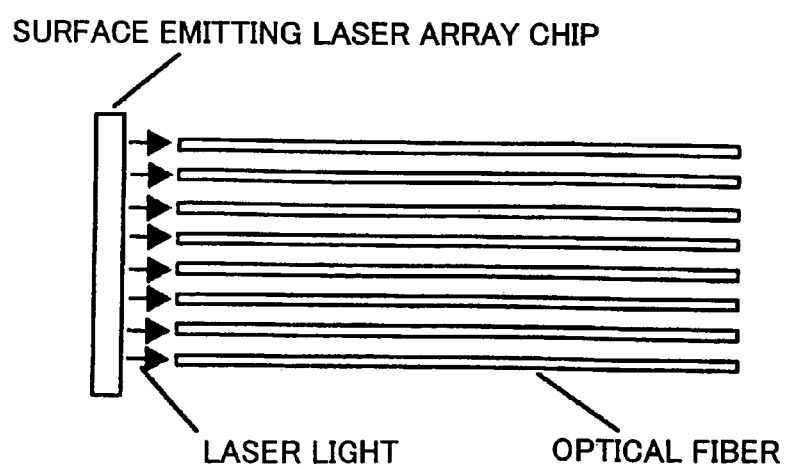
FIG. 42 is a drawing showing an optical transmission module according to a sixth example of the invention.

FIG. 42 is a drawing showing an optical transmission module according to a sixth example of the invention. The optical transmission module of the sixth example is comprised of the surface emitting laser array chip of the fifth example combined with silica fibers. In the sixth example, laser light emitted by the surface emitting laser array chip is input into the optical fibers for transmission. The optical fiber is a single mode fiber in this example. In order to transmit a large amount of data simultaneously, parallel transmission is achieved based on the use of the laser array that is comprised of a plurality of integrated semiconductor lasers. The sixth example attains high-speed parallel transmission by use of single-mode high-power surface emitting lasers, thereby providing for an increased amount of data transmission compared with a conventional art.

Furthermore, the use of the surface emitting semiconductor lasers of the invention in an optical communication system makes it possible to provide a reliable optical transmission module at low costs and also to provide a highly reliable optical communications system at low costs. The surface emitting semiconductor laser using GaInNAs has superior temperature characteristics and operates at a low threshold, thereby materializing a system that emits less heat and operates at high temperature without a cooling system.

In the sixth example, the surface emitting semiconductor lasers are provided in one-to-one correspondence with the optical fibers. Alternatively, a plurality of surface emitting semiconductor lasers having different oscillating wavelengths may be arranged in a one or two dimensional array for wavelength-multiplexed transmission, thereby further increasing a transmission rate.

EXAMPLE 7

Figure 43:
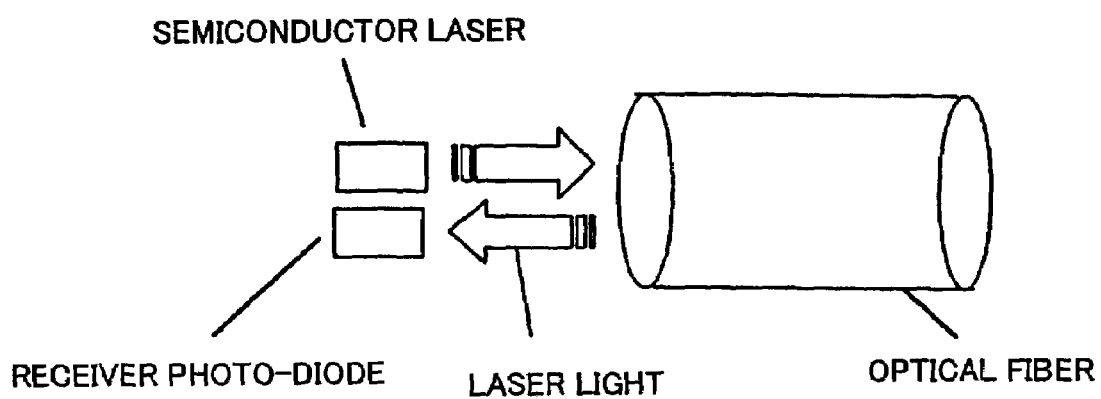
FIG. 43 is a drawing showing an optical transceiver module of a seventh example of the invention.

FIG. 43 is a drawing showing an optical transceiver module of a seventh example of the invention. The optical transceiver module of the seventh example is comprised of the surface emitting semiconductor laser of the third example, a photo-diode as a receiving end, and an optical fiber.

When the surface emitting semiconductor laser of the invention is used in an optical communication system, a highly-reliable optical communication system is provided at low costs by combining the surface emitting semiconductor laser (i.e., 1.3-micrometer-band GaInNAs surface emitting semiconductor laser), the photo-diode as a receiving end, and the optical fiber as shown in FIG. 43. Moreover, the surface emitting semiconductor laser using GaInNAs according to the invention is characterized by a satisfactory temperature characteristic, a low operating voltage, and a low threshold, thereby providing for a low cost system that emits less heat and is operable at high temperature without a cooling system.

When a fluoride-added POF (plastic fiber) incurring small loss at a long-wavelength band such as a 1.3-micrometer range is used in combination, a module can be provided at an extremely low cost. This is because the fiber is inexpensive, and also because the large fiber diameter provides for assembly costs to be reduced due to easy coupling.

The optical communication system based on the surface emitting semiconductor laser of the invention can not only be used for long-distance communication through optical fibers, but also be used for transfer between computers or the like through a LAN (local area network) or the like. It can also be used as an optical interconnection for short-distance communication between boards, between LSIs on a board, and between devices inside an LSI.

In recent years, the processing capacity of LSIs has been increasing. However, the rate of transmission between LSIs will be a bottleneck. When signal connections in a system are changed from electrical connections to optical interconnects (e.g., the optical transmission modules and the optical transceiver modules of the invention are used to connect between boards in a computer system, between LSIs on a board, and between devices inside an LSI), a super-fast computer system can be provided.

Moreover, a super-fast network system can be established by connecting a plurality of computer systems or the like through the optical transmission modules and the optical transceiver modules of the invention. Since surface emitting semiconductor lasers achieve low power consumption at different order of magnitude compared with an edge emitting laser, and are easy to be arranged in a two dimensional array, they are suitable for parallel-transmission-type optical communication systems.

As described above, the use of GaInNAs-type materials as nitrogen-added semiconductor layers makes it possible to create a multi-layer Al(Ga)As/(Al)GaAs-type semiconductor distributed Bragg reflector that has been proven for use in a 0.85-micrometer surface emitting semiconductor laser using the GaAs substrate, and also makes it possible to create a current constrictive structure through selective oxidization of AlAs. Further, the invention can achieve a high-performance surface emitting semiconductor laser having a long wavelength band such as a 1.3-micrometer band that is fit for practical use. The use of such devices also achieves a low-cost and highly reliable optical transmission module and optical communication system. Further, since the surface emitting semiconductor laser using GaInNAs has satisfactory temperature characteristics and a low threshold, a system that generates less heat and is usable at high temperature without a need for a cooling device can be provided.

EXAMPLE 8

Figure 44:
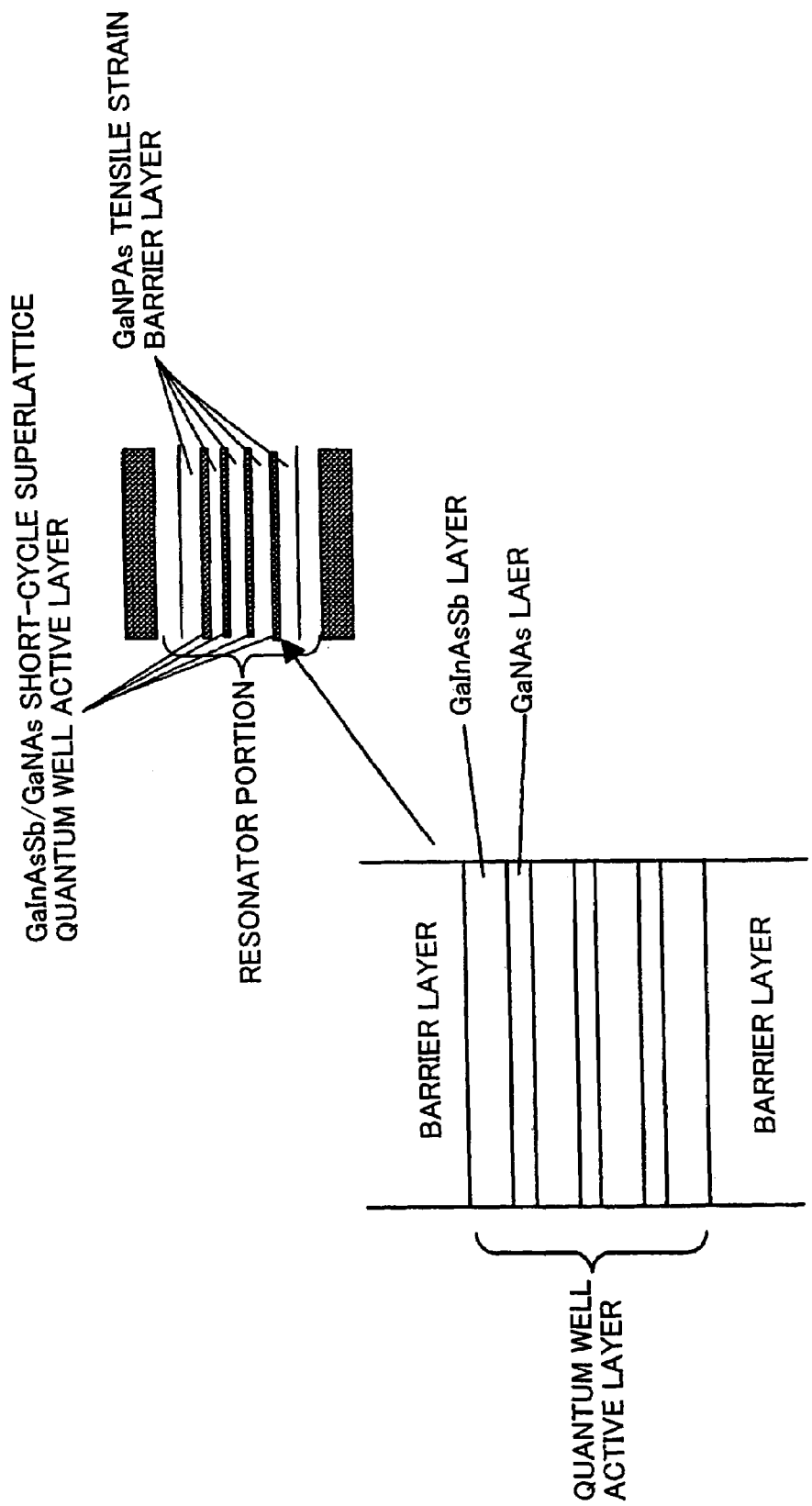
FIG. 44 is a drawing showing an active layer structure of a 1.3-micrometer-band surface emitting semiconductor laser according to an eighth example of the invention.

FIG. 44 is a drawing showing an active layer structure of a 1.3-micrometer-band surface emitting semiconductor laser according to the eighth example of the invention.

The eighth example differs from the third example in that GaNPAs is used for the barrier layer, and the quantum well active layer is comprised of GaInAsSb layers each being a 6-monoatomic layer and GaNAs layers each being a 2-monoatomic layer stacked one over the other 3.5 cycless in a short-cycle super lattice structure. The In composition of the GaInAsSb layer was 40%, and its Sb composition was 4%. The N composition of the GaNAs layer was 2%. Other compositions may suffice.

The quantum well active layer as described above has the GaInAsSb layers and GaNAs layers stacked one over the other with a thickness of each layer being a few atoms and without inclusion of both N and Sb at the same time and both In and N at the same time, and may thus be regarded as a material equivalent to a GaInNAsSb mixed crystal having an average composition of the GaInAsSb layer and the GaNAs layer. The use of GaInNAs presents the problem of three-dimensional growth caused by the segregation of In composition in the presence of added N since In and N are not included simultaneously, three-dimensional growth by added N is successfully suppressed. Moreover, although the GaInAsSbs layers include In and have a large compressive strain, the addition of Sb provides a surfactant-like effect to suppress three-dimensional growth of the GaInAsSb layers. Since Sb is included in the base crystal for the growth of the GaNAs layers, the segregation of N composition in the GaNAs layer is reduced, thereby providing a flat and even active layer. In this manner, it is possible to obtain the characteristics that are close to those of GaInNAsSb including In, Sb, N, and As at the same time, which is difficult to be grown by the MOCVD method.

According to the eighth example, therefore, a 1.3-micrometer-band surface emitting semiconductor laser is achieved that has high emission efficiency, low resistance, and low power consumption, and is provided at low costs.

Fifth Aspect

In the following, the fifth aspect of the invention will be described.

In recent years, the amount of information that is exchanged and processed has been increasing exponentially as can be seen in the promulgation of the Internet, and such increase is expected to accelerate further. Because of this, optical fibers are beginning to be used not only in trunk systems but also in communication systems closer to users such as the subscriber systems of individual households and offices and LANs (local area networks), and are also beginning to be used for connections between and inside individual apparatuses, which makes large-capacity information transmission a vital technology.

As a light source for use in such technology, a semiconductor laser of a 1.3-micrometer band or a 1.55-micrometer band is necessary that incurs a little transmission loss on silica fibers and provides good matching characteristics. In order to achieve a market progress for application closer to users, further, communications systems must be provided at low costs.

For the 1.3-micrometer waveband and the 1.55-micrometer waveband, the system of materials used on the InP substrate are typical, and have been reliably used in edge emitting lasers. Such long-wavelength-band semiconductor lasers, however, have drawbacks in that the operating current increases three-folds when the ambient temperature increases from a room temperature to 80 degrees Celsius. In order to provide a low-cost system that does not use a cooling device, it is vital to develop long-wavelength-band semiconductor lasers that have better temperature characteristics.

The system of materials that can form a 1.3-micrometer-band semiconductor laser on a GaAs substrate has recently been attracting attention. Research has been directed to (Ga)InAs quantum dots, GaAsSb, and GaInNAs (e.g., Patent Document 1). Especially, GaInNAs is recognized as a material that substantially suppresses the temperature dependency of laser characteristics. Here, materials of the GaInNAs system include other Group-III-V elements such as P, Sb, and Al.

GaInNAs is a Group III-V mixed-crystal semiconductor that contains nitrogen (N) and other Group V elements. In GaInNAs, the addition of nitrogen (N) to GaInAs having a larger lattice constant than GaAs provides for the latice constant to be matched with that of GaAs. Further, band-gap energy is reduced to make it possible to emit light in the 1.3-micrometer band or the 1.55-micrometer band.

In Non-Patent Document 1, for example, Kondo et. al. calculate the band lineup of GaInNAs. GaInNAs has band-gap energy that is reduced by the addition of nitrogen (N). Since the energy of the conduction band and the valence band also lowers, the discontinuity of the conduction band becomes significantly large compared with GaAs matched-latice materials such as GaInP, AlGaAs, and GaAs. This is expected to provide for a semiconductor laser having superior temperature characteristics. A 10% In composition with a 3% nitrogen composition can produce 1.3-micrometer band. However, there is a problem in that the threshold current density increases rapidly as the nitrogen composition increases.

Figure 45:
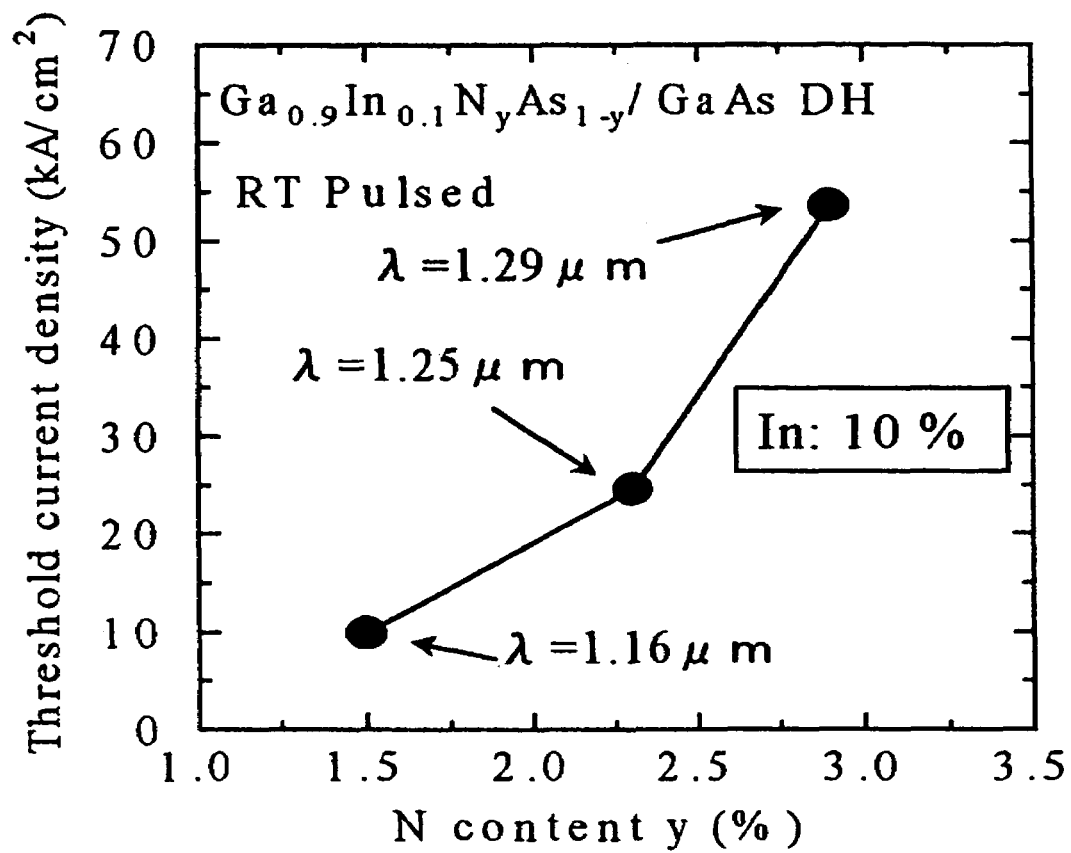
FIG. 45 is a chart showing a threshold current density that is dependent on the nitrogen composition according to experiments.

FIG. 45 is a chart showing a threshold current density that is dependent on the nitrogen composition according to experiments. The horizontal axis represents the percentage (%) of nitrogen composition, and the vertical axis represents the threshold current density. As shown in FIG. 45, the threshold current density increases rapidly with the increase of nitrogen composition. This is because the crystallinity of the GaInNAs layer deteriorates with the increase of nitrogen composition. As a counter measure, the In composition is raised while the nitrogen composition is lowered (e.g., Patent Document 2 and Patent Document 3), with the use of a GaInNAs-system quantum well active layer that has a compressive strain as large as 2% or more relative to the substrate. Based on this construction, some studies (e.g., Non-Patent Document 2) provide a laser device that has a characteristic temperature exceeding 200 K, with the threshold current density of the semiconductor laser being smaller than 1 kA/cm$^2$, and the operating current increasing only 1.3 times even when the ambient temperature rises from room temperature to 80 degrees Celsius. A GaAs layer is used for the barrier layer. When the GaInNAs-system quantum well active layer having a compressive strain is employed, GaAs is often used for the barrier layer.

In the presence of such a high strain, however, there is a need to secure film growth close to a critical film thickness at which three-dimensional growth takes the place of two-dimensional growth. A technique must be contrived for this purpose. Conventionally, a low-temperature growth method (e.g., Patent Document 2) and a method that achieves a surfactant-like effect by adding Sb (e.g., Patent Document 3) are known. These methods, however, limit the design of devices by imposing a limit to the number of quantum wells, for example, for the purpose of suppressing the generation of crystalline defects.

Methods for improvement include using a $Ga_dIn_{1-d}N_eP_fAs_{1-e-f}$ material (e.g., Patent Document 4), a GaNPAs or GaNAs layer (e.g., Patent Document 5), a GaNAs layer (e.g., Patent Document 3) as a barrier layer, thereby providing a strain-compensation structure that suppresses (compensates for) the strain of the active layer.

The addition of N to GaAs results in the lattice constant being smaller. Moreover, since GaNAs has its quantum level energy lowered by a decrease in the discontinuity of conduction bands relative to the GaInNAs quantum well active layers, an oscillating wavelength becomes longer. However, the same reason (i.e., the decrease in the discontinuity of conduction bands relative to the GaInNAs quantum well active layers) works to create an increasing number of overflowing electrons, resulting in the deterioration of temperature characteristics.

Moreover, the addition of P to GaAs reduces the lattice constant, and increases the band gap, with an increase in the energy of a conduction band. When GaNPAs is used for the barrier layers, therefore, the adjustment of P and N provides for the energy of a conduction band to be approximately the same as that of the GaAs and GaInNAs junction. However, the addition of either P or N or both serves to lower the lattice constant smaller than GaAs. It is thus impossible to control the discontinuity of the conduction band and the amount of a strain independently of each other. Because of this, a tensile strain increases, causing a wide strain gap with the GaInNAs-type quantum well active layer, which prevents the creation of a satisfactory interface. This limits latitude in the design of devices.

In this case, the addition of In serves to increase a lattice constant. As it turned out, however, if a strain-compensated layer having a smaller lattice constant than GaAs is to be formed by use of $Ga_dIn_{1-d}N_eP_fAs_{1-e-f}$-type materials, it is difficult to control valence-band discontinuity with the GaInNAs-type quantum well active layer. Specifically, it is difficult to make the valence-band discontinuity small compared with the junction with the GaAs barrier layer. This limits latitude in the design of devices.

[Patent Document 1] Japanese Patent Application Publication No. 6-37355

[Non-Patent Document 1] Japan. J. Appl. Phys. Vol. 35(1996) pp. 1273–1275

[Patent Document 2] Japanese Patent Application Publication No. 2000-332363

[Patent Document 3] Japanese Patent Application Publication No. 2002-118329

[Non-Patent Document 2] Japan. J. Appl. Phys. Vol. 39 (2000) pp. 3403–3405

[Patent Document 4] Japanese Patent Application Publication No. 10-126004

[Patent Document 5] Japanese Patent Application Publication No. 10-145003

Accordingly, there is a need for a semiconductor light emitter, an optical transmission module, an optical transceiver module, and an optical communication system, in which a semiconductor light emitter using a GaInNAs-type quantum well active layer with a compressive strain provides greater latitude in design to reduce the strain of a quantum well active layer, and provides satisfactory temperature characteristics and a low threshold.

In the following, embodiments of the invention will be described with reference to accompanying drawings.

(First Embodiment)

In the first embodiment of the invention, a semiconductor light emitter has an active layer that is comprised of a quantum well active layer including nitrogen (N) and other Group-V elements and having a compressive strain relative to a GaAs substrate and barrier layers formed alongside the quantum well active layer. The barrier layers are made of a Group-III-V mixed-crystal semiconductor inclusive of both phosphorous (P) and antimony (Sb).

When 1% of P is added to GaAs, the band gap increases about 11.7 meV, and the conduction band rises 7 meV, with the lowering of the valence band by 4.7 meV ("Pys. Rev. 146 (1966)", p601 by A. G. Thompson et. al., Appl. Pyys. Lett. Vol. 72 (1998), p2011, by Su-Huai Wei et. al.). Since the lattice constants of GaAs and GaP are 5.65325 angstroms and 5.4495 angstroms, respectively, a 0.0360% tensile strain per 1% P is obtained relative to GaAs.

With 1% of N added to GaAs, the band gap decreases 156 meV, and the conduction band falls 175 meV, with the valence band dropping 19 meV (see "16th Semiconductor Laser Symposium" by Kitatani et. al.). Since the lattice constant of GaN having a zinc blende structure is 4.5 angstroms, a 0.204% tensile strain per 1% N is obtained relative to GaAs.

With 1% of In added to GaAs, the band gap decreases about 15 meV. Although the valence band energy increases when In is added, such an increase amounts to only 60 meV with GaAs and InAs, and most of the band gap drop is accounted for by the lowering of the conduction band (for example, Yu. F. Biryulin et al., Sov. Pys. Semicond. 17 (1983) p. 68, and Su-Huai Wei, et al., Appl. Pyys. Lett. Vol. 72 (1998) p. 2011). Moreover, the lattice constant of InAs is 6.058 angstroms, so that a 0.0716% compressive strain per 1% In is in existence relative to GaAs.

It follows that, if a strain-compensated layer having a smaller lattice constant than GaAs is formed of GaAs with added N and/or P and/or In, i.e., $Ga_dIn_{1-d}N_eP_fAs_{1-e-f}$-type material (see Japanese Patent Application Publication No. 10-126004), the discontinuity of a valence band with respect to a GaInNAs-type quantum well active layer increases compared with a GaAs barrier layer. For example, the addition of 1% of P to GaAs to create a tensile strain causes a drop in the valence band by 4.7 meV. In order to compensate for this drop with In, In needs to be added as much as about 8%, which results in the creation of a compressive strain. Moreover, the addition of 1% of N to GaAs to create a tensile strain causes a drop in the valence band by 19 meV. In order to compensate for this drop with In, In needs to be added as much as about 32%, which will create a compressive strain.

The effective mass of a hole is larger than the effective mass of an electron, and the homogeneity of hole injection strongly depends on the height of a barrier. As the discontinuity of a valence band increases, thus, it becomes difficult to ensure homogeneous injection of holes into each well layer of a multiple quantum well structure. This has a detrimental effect on device characteristics such as an increase in the threshold current. In almost all cases, GaAs layers are used alongside a GaInNAs-type quantum well active layer comprised of a quantum well active layer and barrier layers. If the valence band energy of the barrier layers is lower than that of GaAs, a barrier is created with respect to hole injection into the well layer, which gives rise to a problem in that hole injection becomes less likely to occur.

Yamada, et al., TECHNICAL REPORT OF IEICE, LQE 99–133 (2000–02), describes a 1.3-micrometer-belt semiconductor laser using a GaAsSb quantum well active layer that is grown on a GaAs substrate. The discontinuity of a conduction band between GaAs and $GaAs_{0.64}Sb_{0.36}$ is estimated as approximately 35 meV. The discontinuity of a valence band is 430 meV. A decrease in the band gap caused by the addition of Sb is thus mostly accounted for by an increase in the energy of the valence band (12 meV per 1% Sb). Moreover, the addition of Sb causes the enlargement of a lattice constant. The inventors of the invention found that an addition of Sb to a material having a tensile strain relative to GaAs would successfully compensate for an increase in the discontinuity of the valence band. Since the lattice constant of GaSb is 6.094 angstroms, a 0.0780% compressive strain per 1% Sb relative to GaAs is observed.

It is necessary to add at least one of N and P to GaAs to create a material that has a tensile strain relative to GaAs. When a Ga(In)NAsSb tensile strain layer having added N and Sb without the addition of P is used, the discontinuity of a conduction band decreases as in the case of a GaNAs barrier layer, thereby resulting in the deterioration of temperature characteristics of a semiconductor laser. The addition of Al to Ga(In)NAsSb serves to raise the energy of a conduction band without changing a lattice constant. A material including N, however, needs to be grown through low-temperature growth such as below 600 degrees Celsius, and is thus not preferable for use in the growth of a layer including Al. It is thus preferable to avoid the simultaneous inclusion of both Al and N.

In this manner, a material having both P and Sb added to GaAs is used as a barrier layer in the structure using a GaInNAs-type quantum well active layer that has a compressive strain. This successfully provides a strain-compensated quantum well active layer structure which does not decrease the discontinuity of a conduction band so much as to cause the problem of overflowing of electrons, and does not enlarge the discontinuity of a valence band so much as to cause problems in hole injection.

In the semiconductor light emitter of the first embodiment, N may also be included in the barrier layers.

Jpn. J. Appl. Pyys. Vol. 39 (2000) pp. 3403–3405, which is previously described, discloses an edge emitting semiconductor laser having satisfactory temperature characteristics such as a characteristic temperature of 200 K or more based on a double quantum well active layer using GaAs barrier layers. Even if the discontinuity of a conduction band between a GaInNAs-type quantum well active layer and a barrier layer is not further increased, there are plenty of fields for potential use. On the contrary, if the conduction band energy of barrier layers is further increased, the quantum level also increases, causing a shift to shorter wavelengths. This necessitates an increase of nitrogen composition in the GaInNAs-type quantum well active layer, which may create the problem of crystallinity degradation. Since the addition of N to barrier layers serves to lower conduction band energy, this provides a means for the independent control of discontinuity of a conduction band energy, thereby achieving proper compensation.

The crystallinity of an interface between a barrier layer and a quantum well active layer is important. When the MOCVD method is employed to grow GaInNAs-type materials, the supply of an N raw material needs to be in such a large quantity that the mole percentage relative to the supply of an As raw material ("N raw material"/("N raw material"+ "As raw material")) exceeds 0.9. Since the N raw material needs to be supplied in large quantity, it is difficult to achieve diligent control of on/off of the raw material supply, i.e., to achieve diligent control at an interface. Moreover, growth by the MBE method is sustained by supplying an N raw material activated by RF or the like, which makes it difficult to achieve speedy on/off switching. Like the MOCVD method, it is thus difficult to achieve diligent control at an interface. With the provision of N added to the barrier layers, however, there is no need to control the on/off switching of raw material supply at the interface, thereby providing better control at the interface.

In the semiconductor light emitter of the first embodiment described above, a barrier layer may be formed of GaN-PAsSb, GaPAsSb, GaInNPAsSb, GaInPAsSb, or the like.

(Second Embodiment)

In the second embodiment of the invention, a semiconductor light emitter has an active layer that is comprised of a quantum well active layer including all of Ga, As, and Sb with a compressive strain relative to a GaAs substrate and barrier layers formed alongside the quantum well active layer. The barrier layers are made of a Group-III-V mixed-crystal semiconductor inclusive of both phosphorous (P) and antimony (Sb).

The barrier layers including both P and Sb are effective even if a GaAsSb-type compressive strain quantum well active layer is used. As previously described, the discontinuity of a conduction band between GaAs (barrier layer) and $GaAs_{0.64}Sb_{0.36}$ (compressive-strain quantum well active layer) is estimated as approximately 35 meV. The discontinuity of a valence band is 430 meV. A decrease in the band gap caused by the addition of Sb is thus mostly accounted for by an increase in the energy of the valence band (12 meV per 1% Sb) If GaAs is used for the barrier layers, thus, the overflowing of electrons is significant, resulting in extremely poor temperature characteristics. Furthermore, the discontinuity of a valence band is very large, and the uneven injection of holes in the multiple quantum well active layer becomes a problem. To improve the situation, a p-type-modulated dope structure which uses a barrier layer of a p type is employed (TECHNICAL REPORT OF IEICE, LQE 99–133 (2000–02)).

The addition of P to GaAs enlarges the discontinuity of a conduction band, and the addition of Sb to GaAs serves to decrease the discontinuity of a valence band. Further, the mutual compensation of changes in the lattice constant is also advantageous. This makes it possible to increase the discontinuity of a conduction band, compared with the case where a GaAs barrier layer is used, and also makes it possible to provide a junction that reduces the discontinuity of a valence band. The overflowing of electrons is thus successfully suppressed, and the efficiency of hole injection is improved.

In the semiconductor light emitter of the second embodiment described above, a barrier layer may be formed of GaPAsSb, AlGaPAsSb, GaInPAsSb, AlGaInPAsSb, or the like.

Moreover, the quantum well active layer in the semiconductor light emitter of the first or second embodiment may be a multiple quantum well active layer.

The effective mass of a hole is larger than the effective mass of an electron, and the homogeneity of hole injection strongly depends on the height of a barrier. As the discontinuity of a valence band increases, thus, it becomes difficult to ensure homogeneous injection of holes into each well layer of a multiple quantum well structure. This has a detrimental effect on device characteristics such as an increase in the threshold current. When P and/or N are added to GaAs to create a material having a smaller lattice constant than GaAs, the discontinuity of a valence band relative to a GaInNAs-type quantum well active layer ends up being larger than in the case of GaAs barrier layers. The addition of In serves to provide reduction. However, the effect is very limited. On the other hand, the addition of Sb according to the invention is sufficiently effective.

In the case of a GaAsSb-type quantum well active layer, also, the addition of Sb to barrier layers successfully reduces the discontinuity of a valence band, compared with the use of GaAs barrier layers, thereby achieving homogeneous hole injection into each well layer.

Moreover, the semiconductor light emitter of the first or second embodiment may be implemented as a surface emitting semiconductor laser.

In order to achieve high-capacity optical networks and optical fibers at low costs without any regard to distance, a semiconductor laser of a 1.3-micrometer band or a 1.55-micrometer band is necessary as a light source that incurs a little transmission loss on silica fibers and provides good matching characteristics, and such semiconductor laser needs to have proper temperature characteristics without a need for a cooling device. To this end, a surface emitting laser device (VCSEL: vertical cavity surface emitting laser) is quite suitable. The surface emitting semiconductor laser is better suited for cost reduction, power consumption reduction, miniaturization, 2-dimensional circuit integration than the edge emitting laser. In actuality, a 0.85-micrometer-band laser that can be formed on a GaAs substrate has been put to practical use in the 1 Gbit/sec Ethernet of a high-speed LAN. The use of a GaInNAs-type material or a GaAsSb-type material for an active layer makes it possible to cope with such wavelengths.

Moreover, a surface emitting laser has an extremely short resonator length and a narrow gain range, compared with edge emitting laser, and thus needs a large active-layer gain. In order to provide satisfactory device characteristics, a plurality of quantum well active layers need to be provided to boost the gain. Because of the strain-compensated layer of the present invention, the number of active layers can be increased, thereby providing a surface emitting laser that operates at a low threshold current, generates a high-power output, and provides satisfactory temperature characteristics. In addition, the MOCVD method may be employed to reduce the resistance of the semiconductor distributed Bragg reflector of a surface emitting laser. This is preferable since the operating voltage can be reduced.

Moreover, an optical transmitting module may be implemented by using the surface emitting laser of the invention as a light source.

The surface emitting laser of the invention as described above, which has low resistance and operates at a low voltage and at a low threshold current with satisfactory temperature characteristics, may be utilized to provide an optical transmitter module at low costs without a need for a cooling device.

Moreover, the surface emitting laser of the invention may be used as a light source of an optical transceiver module.

The surface emitting laser of the invention as described above, which has low resistance and operates at a low voltage and at a low threshold current with satisfactory temperature characteristics, may be utilized to provide an optical transceiver module at low costs without a need for a cooling device.

Moreover, the surface emitting laser of the invention may be used as a light source of an optical communication system.

The surface emitting laser as described above, which has low resistance and operates at a low voltage and at a low threshold current with satisfactory temperature characteristics, may be utilized to provide an optical communication system such as an optical fiber communication system and an optical interconnection system at low costs with no need for a cooling device.

EXAMPLE 1

Figure 46:
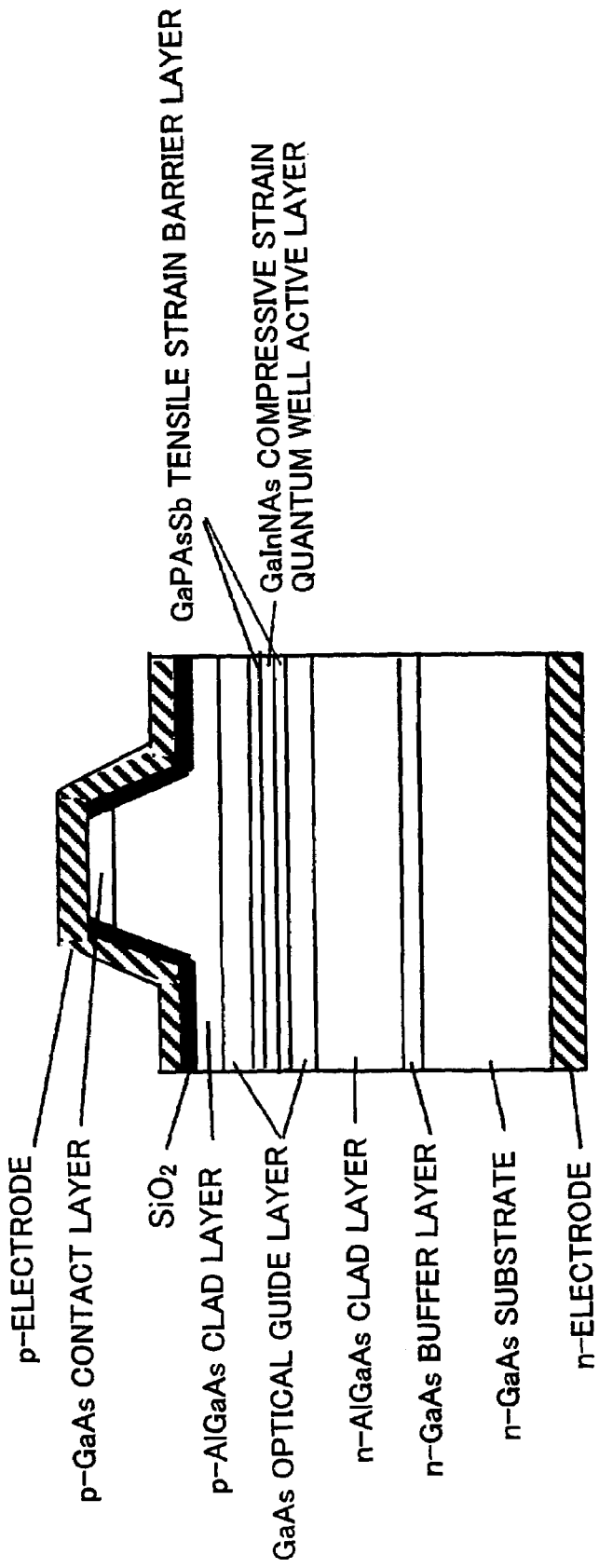
FIG. 46 is a drawing showing a GaInNAs edge emitting semiconductor laser according to a first example of the invention.

FIG. 46 is a drawing showing a GaInNAs edge emitting semiconductor laser according to the first example of the invention. An example of FIG. 46 shows a ridge-stripe-type laser. The GaInNAs edge emitting semiconductor laser of FIG. 46 has a SCH-SQW (separate confinement heterostructure single quantum well) layer structure.

In the example of FIG. 46, a Se dope n-GaAs buffer layer, a Se dope n-AlGaAs lower clad layer, an undope GaAs lower light guide layer, an active layer, an undope GaAs upper light guide layer, a Zn dope p-AlGaAs upper clad layer, and a Zn dope p-GaAs contact layer are successively formed by growing on an n-GaAs substrate with a plane direction (100).

The active layer includes a single GaInNAs quantum well active layer (well layer) having a compressive strain and GaPAsSb barrier layers that are formed on both sides of the well layer and have a tensile strain. The well layer has an In-composition x of 35% and a nitrogen composition of 0.8%. The thickness of a well layer is 8 nm. The MOCVD method was used as a growth method. $H_2$ was used as a carrier gas. As raw materials, TMG (trimethyl gallium), TMI (trimethyl indium), $AsH_3$ (arsine), and $PH_3$ (phosfin) were used. As a raw material for nitrogen, DMHy (dimethyl hydrazine) was used. Since DMHy is decomposed at low temperature, it is suitable for low-temperature growth below 600 degrees Celsius. In the first example, the GaInNAs layer was grown at 550 degrees Celsius. When a quantum well layer having a large strain is to be grown, low-temperature growth around 500–600 degrees Celsius is desirable. The GaPAsSb barrier layer was also grown at the same 550 degrees Celsius as the GaInNAs layer.

Photolithography and etching were performed to remove layers to a depth of the middle of the p-AlGaAs layer while leaving a 3-micrometer stripe region, thereby forming a ridge structure. A p-side electrode was then formed on the ridge structure while inserting an insulating film, part of which was removed to allow the injection of an electric current. Further, an n-side electrode was formed on the bottom surface of the substrate.

In the first example, the GaPAsSb barrier layer is formed between the GaAs optical guide layer and the GaInNAs quantum well active layer. If barrier layers were GaPAs, valence band discontinuity would be formed between GaAs and GaPAs. Since Sb is added in proper quantity, valence band discontinuity is reduced, thereby causing no harm to hole injection. Further, the addition of P increases the discontinuity of a conduction band, which effectively entraps electrons in quantum wells despite the fact that electrons having small effective mass are easy to overflow. As a result, highly satisfactory temperature characteristics are obtained despite a single quantum well structure. Furthermore, a strain-compensated structure is provided to reduce strains, thereby improving the reliability of devices.

Although the above example has been described with reference to growth by the MOCVD method, other growth methods such as the MBE method may as well be used. Moreover, the nitrogen raw material is not limited to DMHy, and other nitrogenous substances such as activated nitrogen or NH3 may as well be used. Although a single quantum well structure (SQW) has been used as an example of stacked layers, a multiple quantum well structure may as well be used. Moreover, the thickness of each layer may be determined according to needs. Further, AlGaInP-type materials having a wide gap like the AlGaAs-type materials may be used for the clad layers. Moreover, other laser structures may instead be used.

EXAMPLE 2

Figure 47:
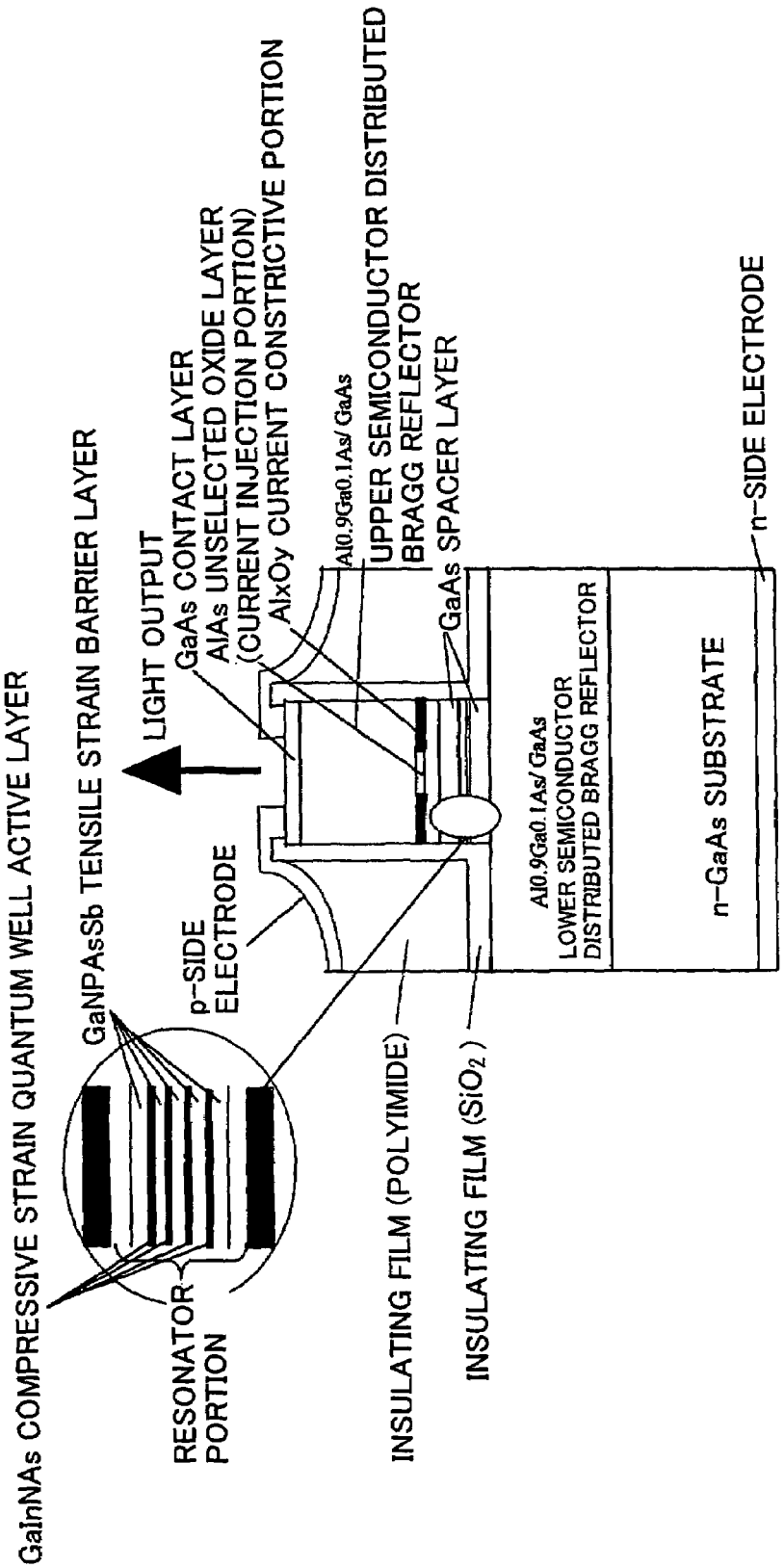
FIG. 47 is a drawing showing a GaInNAs surface emitting semiconductor laser according to a second example of the invention.

FIG. 47 is a drawing showing a GaInNAs surface emitting semiconductor laser according to the second example of the invention.

The surface emitting semiconductor laser of the second example includes an n-semiconductor distributed Bragg reflector (lower-side semiconductor distributed Bragg reflector), which is formed on an n-GaAs substrate that is 3 inches wide and has a plane direction (100). This lower-side reflector has a structure in which n-$Al_xGa_{1-x}As$ (x=0.9) and n-GaAs each ¼ times as thick as the medium-dependent oscillation wavelength are alternately repeated 35 cycles. On top of the reflector are formed an undope lower GaAs spacer layer, a multiple quantum well active layer including four GaInNAs well layers and five GaNPAsSb barrier layers, and an undope upper GaAs spacer layer. On top of these layers, p-semiconductor distributed Bragg reflector (upper-side semiconductor distributed Bragg reflector) is formed.

The upper-side reflector is comprised of a periodic structure (e.g., 25 cycles) in which C-dope p-$Al_xGa_{1-x}As$ (x=0.9) and p-GaAs, each ¼ times as thick as the medium-dependent oscillation wavelength, are alternately stacked one over the other. In addition, an oxide layer of AlAs is formed to a thickness of 30 nm in the upper-side reflector at a position near the active layer. Moreover, the GaAs layer at the top of the upper-side reflector also serves as a contact layer for providing a contact with an electrode.

In the second example, the In-composition x of the well layer in the active layer was 37%, and its nitrogen composition was 0.5%. The well layer was 7 nm in thickness, and had an about 2.5% compressive strain (high strain) relative to the GaAs substrate. The GaNPAsSb barrier layer had a thickness of 20 nm, and had a 0.2% tensile strain relative to the GaAs substrate, with its composition being adjusted such that its conduction band and valence band are almost the same as in the case where GaAs is used for the barrier layer. Specifically, the P composition of the GaNPAsSb barrier layer is 21%, the N composition 0.8%, and the Sb composition 9.2%. This can be explained conceptually as follows. When P is added to GaAs, a tensile strain is obtained in such a manner that the discontinuity of a conduction band and the discontinuity of a valence band are increased relative to a GaInNAs quantum well. When N is further added to GaPAs, a further tensile strain is obtained in such a manner that the discontinuity of a conduction band decreases. When Sb is further added to GaNPAs, the tensile strain is reduced in such a manner that the discontinuity of a valence band decreases. In this manner, design can be successfully made so as to provide a tensile strain relative to the GaAs substrate and to provide the same conduction band and valence band as in the case where GaAs is used as a barrier layer. This achieves a tensile-compensated structure which does not reduce the discontinuity of a conduction band so much as to cause the problem of overflowing of electrons, and does not enlarge the discontinuity of a valence band so much as to cause trouble in hole injection.

The MOCVD method was employed as a growth method. $H_2$ was used as a carrier gas. As raw materials for a GaInNAs active layer, TMG (trimethyl gallium), TMI (trimethyl indium), $AsH_3$ (arsine), and PH3 (phosfin) were used. As a raw material for nitrogen, DMHy (dimethyl hydrazine) was used. Since DMHy is decomposed at low temperature, it is suitable for low-temperature growth below 600 degrees Celsius. It is especially suitable for the purpose of growing a large strain quantum well layer required to grow at low temperature. When an active layer having a large strain such as that of the GaInNAs surface emitting semiconductor laser of the second example is to be grown, low-temperature growth that achieves non-equilibrium is desirable. In the second example, the GaInNAs layer was grown at 540 degrees Celsius.

In the second example, a mesa having predetermined size is formed by exposing at least a lateral surface of p-AlAs layer, and AlAs with its lateral surface exposed is oxidized from the lateral surface by steam, thereby forming an $Al_xO_y$ current constrictive part. Polyimide was then embedded into the etched part for flattening, the polyimide then removed from the top of the upper-side reflector having a p contact portion and a light emitting portion, a p-side electrode formed on the p-contact layer excluding the light emitting portion, and an n-side electrode formed on the back surface of the substrate.

The oscillating wavelength of the surface emitting semiconductor laser produced in this manner was approximately 1.3 micrometers. Since GaInNAs was used for the active layer, a surface emitting semiconductor laser of a long-wavelength band was successfully obtained on the GaAs substrate. With the strain-compensated structure, further, the number of wells was able to be increased without creating crystalline defects despite the use of an active layer having a large compressive strain. Further, band discontinuities in a conduction band and a valence band were adjusted to be substantially the same as those of GaAs barrier layers. This provided satisfactory temperature characteristics and proper operation at high temperature.

Moreover, a current was constricted by selective oxidization of the p-AlAs layer which had Al and As as main components, thereby achieving a low threshold current. With the current constrictive structure using a current constrictive layer that was comprised of an Al oxide film obtained by selective oxidization of an oxide layer, the current constrictive layer was formed close to the active layer to suppress the spreading of a current, thereby efficiently entrapping carries in a small area that was not exposed to atmosphere. The Al oxide film obtained through further oxidization reduced a refraction index, which created a convex lens effect to focus light at the small area where carriers were entrapped. This achieved a significantly high efficiency, and reduced the threshold current. Moreover, a simple step was able to form the current constrictive structure, resulting in the reduction of manufacturing costs.

The MBE method is mainly employed for producing semiconductor layers such as GaInNAs layers including nitrogen and other Group-V materials. Since this method requires growth in high vacuum, however, the amount of raw material supply cannot be increased. That is, an increase in the amount of raw material supply entails the excess load on the exhaust system. An exhaust pump of a high vacuum exhaust system is thus needed. With the use of such an exhaust pump, the exhaust system suffers the excess load when removing residual raw materials and the like from the MBE chamber. This results in a likely malfunction and thereby a poor throughput.

A surface emitting semiconductor laser includes multi-layer semiconductor film reflectors and an active region sandwiched between the reflectors where the active region includes at least one active layer for emitting laser light. The thickness of a crystal growth layer of an edge emitting laser is about 3 micrometers. A surface emitting semiconductor laser of a 1.3-micrometer wavelength band requires a thickness exceeding 10 micrometers for a crystal growth layer. Since the MBE method does not allow the amount of raw material supply to be increased due to the necessity of high vacuum, a growth rate can only be 1 micrometer per hour. Growing a layer to a thickness of 10 micrometers requires at least 10 hours without taking into account growth suspension periods that are needed to change the amount of raw material supply.

The thickness of an active region is generally very thin compared with the total thickness (10% or less), and most layers are accounted for by the multi-layer film reflectors. A multi-layer semiconductor film reflector is formed by stacking a low-refractive-index layer and a high-refractive-index layer alternately one over the other (e.g., 20–40 times) where each layer is ¼ times as thick as the oscillation wavelength in the respective medium ($\lambda/4$). In the surface emitting semiconductor laser on the GaAs substrate, AlGaAs-type materials are used, and Al composition is changed to create a low-refractive-index layer (large Al composition) and a high-refractive-index layer (small Al composition). In actuality, resistance becomes large on the p side due to the hetero barrier of each layer. In consideration of this, an intermediate layer having a medium Al composition is inserted between a low-refractive-index layer and a high-refractive-index layer so as to reduce the resistance of a multi-layer film reflector.

As described above, the manufacturing of a surface emitting semiconductor laser involves growing more than 100 semiconductor layers having different compositions, with a need for an intermediate layer between the low-refractive-index layer and a high-refractive-index layer. There is thus a need for instant control of the amount of raw material supply. In the MBE method, however, the amount of raw material supply is controlled by changing the temperature of a materials cell, which prohibits the flexible control of compositions. It is thus difficult to reduce the resistance of a multi-layer semiconductor film reflector grown by the MBE method, and the operating voltage is generally high.

On the other hand, controlling the amount of raw material gases is all that is necessary in the MOCVD method for achieving the instant control of compositions, without a need for high vacuum unlike the MBE method. A growth rate can be increased to 3 micrometers per hour, for example, thereby easily boosting throughput. The MOCVD method is thus suitable for mass production.

In the second embodiment, GaNPAsSb was used for barrier layers. Alternatively, any one of GaPAsSb, GaInNPAsSb, and GaInPAsSb, which have a smaller lattice constant than GaAs, may also be used. Although GaInNAs was used for a quantum well active layer, GaInNAsSb, GaInNPAs, and GaInNPAsSb, with a larger lattice constant than GaAs, may as well be used. Although a shorter wavelength than the 1.3-micrometer band will be the consequence, the invention may achieve the same results when the In composition of GaInAs which does not include N is increased to achieve a wavelength of 1.1 micrometers or more. This is because GaAs is used for conventional barrier layers.

In the second example as described above, a surface emitting semiconductor laser of a 1.3-micrometer band with low resistance and low power consumption is provided at low costs.

EXAMPLE 3

Figure 48:
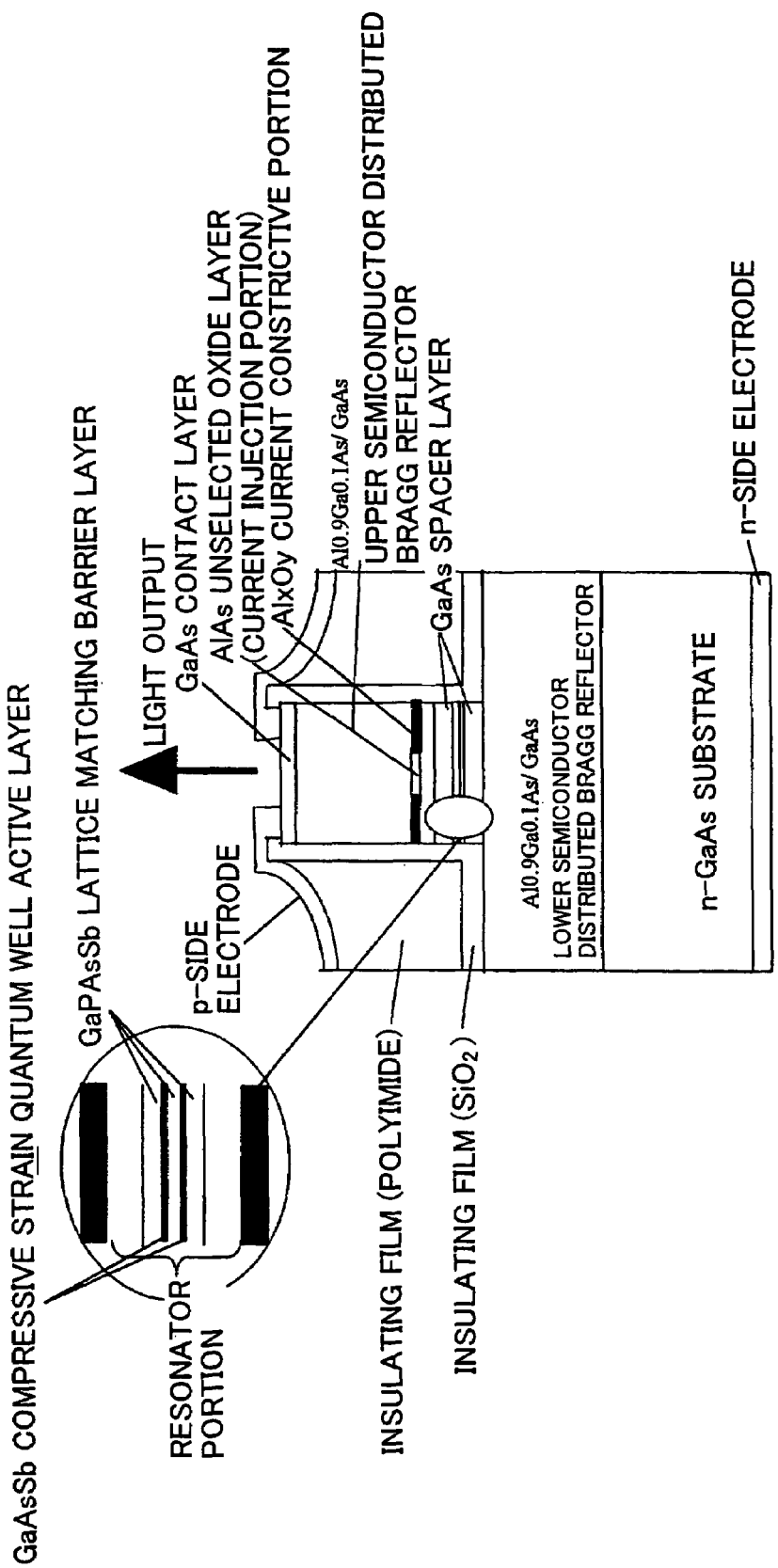
FIG. 48 is a drawing showing a GaAsSb surface emitting semiconductor laser of a 1.3-micrometer band according to a third example of the invention.

FIG. 48 is a drawing showing a GaAsSb surface emitting semiconductor laser of a 1.3-micrometer band according to the third example of the invention.

The third example differs from the second example in that GaAsSb (36% Sb composition) was used for a quantum well active layer, and GaPAsSb (39% P composition and 18% Sb composition) was used for a barrier layer. The number of wells was 2. Moreover, the barrier layer substantially has lattice matching with the GaAs substrate. In the third example, the discontinuity of a conduction band increased by 255 meV, and the discontinuity of a valence band decreased by 33 meV, compared with the case where a GaAs barrier layer is used. This provided satisfactory temperature characteristics and a lower threshold current. Although GaAsSb was used as a quantum well active layer in the third example, In, Al, and P may also be included in small quantity.

EXAMPLE 4

Figure 49:
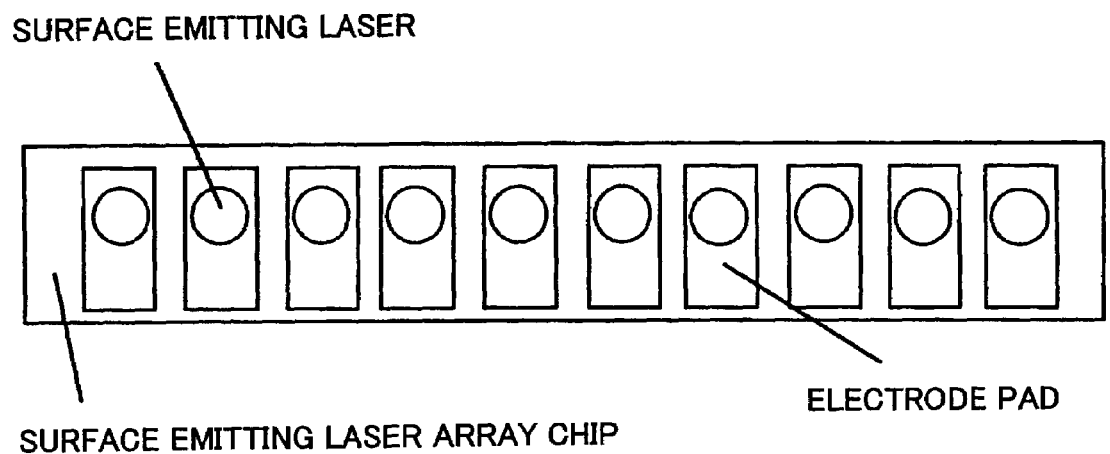
FIG. 49 is a top plan view of a surface emitting laser array according to a fourth example of the invention.

FIG. 49 is a top plan view of a surface emitting laser array according to a fourth example of the invention.

The surface emitting laser array of the fourth example includes 10 surface emitting laser devices of the second example arranged in a line. These laser devices may be provided in two dimensional arrangement. The surface emitting laser array of the fourth example has conductive types p and n that are reversed relative to the second example. In the surface emitting laser array of the fourth example, the n-side individual electrodes are formed on the top surface, and p-side common electrode is formed on the back surface of the substrate. This is because a plurality of devices can simultaneously transfer a larger amount of data by use of a bipolar transistor drive circuit that is operable at high speed as an anode common. This makes it possible to achieve the parallel transfer of a large amount of data.

EXAMPLE 5

Figure 50:
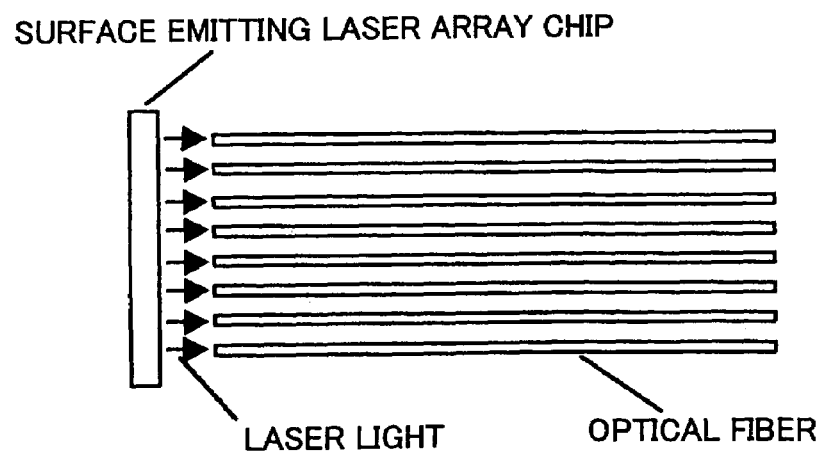
FIG. 50 is a drawing showing an optical transmission module according to a fifth example of the invention.

FIG. 50 is a drawing showing an optical transmission module according to a fifth example of the invention. The optical transmission module of the fifth example is comprised of the surface emitting laser array chip of the fourth example combined with silica fibers. In the fifth example, laser light emitted by the surface emitting laser array chip is input into the optical fibers for transmission. The optical fiber is a single mode fiber in this example. In order to transmit a large amount of data simultaneously, parallel transmission is achieved based on the use of the laser array that is comprised of a plurality of integrated semiconductor lasers. The fifth example attains high-speed parallel transmission by use of single-mode high-power surface emitting lasers, thereby providing for an increased amount of data transmission compared with a conventional art.

Furthermore, the use of the surface emitting semiconductor lasers of the invention in an optical communication system makes it possible to provide a reliable optical transmission module at low costs and also to provide a highly reliable optical communications system at low costs. The surface emitting semiconductor laser using GaInNAs has superior temperature characteristics and operates at a low threshold, thereby materializing a system that emits less heat and operates at high temperature without a cooling system.

In the fifth example, the surface emitting semiconductor lasers are provided in one-to-one correspondence with the optical fibers. Alternatively, a plurality of surface emitting semiconductor lasers having different oscillating wavelengths may be arranged in a one or two-dimensional array for wavelength-multiplexed transmission, thereby further increasing a transmission rate.

EXAMPLE 6

Figure 51:
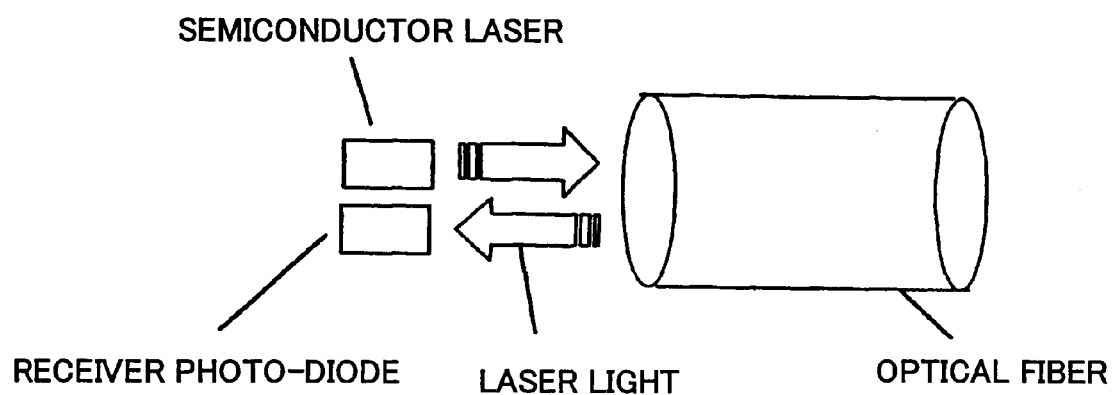
FIG. 51 is a drawing showing an optical transceiver module of a sixth example of the invention.

FIG. 51 is a drawing showing an optical transceiver module of a sixth example of the invention. The optical transceiver module of the sixth example is comprised of the surface emitting semiconductor laser of the second example, a photo-diode as a receiving end, and an optical fiber.

When the surface emitting semiconductor laser of the invention is used in an optical communication system, a highly-reliable optical communication system is provided at low costs by combining the surface emitting semiconductor laser (i.e., 1.3-micrometer-band GaInNAs surface emitting semiconductor laser), the photo-diode as a receiving end, and the optical fiber as shown in FIG. 51. Moreover, the surface emitting semiconductor laser using GaInNAs according to the invention is characterized by a satisfactory temperature characteristic, a low operating voltage, and a low threshold, thereby providing for a low cost system that emits less heat and is operable at high temperature without a cooling system.

When a fluoride-added POF (plastic fiber) incurring small loss at a long-wavelength band such as a 1.3-micrometer range is used in combination, a module can be provided at an extremely low cost. This is because the fiber is inexpensive, and also because the large fiber diameter provides for assembly costs to be reduced due to easy coupling.

The optical communication system based on the surface emitting semiconductor laser of the invention can not only be used for long-distance communication through optical fibers, but also be used for transfer between computers or the like through a LAN (local area network) or the like. It can also be used as an optical interconnection for short-distance communication between boards, between LSIs on a board, and between devices inside an LSI.

In recent years, the processing capacity of LSIs has been increasing. However, the rate of transmission between LSIs will be a bottleneck. When signal connections in a system are changed from electrical connections to optical interconnects (e.g., the optical transmission modules and the optical transceiver modules of the invention are used to connect between boards in a computer system, between LSIs on a board, and between devices inside an LSI), a super-fast computer system can be provided.

Moreover, a super-fast network system can be established by connecting a plurality of computer systems or the like through the optical transmission modules and the optical transceiver modules of the invention. Since surface emitting semiconductor lasers achieve low power consumption at different order of magnitude compared with an edge emitting laser, and are easy to be arranged in a two dimensional array, they are suitable for parallel-transmission-type optical communication systems.

As described above, the use of a GaInNAs-type material or a GaAsSb-type material as nitrogen-added semiconductor layers makes it possible to create a multi-layer Al(Ga)As/(Al)GaAs-type semiconductor distributed Bragg reflector that has been proven for use in a 0.85-micrometer surface emitting semiconductor laser using the GaAs substrate, and also makes it possible to create a current constrictive structure through selective oxidization of AlAs. Further, the invention can achieve a high-performance surface emitting semiconductor laser having a long wavelength band such as a 1.3-micrometer band that is fit for practical use. The use of such devices also achieves an optical communication system such as an optical fiber communication system and an optical interconnection system that is provided at low costs without a need for a cooling device.

Sixth Aspect

In the following, a sixth aspect of the invention will be described.

Efforts have been directed to the research and development of a mixed-crystal semiconductor. (nitrogen-type Group-V mixed-crystal semiconductor) that includes, in a Group-V element, nitrogen and additional Group-V elements, which is used as a semiconductor laser for optical communications conducted in the 1.3-micrometer band or the 1.55-micrometer band. Patent Document 1, for example, teaches a GaInNAs-type semiconductor laser which includes nitrogen and arsenic as Group-V elements. The use of such a nitrogen-type Group-V mixed-crystal semiconductor material for an active layer makes it possible to produce a long wavelength semiconductor laser of the 1.3-micrometer band or the 1.5-micrometer band on a GaAs substrate. However, nitrogen has a small atomic radius, and has a low miscibility with other Group-V elements. The larger the nitrogen content is, the more difficult it is to obtain proper crystalline quality. In order to achieve the emission of light in a long wavelength band exceeding 1.3 micrometers while decreasing the amount of nitrogen content, however, it is necessary to provide a high compressive strain exceeding 2%.

Patent Document 2 discloses a structure in which GaInNAsP is used for a barrier layer in a semiconductor light emitter having a GaInNAs light emitting layer (well layer). Here, the well layer has a compressive strain relative to a GaAs substrate, and the barrier layer has a tensile strain, thereby providing a strain-compensated structure. In Patent Document 2, the use of a strain-compensated multiple quantum well structure makes it possible to improve the characteristics of a semiconductor light emitter.

Moreover, Patent Document 3 discloses a semiconductor laser which has a GaInNAsSb well layer and a GaNAs barrier layer. The material of the barrier layer is changed from GaAs into GaNAs so as to improve the intensity of photoluminescence at a 1.3-micrometer wavelength. There is a mention of improvement in crystallinity as the inclusion of nitrogen in both the barrier layer and the well layer achieves conditions close to homo-epitaxial.

[Patent Document 1] Japanese Patent Application Publication No. 8-195522
[Patent Document 2] Japanese Patent Application Publication No. 10-126004
[Patent Document 3] Japanese Patent Application Publication No. 2002-118329

In semiconductor lasers using a conventional nitrogen-based Group-V mixed-crystal semiconductor for an active layer, characteristics are improved by adding nitrogen to the barrier layers of a quantum well structure. However, since the band end position of a valence band falls in response to the addition of nitrogen, the discontinuity of a valence band increases between the well layer and the barrier layer containing nitrogen. This gives rise to a problem in that holes are not evenly injected into each well layer of a multiple quantum well structure. When deviation exists in the density of electron or hole injection between the well layers, a gain drops at a well where the density of electron or hole injection is low. This results in a decrease of an effective gain of the entirety of the quantum well structure, which causes an increase in a threshold current.

Accordingly, there is a need for a semiconductor laser, a method of making the semiconductor laser, an optical transmission module, and an optical transmission system, in which a semiconductor laser having a multiple quantum well structure as an active layer can operate at a low threshold current through the homogeneous injection of electrons and holes.

In the following, embodiments of the invention will be described with reference to accompanying drawings.

(First Embodiment)

A semiconductor laser according to the first embodiment of the invention includes an active layer comprised of a multiple quantum well structure in which well layers and barrier layers are stacked one over the other. The barrier layers are formed of a mixed-crystal semiconductor containing nitrogen and other Group-V elements, and is doped with p-type impurity of $1 \times 10^{17}$–$1 \times 10^{19}$ cm$^{-3}$.

It is known that the mixed-crystal semiconductor containing nitrogen and other Group-V elements, i.e., a nitrogen-based Group-V mixed-crystal semiconductor, has an extremely large bowing parameter with respect to the relation between an energy band gap and a lattice constant. In an area where nitrogen composition is small, therefore, the smaller the lattice constant, the smaller the band gap energy becomes. Moreover, in the area where nitrogen composition is small, the position of energy of a conduction band end falls greatly. Reduction in the discontinuity of a conduction band of the barrier layers and the well layers lowers the quantum level of the conduction band even with the same well-layer thickness, thereby elongating the wavelength of light emission. This provides advantages when forming a semiconductor laser of a long-wavelength band.

Furthermore, the use of a nitrogen-based Group-V mixed-crystal semiconductor for the barrier layers of a multiple quantum well structure successfully reduces the discontinuity of a conduction band between the barrier layers and the well layers. The inventors of this application found that such a structure ensures that electrons are evenly injected into each well layer of the multiple quantum well structure.

However, when a nitrogen-based Group-V mixed-crystal semiconductor is used for the barrier layers, the discontinuity of a valence band between the barrier layers and the well layers increases. This gives rise to a problem in that hole injection into each well layer of the multiple quantum well structure becomes uneven.

In the invention, p-type impurity of $10 \times 10^{17}$–$1 \times 10^{19}$ cm$^{-3}$ is doped in the barrier layers containing nitrogen. By doping the p-type impurity in the barrier layers containing nitrogen, the Fermi level of the valence band of the barrier layers approaches the band end of the valence band. This results in a decrease in the height or width of a spike-like barrier, which is formed at a hetero interface between a barrier layer and a well layer. As a consequence, the efficiency of hole injection from a barrier layer to a well layer is improved, thereby facilitating the evenness of hole density as holes are injected into each well layer of the multiple quantum well structure. In this manner, it is possible to evenly inject both electrons and holes into each well layer of the multiple quantum well structure, equalizing gains among the well layers, and reducing a threshold current.

Furthermore, doping p-type impurity of $1 \times 10^{17}$–$1 \times 10^{19}$ cm$^{-3}$ in the barrier layers containing nitrogen also serves to reduce clearing carrier density that is required to generate gains in the well layers. Less carrier injection thus suffices to generate gains, thereby lowering a threshold current.

Moreover, an increase in the concentration of p-type doping of the barrier layers causes an increase in the differential gain of the quantum wells. This serves to increase a relaxed oscillating frequency that is the limit of direct modulation of a semiconductor laser, thereby providing for faster modulation.

P-type impurity doping concentration in the barrier layers is preferably higher than $1 \times 10^{17} cm^{-3}$. If doping concentration is lower than this, the advantages as described above are not obtained. Moreover, p-type impurity doping concentration is preferably lower than $1 \times 10^{19}$ $cm^{-3}$. If doping concentration is higher than this, the quality of a crystal deteriorates.

In particular, p-type impurity doping concentration is more preferably smaller than $2 \times 10^{18}$ $cm^{-4}$. If it exceeds $2 \times 10^{18} cm^{-3}$, free carrier absorption and inter-valence-band absorption increase, resulting in an increased internal absorption loss. In order to lower a threshold current, therefore, it is preferable to keep p-type impurity doping concentration in the barrier layers lower than $2 \times 10^{18} cm^{-3}$.

In addition to the barrier layers, p-type impurity may also be doped in the quantum well layers. However, when p-type impurity concentration in the quantum well layers is set higher than $1 \times 10^{18}$ $cm^{-3}$, the efficiency of light emission drops. In consideration of this, the p-type impurity concentration of well layers is desirably lower than the p-type impurity concentration of barrier layers. This is modulated doping.

(Second Embodiment)

A semiconductor laser of the second embodiment of the invention is characterized by differing from the semiconductor laser of the first embodiment in that p-type impurity is specifically carbon (C).

Carbon (C) is characteristically less likely to suffer segregation compared with Be which is another p-type impurity. Furthermore, the coefficient of diffusion is relatively small compared with that of Zn which is another p-type impurity. A steep doping profile can thus be obtained even if it heat treatment is applied during or after growth. Moreover, carbon (C) forms a shallow level, and thus serves as a dopant that achieves a high rate of activation. Carbon is easy to be doped at high concentration exceeding $1 \times 10^{18}$ $cm^{-3}$.

Therefore, a steeply modulated doping profile is successfully formed by use of carbon (C) as p-type impurity in the barrier layers containing nitrogen in the multiple quantum well structure.

(Third Embodiment)

A semiconductor laser of the third embodiment of the invention is characterized in that the doping concentration of p-type impurity in the barrier layers of the semiconductor laser of the first and second embodiments is lower in a region adjoining a well layer than in a region detached from the well layer.

In the barrier layers, doping concentration is lowered in a region adjoining a quantum well layer, so that non-light-emitting rejoining at the interface between the quantum well layers and the barrier layers is successfully reduced. As a result, an increase in a threshold current is suppressed, and reliability is improved.

In the region where p-type impurity concentration of the barrier layers is low, impurity concentration may be changed progressively in a step-like manner. Alternatively, p-type impurity concentration may be decreased gradually toward to an interface with a well layer, thereby providing incremental changes in the p-type impurity concentration.

(Fourth Embodiment)

A semiconductor laser of the fourth embodiment of the invention differs from the semiconductor laser of the first through third embodiments in that the well layers and the barrier layers have opposite strains.

Since nitrogen is an element with a small atomic radius, even a small amount of added nitrogen successfully reduces the lattice constant of a crystal. It is thus possible to form a barrier layer such as GaNAs having a tensile strain relative to a quantum well layer such as GaInAs, GaInNAs, etc., having a compressive strain. In this manner, a strain-compensated structure that compensates for the strain of well layers is provided, thereby reducing a net strain of the multiple quantum well structure and improving the reliability of a semiconductor laser.

Moreover, another group of material may alternatively be used to form a well layer having a tensile strain and a barrier layer having a compressive strain. For example, GaNAs or GaNAsP may be used for a well layer so as to provide a tensile strain. GaInNAs or GaNAsSb may be used for a barrier layer so as to provide a compressive strain. Namely, a strain-compensated structure can be formed by well layers having a tensile strain and barrier layers having a compressive strain, thereby improving reliability.

(Fifth Embodiment)

The fifth embodiment of the invention modifies the semiconductor laser of the first through fourth embodiments such that the well layers are formed of a mixed-crystal semiconductor containing nitrogen and other Group-V elements.

As a mixed-crystal semiconductor containing nitrogen and other Group-V elements, examples include GaNAs, GaInNAs, GaNAsSb, GaInNAsSb, GaNAsP, GaInNAsP, GaInNAsPSb, etc. The mixed-crystal semiconductor containing nitrogen and other Group-V elements (i.e., nitrogen-based Group-V mixed-crystal semiconductor) has such a characteristic that the addition of nitrogen causes the reduction of a band gap up to a certain point. This characteristic makes it possible to form an active layer on a GaAs substrate with a 1.3-to-1.6-micrometer long wavelength band, which is suitable for transmission using a quartz optical fiber.

A nitrogen-based Group-V mixed-crystal semiconductor is characterized in that the energy position of a conduction-band end falls in the region where nitrogen composition is small. If a nitrogen-based Group-V mixed-crystal semiconductor is used for a quantum well layer, the discontinuity of a conduction band with a GaAs barrier layer widens as much as to reach 200–400 meV. Because of this, in the semiconductor laser that uses a nitrogen-based Group-V mixed-crystal semiconductor for a quantum well layer, entrapping of electrons in the quantum well layer is strengthened, so that characteristic temperature may become as high as 150 k to 250 K. On the other hand, the entrapping of electrons in the quantum well layer may be too strong, so that electron injection becomes extremely uneven in the case of a multiple quantum well structure, compared with when a quantum well layer including no nitrogen is used.

In the present invention, the discontinuity of a conduction band between a barrier layer and a quantum well layer made of a nitrogen-based Group-V mixed-crystal semiconductor can be controlled and reduced by adding nitrogen to the barrier layer. This makes it possible to equalize electron injection into quantum well layers while maintaining satisfactory temperature characteristics, which is a feature attained when a nitrogen-based Group-V mixed-crystal semiconductor is used for a quantum well layer.

On the other hand, the use of a nitrogen-based Group-V mixed-crystal semiconductor for a barrier layer results in a drop of a valence band end position. This causes an increase in the discontinuity of a valence band between the barrier layer and the well layer. The effective mass of a valence-band hole is larger than the effective mass of a conduction-band electron, and the homogeneity of hole injection strongly depends on the height of a barrier. Thus, it becomes difficult to ensure homogeneous injection of holes into each well layer of a multiple quantum well structure. GaNAs has a valence band end position lower than that of GaAs. When a GaAs layer is provided to adjoin GaNAs on the opposite side to the well layer, a valence band hetero barrier is formed in a GaAs/GaNAs interface, which gives rise to a problem in that hole injection becomes less likely to occur.

In the present invention, p-type impurity of $1 \times 10^{17}$–$1 \times 10^{19}$ cm$^{-3}$ is doped in the barrier layers containing nitrogen. The height or width of a spike-like barrier of a valence band formed at the hetero interface between a barrier layer and a well layer is reduced, thereby improving the efficiency of hole injection into the quantum well layers made of a nitrogen-based Group-V mixed-crystal semiconductor. In this manner, even injection of holes into each quantum well layer is achieved.

In this manner, it is possible to evenly inject both electrons and holes into the multiple quantum well structure formed of a nitrogen-based Group-V mixed-crystal semiconductor, thereby equalizing gains among the well layers, and reducing a threshold current.

Furthermore, doping p-type impurity of $1 \times 10^{17}$–$1 \times 10^{19}$ cm$^{-3}$ in the barrier layers containing nitrogen also serves to reduce clearing carrier density that is required to generate gains in the well layers. Less carrier injection thus suffices to generate gains, thereby lowering a threshold current.

Moreover, an increase in the concentration of p-type doping of the barrier layers causes an increase in the differential gain of the quantum wells. This serves to increase a relaxed oscillating frequency that is the limit of direct modulation of a semiconductor laser, thereby providing for faster modulation.

In this manner, with the long-wavelength-band semiconductor laser using a nitrogen-based Group-V mixed-crystal semiconductor for an active layer, a threshold current is reduced, and high-speed modulation is attained.

As is shown with reference to the fourth embodiment, further, a strain-compensated structure is provided for the quantum well layers such as GaInAs, GaInNAs, and GaIn-NAsSb having a high compressive strain exceeding 2%, resulting in the increased reliability of devices.

(Sixth Embodiment)

A semiconductor laser of the sixth embodiment of the invention differs from the semiconductor laser of the first through fifth embodiments in that it is a surface emitting semiconductor laser, comprised of a pair of multi-layer film reflectors and a resonator structure sandwiched by the pair of multi-layer film reflectors, the resonator structure including the active layer as descried above.

Since a resonator length is short in the surface emitting semiconductor laser, the density of a threshold current can be reduced more effectively by structuring an active layer into a multiple quantum well structure. The feature of the invention that both electrons and holes are evenly injected in the multiple quantum well structure is thus particularly effective with respect to a surface emitting semiconductor laser.

Moreover, a low threshold current is an essential feature that is required in practical use of a surface emitting semiconductor laser. A demand for a transmission rate exceeding 10 Gbps has also been increasing in recent years. The present invention dopes p-type impurity of $1 \times 10^{17}$–$1 \times 10^{19}$ cm$^{-3}$ in the barrier layers, thereby reducing a threshold current compared to a conventional structure, and increasing modulation speed.

(Seventh Embodiment)

The seventh embodiment of the invention is directed to a method of manufacturing a semiconductor laser of the first through sixth embodiments, and is characterized by use of organic nitrogen material for doping carbon (C) in barrier layers.

Doping of carbon (C) may be carried out by auto copying carbon (D) included in trimethyl aluminum (TMA) (The Transaction of the Institute of Electronics, Information and Communication Engineers C-1, Vo. J81-C-1, No. 7, pp. 410–416, 1998). The use of TMA for the doping of carbon (C) in the barrier layer containing nitrogen, however, gives rise to a problem in that surface mophology deteriorates due to the bonding of active Al and nitrogen.

As another method of doping carbon (C), a method that uses a halide such as CC14 and CBr4 is also well-known. However, Cl and Br have a function to etch a compound semiconductor, so that there is a need to control a growth rate by the amount of doping.

In the invention, organic nitrogen material is used as a nitrogen raw material for the crystal growth of barrier layers, which makes it possible to dope carbon (C) in the barrier layers simultaneously. As an organic nitrogen material, dimethyl hydrazine (DMHy), monomethyl hydrazine (MMHy), etc., may be used. Carbon (C) is caught into the layers from the methyl group of the organic nitrogen material, thereby achieving auto doping.

The control of doping concentration is easily attained by changing a growth temperature and a supply ratio of the organic nitrogen material to other Group-V materials. In this manner, the doping of p-type impurity in the barrier layer inclusive of nitrogen can easily be achieved.

It should be noted that the doping of carbon (C) by use of an organic nitrogen raw material can also be employed for other layers as well as the barrier layers. For example, such doping can be used for quantum well layers, clad layers, semiconductor multi-layer film reflectors, contact layers, etc.

(Eighth Embodiment)

The eighth embodiment of the invention is directed to an optical transmission module characterized by using the semiconductor laser of the first through sixth embodiments.

The semiconductor laser of the first through sixth embodiments operates at a reduced threshold current, and is capable of high-speed modulation. The use of the semiconductor laser of any one of the first through sixth embodiments successfully reduces the power consumption of an optical transmission module, and successfully increases transmission speed of an optical transmission module.

(Ninth Embodiment)

The ninth embodiment of the invention is directed to an optical transmission system characterized by using the optical transmission module of the eighth embodiment.

In the optical transmission module of the eighth embodiment, a threshold current of the semiconductor laser serving as a light source is reduced, and modulation speed is increased. The use of the optical transmission module of the eighth embodiment thus provides for an optical transmission system with low power consumption and high transmission capacity.

In the following, examples of the invention will be described with accompanying drawings.

EXAMPLE 1

Figure 52:
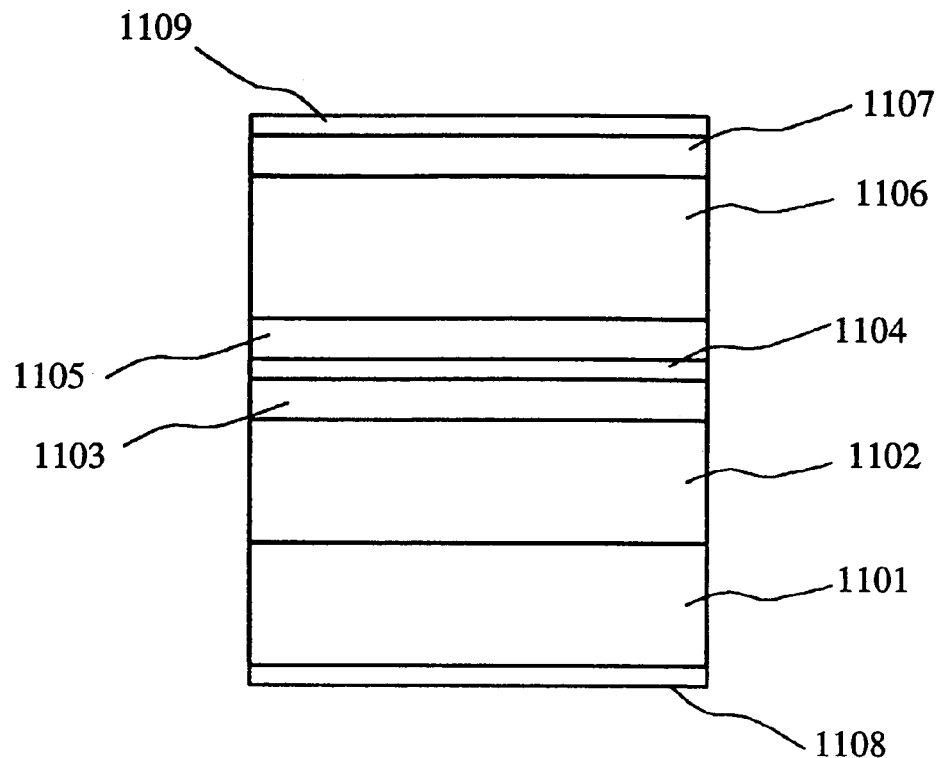
FIG. 52 is a drawing showing a semiconductor laser according to a first example of the invention.

FIG. 52 is a drawing showing a semiconductor laser according to a first example of the invention.

In FIG. 52, a semiconductor laser of the first example includes an n-type AlGaAs clad layer 1102, a GaAs lower optical waveguide layer 1103, a GaInAs/GaNAs multiple quantum well active layer 1104, a GaAs upper optical waveguide layer 1105, a p-type AlGaAs clad layer 1106, and a p-type GaAs contact layer 1107, which are stacked one over another on a n-type GaAs substrate 1101.

This stacked semiconductor structure on the n-type GaAs substrate 1101 is formed by epitaxial growth using the Metal-Organic Chemical Vapor Deposition method (MOCVD).

A p-side electrode 1109 is formed on the upper surface of the p-type GaAs contact layer 1107, and an n-side electrode 1108 is formed on the back surface of the n-type GaAs substrate 1101.

Figure 53:
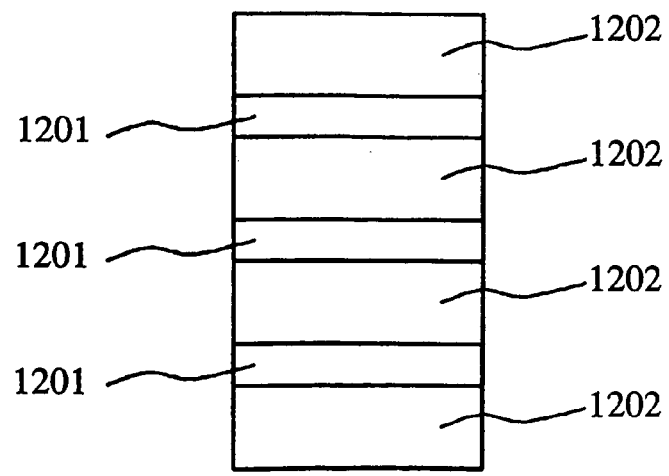
FIG. 53 is a drawing showing the structure of a multiple quantum well active layer of the semiconductor laser according to the first example.

Features of the semiconductor laser of the first example reside in the multiple quantum well structure that is used for the active layer 1104. FIG. 53 is a drawing showing the structure of the multiple quantum well active layer 1104 of the semiconductor laser according to the first example. With reference to FIG. 53, the multiple quantum well active layer 1104 is structured such that a GaInAs quantum well layer 1201 is sandwiched between GaNAs barrier layers 1202. Here, the layer thickness of the GaInAs quantum well layer 1201 is 6 nm, and the layer thickness of the GaNAs barrier layer 1202 is 10 nm.

It is known that GaNAs, i.e., a mixed crystal having GaAs and GaN, has an extremely large bowing parameter with respect to the relation between an energy band gap and a lattice constant. In an area where nitrogen composition is small, therefore, the smaller the lattice constant, the smaller the band gap energy becomes. Moreover, in the area where nitrogen composition is small, the position of energy of a conduction band end falls greatly. Reduction in the discontinuity of a conduction band of the GaNAs barrier layers 1202 and the GaInAs quantum well layers 1201 lowers the quantum level of the conduction band even with the same well-layer thickness, thereby elongating the wavelength of light emission. This provides advantages when forming a semiconductor laser of a long-wavelength band.

Furthermore, the use of a GaNAs mixed-crystal semiconductor for the barrier layers 1202 of the multiple quantum well structure 1104 successfully reduces the discontinuity of a conduction band between the GaNAs barrier layers 1202 and the GaInAs well layers 1201. This ensures that electrons are evenly injected into each GaInAs quantum well layer 1201 of the multiple quantum well structure 1104.

Since GaNAs has a valence band that has its band end position lower than that of GaAs, the discontinuity of a valence band increases between the GaNAs barrier layers 1202 and the GaInAs quantum well layers 1201. Moreover, a hetero barrier is formed between the GaAs upper optical waveguide layer 1105 and the GaNAs barrier layer 1202, thereby making it less likely for holes to be injected.

In the first example, p-type impurity is doped at a concentration of $1.5 \times 10^{18}$ cm$^{-3}$ in the GaNAs barrier layers 1202. By doping the p-type impurity in the GaNAs barrier layers 1202, the Fermi level of the valence band of the GaNAs barrier layers 1202 approaches the band end of the valence band. This results in a decrease in the height or width of a spike-like barrier, which is formed at a hetero interface between the GaNAs barrier layers 1202 and the GaInAs quantum well layers 1201. As a consequence, the efficiency of hole injection from the GaNAs barrier layers 1202 into the GaInAs quantum well layers 1201 is improved, thereby facilitating the evenness of hole density as holes are injected into each well layer of the multiple quantum well structure.

In the invention as described above, the GaNAs mixed-crystal semiconductor in which C is doped at the concentration of $1.5 \times 10^{18}$ cm$^{-3}$ is used for the barrier layers 1202 of the multiple quantum well structure 1104, thereby making it possible to evenly inject electrons and holes into each GaInAs. quantum well layer 1201. This suppresses unevenness of gains among the well layers, and improves a total gain for the multiple quantum well structure 1104 as a whole. Therefore, a threshold current can be reduced.

Moreover, since the lattice constant is larger in the GaInAs quantum well layers 1201 than in the GaAs substrate 1101, the GaInAs quantum well layers 1201 have a compressive strain. An increase of a compressive strain to 2.5% in the GaInAs quantum well layers 1201, light is emitted at the wavelength band of 1.2 micrometers. On the other hand, the GaNAs barrier layers 1202 have a smaller lattice constant than the GaAs substrate 1101, and have a tensile strain opposite the strain of the well layers. This forms a strain-compensated structure, which successfully reduces a net strain of the multiple quantum well structure. In this manner, the reliability of a semiconductor laser is improved.

Furthermore, doping p-type impurity at the concentration of $1.5 \times 10^{18}$ cm$^{-3}$ in the GaNAs barrier layers 1202 increases the hole density of a valence band, thereby reducing clearing carrier density that is required to generate gains in the well layers 1201. Less carrier injection thus suffices to generate gains, thereby lowering a threshold current.

Moreover, the doping of p-type impurity in the GaNAs barrier layers 1202 causes an increase in differential gains. This serves to increase a relaxed oscillating frequency that is the limit of direct modulation of a semiconductor laser, thereby providing for faster modulation.

The MOCVD method was employed for crystal growth of the GaNAs barrier layers 1202. As a Ga raw material, TMG (trimethyl gallium) was used. As an As raw material, AsH$_3$ (arsine) was used. As a raw material for nitrogen, DMHy (dimethyl hydrazine) that is an organic raw material was used.

With the use of an organic nitrogen material as a nitrogen raw material, Carbon (C) is caught into the layers from the methyl group of the organic nitrogen material, thereby achieving the simultaneous doping of carbon (C), i.e., p-type impurity, in the GaNAs barrier layers 1202. This invention is characterized in that DMHy is used as a doping raw material for carbon (C).

The control of carbon (C) doping concentration is easily made by changing growth temperature, a supply ratio of DMHy to AsH3, a V/III ratio, etc. In this manner, the doping of carbon (C) in the GaNAs barrier layers 1202 can easily be attained.

EXAMPLE 2

Figure 54:
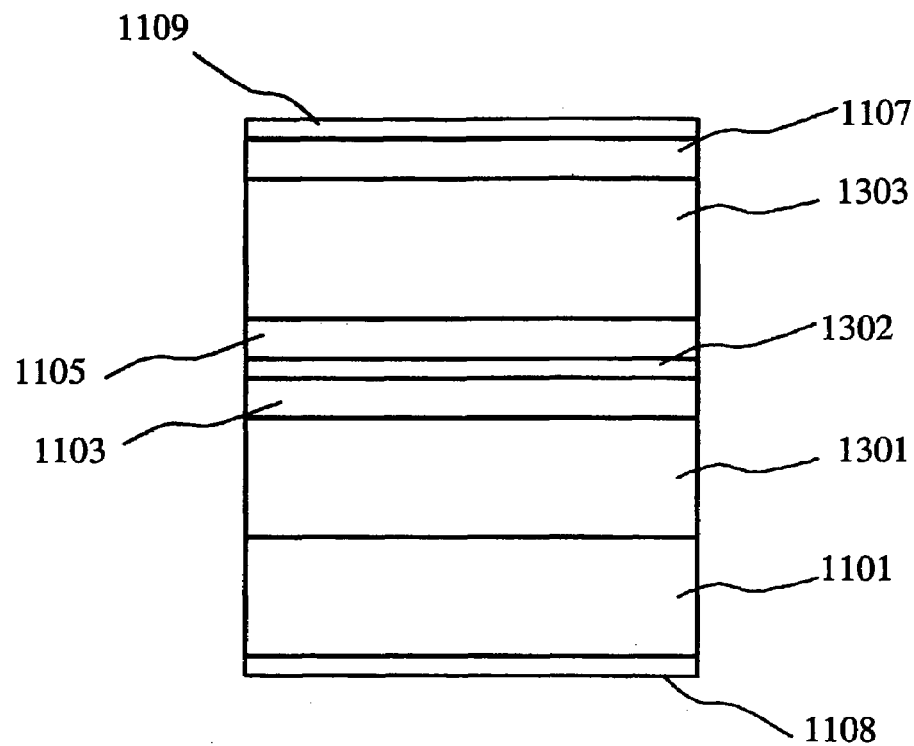
FIG. 54 is a drawing showing a semiconductor laser according to a second example of the invention.

FIG. 54 is a drawing showing a semiconductor laser according to a second example of the invention. In FIG. 54, the semiconductor laser of the first example includes an n-type GaInP clad layer 1301, a GaAs lower optical waveguide layer 1103, a GaInNAs/GaNAs multiple quantum well active layer 1302, a GaAs upper optical waveguide layer 1105, a p-type GaInP clad layer 1303, and a p-type GaAs contact layer 1107, which are stacked one over another on a n-type GaAs substrate 1101.

A p-side electrode 1109 is formed on the upper surface of the p-type GaAs contact layer 1107, and an n-side electrode 1108 is formed on the back surface of the n-type GaAs substrate 1101.

Figure 55:
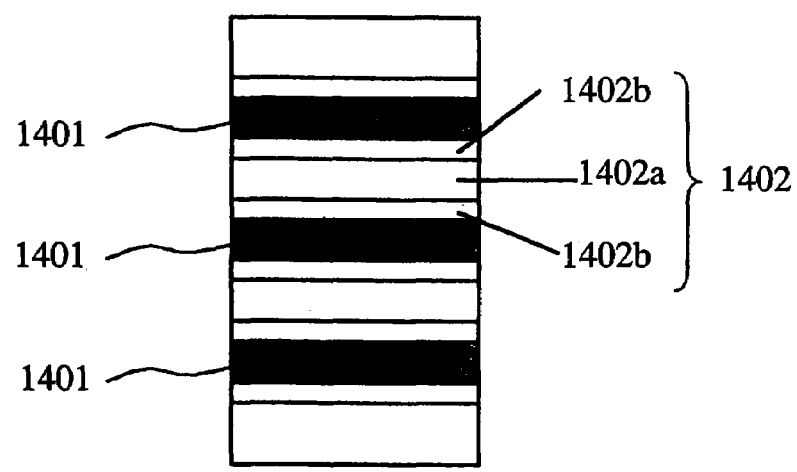
FIG. 55 is a drawing showing the structure of a multiple quantum well active layer of the semiconductor laser according to the second example.

FIG. 55 is a drawing showing the structure of the multiple quantum well active layer 1302 of the semiconductor laser according to the second example. With reference to FIG. 53, the multiple quantum well active layer 1302 is structured such that a GaInNAs quantum well layer 1401 is sandwiched between GaNAs barrier layers 1402. Here, the layer thickness of the GaInNAs quantum well layer 1401 is 8 nm, and the layer thickness of the GaNAs barrier layer 1402 is 15 nm.

In the GaNAs barrier layers 1402, a region 1402b which adjoins the GaInNAs quantum well layer 1401, has a lower carbon (C) doping concentration than a central region 1402a. To be specific, carbon (C) doping concentration is $1.5 \times 10^{18}$ cm$^{-3}$ in the central region 1402a, and is $5 \times 10^{17}$ cm$^{-3}$ in the region 1402b, which adjoins the GaInNAs quantum well layer 1401 having a width of 2 nm.

GaInNAs can be regarded as a mixed crystal comprised of GaInAs and GaInN. The band gap energy of GaInN is larger than that of GaInAs. In the region where nitrogen composition is small, the band gap energy of GaInNAs becomes smaller than that of GaInAs. With this characteristics, it is possible to form an active layer on a GaAs substrate such as to achieve a long wavelength band of 1.3–1.6 micrometers suitable for transmission through a quartz optical fiber.

However, nitrogen has a small atomic radius, and has a low miscibility with other Group-V elements. The larger the nitrogen content is, the more difficult it is to obtain proper crystalline quality. In order to achieve the emission of light in a long wavelength band exceeding 1.3 micrometers while maintaining proper crystalline quality in the GaInNAs mixed crystal, however, it is necessary to decrease added nitrogen and increase In composition. As a result, the compressive strain of the GaInNAs quantum well layers 1401 becomes as high as 2% or higher. However, an excessive strain increase causes dislocation that accompanies lattice mismatching, thereby degrading crystallinity.

In the second example, the use of the GaNAs barrier layers 1402 reduces the discontinuity of a conduction band between the barrier layers and the quantum well layers, and lowers the quantum level of the conduction band. Therefore, even with the use of the same well layer, the use of the GaNAs barrier layers achieves a longer wavelength of light emission than when GaAs barrier layers are used. In other words, the use of the GaNAs barrier layers provides for a larger reduction to be made for the amount of nitrogen or the strain of the GaInNAs quantum well layers 1401 for the same wavelength of light emission. Thereby, the crystal quality of the GaInNAs quantum well layers 1401 is improved.

Moreover, in the region where nitrogen composition is small, the energy position of the GaInNAs conduction band end drops about 150 meV per 1% nitrogen composition. Because of this, the use of GaInNAs for the quantum well layer causes the discontinuity of a conduction band to increase to more than 200 meV. An increase in the number of wells in the multiple quantum well structure thus gives rise to a problem in that electron injection becomes uneven.

In consideration of this, the invention uses GaNAs with added nitrogen for the barrier layers, thereby reducing the discontinuity of a conduction band with the GaInNAs quantum well layers 1401, and achieving even injection of electrons.

Since GaNAs has the position of a band end of a valence band lower than that of GaAs, the discontinuity of a valence band between the GaNAs barrier layers 1402 and the GaInNAs quantum well layers 1401 ends up increasing. Moreover, a hetero barrier is formed between the GaAs upper optical waveguide layer 1105 and the GaNAs barrier layers 1402, making hole injection less easy.

In the second example, thus, carbon (C) serving as p-type impurity is doped in the GaNAs barrier layers 1402. Doping the p-type impurity in the GaNAs barrier layers 1402 results in a decrease in the height or width of a spike-like barrier on the valence-band side, which is formed at a hetero interface between the GaNAs barrier layers 1402 and the GaInNAs quantum well layers 1401 and also formed at a hetero interface between the GaAs upper optical waveguide layer 1105 and the GaNAs barrier layer 1402. As a consequence, the efficiency of hole injection into the GaInNAs quantum well layers 1401 is improved, thereby facilitating the evenness of hole density as holes are injected into each well layer.

In the invention, as described above, electrons and holes are evenly injected into each GaInNAs quantum well layer 1401 of the multiple quantum well structure 1302, thereby controlling unevenness of gains among the well layers, and lowering a threshold current.

Moreover, the GaNAs barrier layers 1402 of the second example have a smaller lattice constant than the GaAs substrate 1101, and have a tensile strain opposite the strain of the well layers 1401. This forms a strain-compensated structure, which successfully reduces a net strain of the multiple quantum well structure. In this manner, the reliability of a semiconductor laser is improved.

Moreover, carbon (C) serving as p-type impurity is doped at the concentration of $1.5 \times 10^{18}$ cm$^{-3}$ in the GaNAs barrier layers 1402a. This makes it possible to obtain gains with less carrier injection, which results in the lowering of a threshold current. This also increases differential gains, thereby increasing a relaxed oscillating frequency that is the limit of direct modulation of a semiconductor laser, thereby providing for faster modulation.

Furthermore, doping concentration in the region 402b that adjoins a quantum well layer is as low as $5 \times 10^{17}$ cm$^{-3}$ in the GaNAs barrier layer 1402 of the second example. This reduces non-emitting re-bonding components that may be created at an interface between the GaInNAs quantum well layers 1401 and the barrier layers 1402. A threshold current can thus be further lowered, which improves reliability.

As a raw material for doping carbon (C) in the GaNAs barrier layers 1402, DMHy, which is organic nitrogen material, is used. Nitrogen composition in GaNAs is smaller in the layer 1402b with low carbon (C) concentration than in the layer 1402a with high carbon (C) concentration.

EXAMPLE 3

Figure 56:
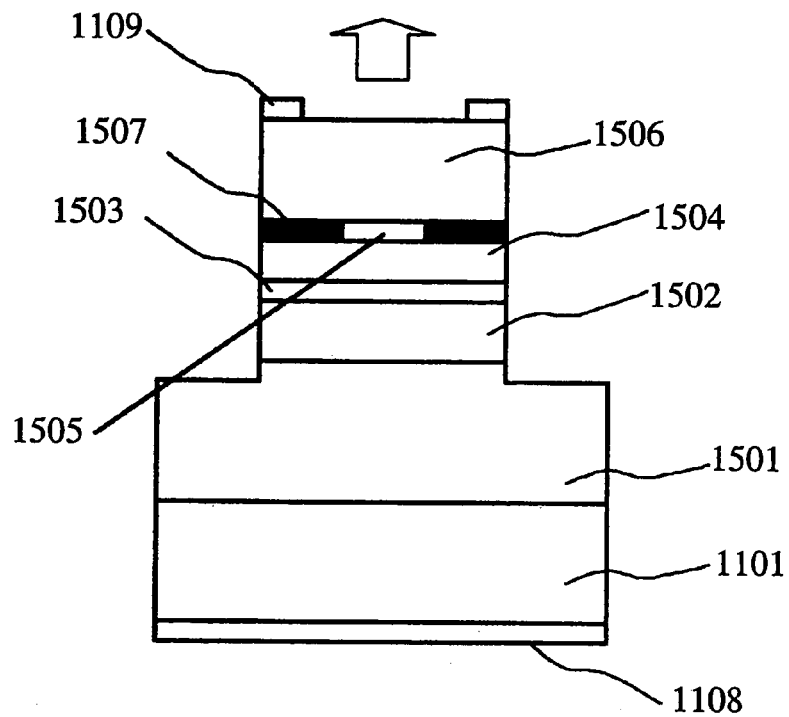
FIG. 56 is a drawing showing a surface emitting semiconductor laser of a third example of the invention.

FIG. 56 is a drawing showing a surface emitting semiconductor laser of a third example of the invention. In FIG. 56, the surface emitting semiconductor laser of the third example is structured such that an n-type GaAs/AlGaAs distributed Bragg reflector (DBR) 1501 is stacked on the n-type GaAs substrate 1101. The n-type GaAs/AlGaAs DBR 1501 is formed by stacking n-type GaAs high-refractive-index layers and n-type Al$_{0.9}$Ga$_{0.1}$As low-refractive-index layers one over the other with a layer thickness equal to ¼ of the medium-dependent wavelength. On top of the n-type GaAs/AlGaAs DBR 1501, a GaAs lower spacer layer 1502, a GaInNAs/GaNAs multiple quantum well active layer 1503, a GaAs upper spacer layer 1504, a p-type AlAs layer 1505, and a p-type GaAs/AlGaAs DBR 1506 are stacked one over another.

The stacked layer structure described above is etched from its upper surface to a depth of the n-type GaAs/AlGaAs DBR 1501 so as to leave a cylindrical shape, thereby forming a mesa structure. The AlAs layer 1505 is then selectively oxidized from the side surface of the mesa structure, forming an AlOx insulation region 1507.

On the upper surface of the mesa structure, a p-side ring-shape electrode 1109 is formed by leaving an area for light emission. Moreover, an n-side electrode 1108 is formed on the back surface of the n-type GaAs substrate 101.

In the surface emitting semiconductor laser of FIG. 56, a forward direction bias is applied to the p-side electrode 1109 and the n-side electrode 1108, which provides an electric current into the GaInNAs/GaNAs multiple quantum well active layer 1503, resulting in light emission at a 1.3-micrometer wavelength band. When this happens, the current flows through the AlAs layer 1505 formed on the GaInNAs/GaNAs multiple quantum well active layer 1503 by taking a path along the conductive region that is not oxidized. This causes the current to concentrate on an area smaller than the size of the mesa, thereby lowering a threshold current. Moreover, the insulating region 1507 that is selectively oxidized has a much lower refractive index than the AlAs layer 1505 that is not oxidized, and thus serves as a lens for collecting light, with an effect of reducing diffraction losses.

In the surface emitting semiconductor laser of FIG. 56, a region sandwiched by the n-type GaAs/AlAs DBR 1501 and the p-type GaAs/AlGaAs DBR 1506 has a resonator structure, and laser light is emitted in an upward direction perpendicular to the substrate.

Figure 57:
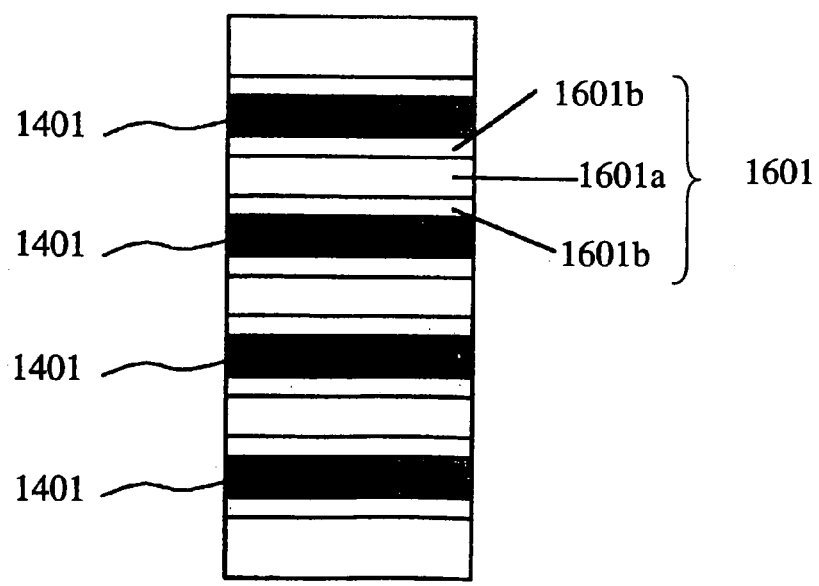
FIG. 57 is a drawing showing the structure of a multiple quantum well active layer of the surface emitting semiconductor laser according to the third example.

FIG. 57 is a drawing showing the structure of the multiple quantum well active layer 1503 of the surface emitting semiconductor laser according to the third example. With reference to FIG. 57, the multiple quantum well active layer 1503 is structured such that a GaInNAs quantum well layer 1401 is sandwiched between GaNAs barrier layers 1601. Here, the number of wells is four. The layer thickness of the GaInNAs quantum well layer 1401 is 6 nm, and the layer thickness of the GaNAs barrier layer 1601 is 15 nm.

The structure shown in FIG. 57 differs from the structure shown in FIG. 55 in the following points. Namely, a region 1601*b* that adjoins the GaInNAs quantum well layer 1401 has a reduced concentration of carbon (C) doping, compared with a central region 1601*a* in the GaNAs barrier layer 1601. To be specific, doping concentration continuously decreases towards the interface with the GaInNAs quantum well layer 1401. That is, carbon (C) doping concentration is fixed at $1.5 \times 10^{18}$ cm$^{-3}$ in the central region 1601*a*, and exhibits continuous inclined decreases from $1.5 \times 10^{18}$ cm$^{-3}$ to $5 \times 10^{17}$ cm$^{-3}$ in the region 1601*b*.

Since a resonator length is shorter in the surface emitting semiconductor laser than in the edge emitting semiconductor laser, the density of a threshold current can be reduced more effectively by structuring an active layer into a multiple quantum well structure rather than into a single quantum well structure. The number of wells in the multiple quantum well structure is preferably three or more. In this third example, the number of wells of the GaInNAs quantum well layers 1401 is four. In the GaInNAs quantum well layers 1401, the end position of a conduction band is low. As the number of wells increases, thus, it becomes increasingly difficult to inject electrons evenly into each GaInNAs quantum well layer 1401 of the multiple quantum well structure 1503.

In the third example, the use of a GaNAs mixed-crystal semiconductor for the barrier layers 1601 successfully reduces the discontinuity of a conduction band between the GaNAs barrier layers 1601 and the GaInNAs well layers 1401. This ensures that electrons are evenly injected into each GaInNAs quantum well layer 1401.

Since GaNAs has a valence band that has its band end position lower than that of GaAs, the discontinuity of a valence band increases between the GaNAs barrier layers 1601 and the GaInNAs quantum well layers 1401. Moreover, a hetero barrier is formed between the GaAs upper optical waveguide layer 1504 and the GaNAs barrier layer 1601, thereby making it less likely for holes to be injected.

In the third example, thus, carbon (C) serving as p-type impurity is doped in the GaNAs barrier layers 1601. Such doping results in a decrease in the height or width of a spike-like barrier on the valence-band side, which is formed at a hetero interface between the GaNAs barrier layers 1601 and the GaInNAs quantum well layers 1401 and also formed at a hetero interface between the GaAs upper spacer layer 1504 and the GaNAs barrier layer 1601. As a consequence, the efficiency of hole injection into the GaInNAs quantum well layers 1401 is improved, thereby facilitating the evenness of hole density as holes are injected into each well layer.

According to the invention as described above, the GaNAs mixed-crystal semiconductor in which C is doped is used for the barrier layers 1601 of the multiple quantum well structure 1503, thereby making it possible to evenly inject electrons and holes into each GaInNAs quantum well layer 1401. This suppresses unevenness of gains among the well layers, and improves a total gain for the multiple quantum well structure 1504 as a whole. Therefore, a threshold current can be reduced.

The GaInNAs quantum well layer 1401 has a 2% compressive strain. The thickness of each GaInNAs quantum well layer 1401 is 6 nm, which is less than a critical film thickness. If layers having such a high strain are stacked in a multi-layered structure, however, dislocation is easy to occur, thereby making it difficult to ensure device reliability.

In the third example, the GaNAs barrier layers 1601 have a smaller lattice constant than the GaAs substrate 1101, and have a tensile strain opposite the strain of the well layers 1401. This forms a strain-compensated structure, which successfully reduces a net strain of the multiple quantum well structure. In this manner, the reliability of a semiconductor laser is improved.

Moreover, carbon (C) serving as p-type impurity is doped at high concentration in the GaNAs barrier layers 1601. This makes it possible to obtain gains with less carrier injection, which results in the lowering of a threshold current. This also increases differential gains, thereby increasing a relaxed oscillating frequency that is the limit of direct modulation of a semiconductor laser, thereby providing for faster modulation.

Furthermore, in the region 1601*b* that adjoins the quantum well layer 1401 in the GaNAs barrier layers 1601, carbon (C) doping concentration becomes lower towards the interface to reach $5 \times 10^{17}$ cm$^{-3}$. Provision is thus made to reduce non-emitting re-bonding components that are created at the interface between the GaInNAs quantum well layer 1401 and the barrier layer 1601.

Although GaNAs is used as a barrier layer material in the above example, other materials may as well be used. As a barrier layer material, a mixed crystal suffices as long as it contains at least one of B, Ga, In, and Al as a Group-III element, and also contains nitrogen and at least one of As, P, and Sb as Group-V elements.

As a well layer material, a material that does not include nitrogen such as GaInAs, GaAsSb, GaInAsSb, and InAs, and a nitrogen-based Group-V mixed-crystal semiconductor material such as GaNAs, GaInNAs, GaNAsSb, GaInNAsSb, GaNAsP, GaInNAsP, and GaInNAsPSb may be used.

It should be noted that the energy band gap of a barrier layer needs to be larger than the band gap of a well layer and to have a type-I band-connection form.

Moreover, some features of the invention reside in the composition of the multiple quantum well structure. This multiple quantum well structure is applicable to various types of semiconductor lasers. Moreover, other materials, other conductive types, other current constrictive structures, etc., which have not been described as examples, may as well be used.

Moreover, application may include 1-dimensional or 2-dimensional array light sources. Moreover, the features of the invention described above are of such a nature as to be applicable to an optical receiver, an optical modulator, an optical amplifier, etc.

EXAMPLE 4

Figure 58:
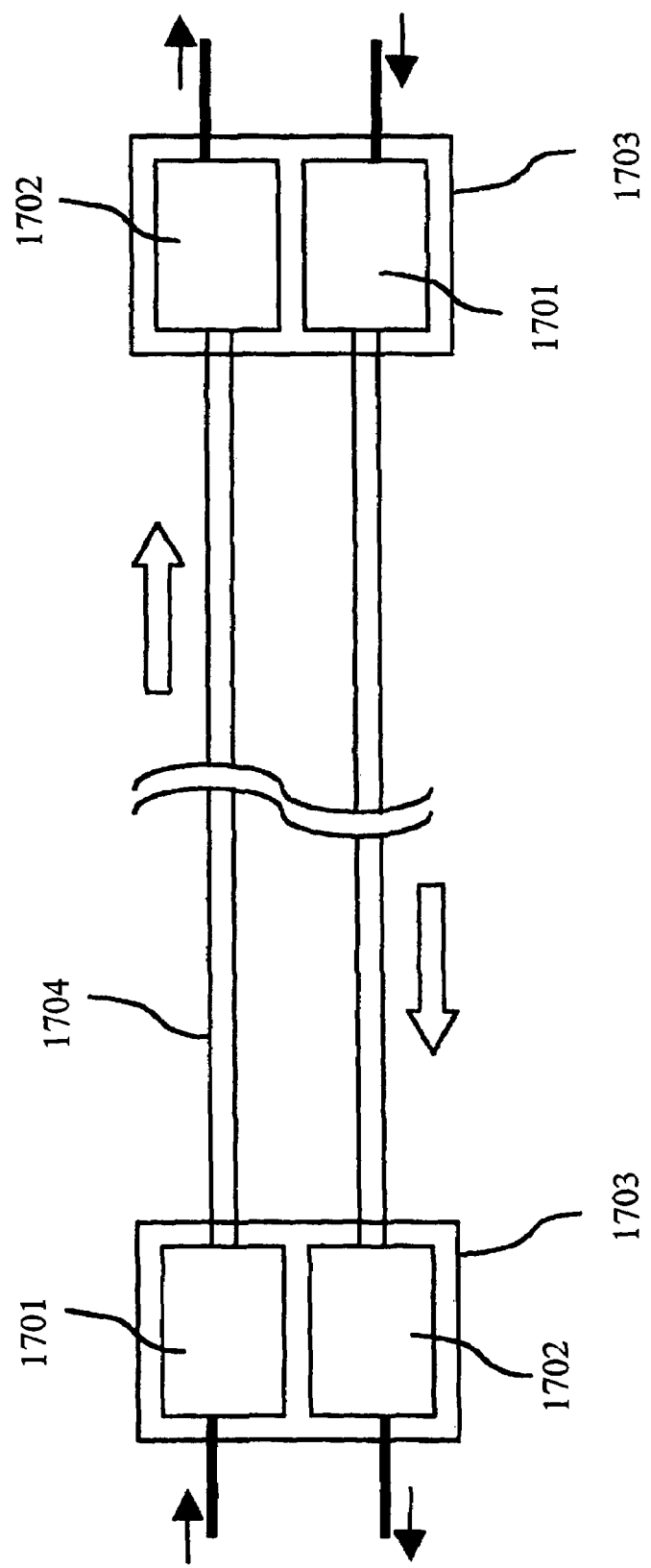
FIG. 58 is an illustrative drawing showing an optical transmission system according to a forth example of the invention.

FIG. 58 is an illustrative drawing showing an optical transmission system according to a forth example of the invention. In the optical transmission system of FIG. 58, an optical signal generated by an optical transmitting module 1701 is transmitted to an optical receiving module 1702 through a quartz optical fiber 1704. In FIG. 58, two sets of the optical transmitting module 1701, the optical fiber 1704, and the optical receiving module 1702 are provided for the purpose of achieving two-way communication. The optical transmitting module 1701 and the optical receiving module 1702 are integrated in a single package, which constitutes an optical transceiver module 1703.

In the fourth example, the semiconductor laser of any one of the first through third examples is used as a light source of the optical transmitting module 1701. As previously described in connection with the first through third examples, such semiconductor laser is constructed such that a threshold current is reduced compared with that of a conventional structure. The power consumption of the optical transmitting module 1701 is thus successfully lowered, providing an optical transmission system with low power consumption.

Moreover, provision is made to increase a relaxed oscillating frequency that is the limit of direct modulation of a semiconductor laser, thereby providing for faster modulation. This makes it possible to increase the transmission capacity of the optical transmission system.

Further, the present invention is not limited to these embodiments, but various variations and modifications may be made without departing from the scope of the present invention.

The present application is based on Japanese applications No. 2002-337586 filed on Nov. 21, 2002, No. 2003-291986 filed on Aug. 12, 2003, No. 2003-045447 filed on Feb. 24, 2003, No. 2003-337927 filed on Sep. 29, 2003, No. 2003-088168 filed on Mar. 27, 2003, and No. 2003-352476 filed on Dec. 4, 2003, with the Japanese Patent Office, the entire contents of which are hereby incorporated by reference.

What is claimed is:

1. A semiconductor light emitter, comprising:
   a quantum well active layer which includes nitrogen and at least one other Group-V element; an
   barrier layers which are provided alongside said quantum well active layer, wherein said quantum well active layer and said barrier layers together constitute one active layer;
   upper and lower reflectors which are respectively provided on upper and lower sides of said one active layer, wherein said one active layer and said upper and lower relectors together constitute a resonator structure;
   a GaAs substrate on which said resonator structure is formed; and
   spacer layers which are provided between said upper and lower reflectors and said one active layer,
   wherein said barrier layers are formed of a Group-III-V mixed-crystal semiconductor that includes nitrogen and at least one other Group-V element, and said spacer layers are mainly formed of a material having a larger band gap than GaAs.

2. The semiconductor light emitter as claimed in claim 1, wherein said material having a larger band gap than GaAs is one of GaInPAs and AlGaAs.

* * * * *